（12）United States Patent
Zhu

(10) Patent No.: US 11,127,758 B2
(45) Date of Patent: Sep. 21, 2021

(54) THREE-DIMENSIONAL MEMORY DEVICES AND METHODS FOR FORMING THE SAME

(71) Applicant: YANGTZE MEMORY TECHNOLOGIES CO., LTD., Wuhan (CN)

(72) Inventor: Hongbin Zhu, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 0 days.

(21) Appl. No.: 16/727,880

(22) Filed: Dec. 26, 2019

(65) Prior Publication Data

US 2021/0098488 A1 Apr. 1, 2021

Related U.S. Application Data

(63) Continuation of application No. PCT/CN2019/108893, filed on Sep. 29, 2019.

(51) Int. Cl.
*H01L 27/115* (2017.01)
*H01L 27/11582* (2017.01)
(Continued)

(52) U.S. Cl.
CPC .... *H01L 27/11582* (2013.01); *H01L 27/1157* (2013.01); *H01L 27/11565* (2013.01)

(58) Field of Classification Search
CPC .............................................. H01L 27/11582
See application file for complete search history.

(56) References Cited

U.S. PATENT DOCUMENTS 8,482,052 B2 7/2013 Lue et al.
9,806,085 B1 10/2017 Wang
(Continued)

FOREIGN PATENT DOCUMENTS

CN 101228619 A 7/2008
CN 101246891 A 8/2008
(Continued)

OTHER PUBLICATIONS

International Search Report issued in corresponding International Application No. PCT/CN2019/108893, dated Jun. 22, 2020, 4 pages.
(Continued)

*Primary Examiner* — William Coleman
(74) *Attorney, Agent, or Firm* — Bayes PLLC

(57) ABSTRACT

Embodiments of three-dimensional (3D) memory devices and methods for forming the same are disclosed. In an example, a 3D memory device includes a substrate and a plurality of memory decks stacked above the substrate. Each of the memory decks includes a gate electrode, a blocking layer on the gate electrode, a plurality of charge trapping layers on the blocking layer, a tunneling layer on the plurality of charge trapping layers, a channel layer on the tunneling layer, and an inter-deck dielectric layer on the channel layer. The plurality of charge trapping layers are discrete and disposed at different levels. A top surface of the inter-deck dielectric layer is nominally flat. The gate electrode of another one of the memory decks immediately above the memory deck is disposed on the top surface of the inter-deck dielectric layer.

20 Claims, 29 Drawing Sheets

(51) Int. Cl.
*H01L 27/11565* (2017.01)
*H01L 27/1157* (2017.01)

(56) References Cited

U.S. PATENT DOCUMENTS

| | | |
|---|---|---|
| 10,825,831 B1 | 11/2020 | Koval |
| 2004/0124466 A1 | 7/2004 | Wallker et al. |
| 2006/0060913 A1 | 3/2006 | Ozawa |
| 2013/0341701 A1 | 12/2013 | Blomme et al. |
| 2014/0346583 A1 | 11/2014 | Purayath |
| 2015/0008501 A1 | 1/2015 | Sakuma et al. |
| 2015/0311214 A1 | 10/2015 | Yoo et al. |
| 2015/0311300 A1 | 10/2015 | Chen et al. |
| 2017/0133400 A1 | 5/2017 | Yoo et al. |
| 2017/0236836 A1 | 8/2017 | Huo et al. |
| 2019/0287995 A1 | 9/2019 | Oike et al. |
| 2020/0388628 A1* | 12/2020 | Li .................... H01L 27/11582 |
| 2021/0098488 A1 | 4/2021 | Zhu |
| 2021/0098587 A1 | 4/2021 | Zhu |

FOREIGN PATENT DOCUMENTS

| | | |
|---|---|---|
| CN | 104810373 A | 7/2015 |
| CN | 105576016 A | 5/2016 |
| CN | 105870324 A | 8/2016 |
| CN | 107482014 A | 12/2017 |
| CN | 109003981 A | 12/2018 |
| CN | 110277394 A | 9/2019 |
| JP | 2003100914 A | 4/2003 |
| KR | 20080034714 A | 4/2008 |
| TW | 200834892 A | 8/2008 |
| TW | 201304076 A | 1/2013 |
| TW | 201417103 A | 5/2014 |
| TW | 201633510 A | 9/2016 |
| TW | 201639206 A | 11/2016 |
| TW | 201712912 A | 4/2017 |
| TW | 201742234 A | 12/2017 |
| TW | 201838154 A | 10/2018 |
| TW | 201901932 A | 1/2019 |
| WO | 2005/062378 A1 | 7/2005 |

OTHER PUBLICATIONS

Written Opinion of the International Searching Authority issued in corresponding International Application No. PCT/CN2019/070143, dated Oct. 10, 2019, 5 pages.

International Search Report issued in corresponding International Application No. PCT/CN2019/108891, dated Jun. 24, 2020, 5 pages.

Written Opinion of the International Searching Authority issued in corresponding International Application No. PCT/CN2019/108891, dated Jun. 24, 2020, 5 pages.

* cited by examiner

THREE-DIMENSIONAL MEMORY DEVICES AND METHODS FOR FORMING THE SAME

CROSS-REFERENCE TO RELATED APPLICATIONS

This application is continuation of International Application No. PCT/CN2019/108893, filed on Sep. 29, 2019, entitled "THREE-DIMENSIONAL MEMORY DEVICES AND METHODS FOR FORMING THE SAME," which is hereby incorporated by reference in its entirety. This application is also related to U.S. application Ser. No. 16/727,872, filed on Dec. 26, 2019, entitled "THREE-DIMENSIONAL MEMORY DEVICES AND METHODS FOR FORMING THE SAME," and U.S. application Ser. No. 16/727,874, filed on Dec. 26, 2019, entitled "THREE-DIMENSIONAL MEMORY DEVICES AND METHODS FOR FORMING THE SAME," all of which are hereby incorporated by reference in their entireties.

BACKGROUND

Embodiments of the present disclosure relate to three-dimensional (3D) memory devices and fabrication methods thereof.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A 3D memory architecture can address the density limitation in planar memory cells. The 3D memory architecture includes a memory array and peripheral devices for controlling signals to and from the memory array.

SUMMARY

Embodiments of 3D memory devices and fabrication methods thereof are disclosed herein.

In one example, a 3D memory device includes a substrate and a plurality of memory decks stacked above the substrate. Each of the memory decks includes a gate electrode, a blocking layer on the gate electrode, a plurality of charge trapping layers on the blocking layer, a tunneling layer on the plurality of charge trapping layers, a channel layer on the tunneling layer, and an inter-deck dielectric layer on the channel layer. The plurality of charge trapping layers are discrete and disposed at different levels. A top surface of the inter-deck dielectric layer is nominally flat. The gate electrode of another one of the memory decks immediately above the memory deck is disposed on the top surface of the inter-deck dielectric layer.

In another example, a 3D memory device includes a substrate and a plurality of memory decks stacked above the substrate. Each of the memory decks includes a gate electrode, a blocking layer on the gate electrode, a plurality of charge trapping layers on the blocking layer, a tunneling layer on the plurality of charge trapping layers, a channel layer on the tunneling layer, and an inter-deck dielectric layer on the channel layer. The plurality of charge trapping layers are discrete and disposed at different levels. A top surface of the inter-deck dielectric layer fits a top surface of the gate electrode. The gate electrode of another one of the memory decks immediately above the memory deck is disposed on the top surface of the inter-deck dielectric layer.

In still another example, a method for forming a 3D memory device is disclosed. A first gate electrode having an inverted "T" shape is formed above a substrate. A continuous first blocking layer is formed on the first gate electrode. A plurality of discrete first charge trapping layers disposed at different levels are formed on the first blocking layer. A continuous first tunneling layer is formed on the plurality of first charge trapping layers. A continuous first channel layer is formed on the first tunneling layer. An inter-deck dielectric layer is formed on the first channel layer. A top surface of the inter-deck dielectric layer is nominally flat. A second gate electrode having an inverted "T" shape is formed on the inter-deck dielectric layer. A continuous second blocking layer is formed on the second gate electrode. A plurality of discrete second charge trapping layers disposed at different levels are formed on the second blocking layer. A continuous second tunneling layer is formed on the discrete second charge trapping layers. A second channel layer is formed on the second tunneling layer.

In yet another example, a method for forming a 3D memory device is disclosed. A first gate electrode having an inverted "T" shape is formed above a substrate. A continuous first blocking layer is formed on the first gate electrode. A plurality of discrete first charge trapping layers disposed at different levels are formed on the first blocking layer. A continuous first tunneling layer is formed on the plurality of first charge trapping layers. A continuous first channel layer is formed on the first tunneling layer. An inter-deck dielectric layer is formed on the first channel layer. A top surface of the inter-deck dielectric layer fits a top surface of the first gate electrode. A second gate electrode is formed on the inter-deck dielectric layer. A top surface of the second gate electrode fits the top surface of the inter-deck dielectric layer. A continuous second blocking layer is formed on the second gate electrode. A plurality of discrete second charge trapping layers disposed at different levels are formed on the second blocking layer. A continuous second tunneling layer is formed on the discrete second charge trapping layers. A second channel layer is formed on the second tunneling layer.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1:
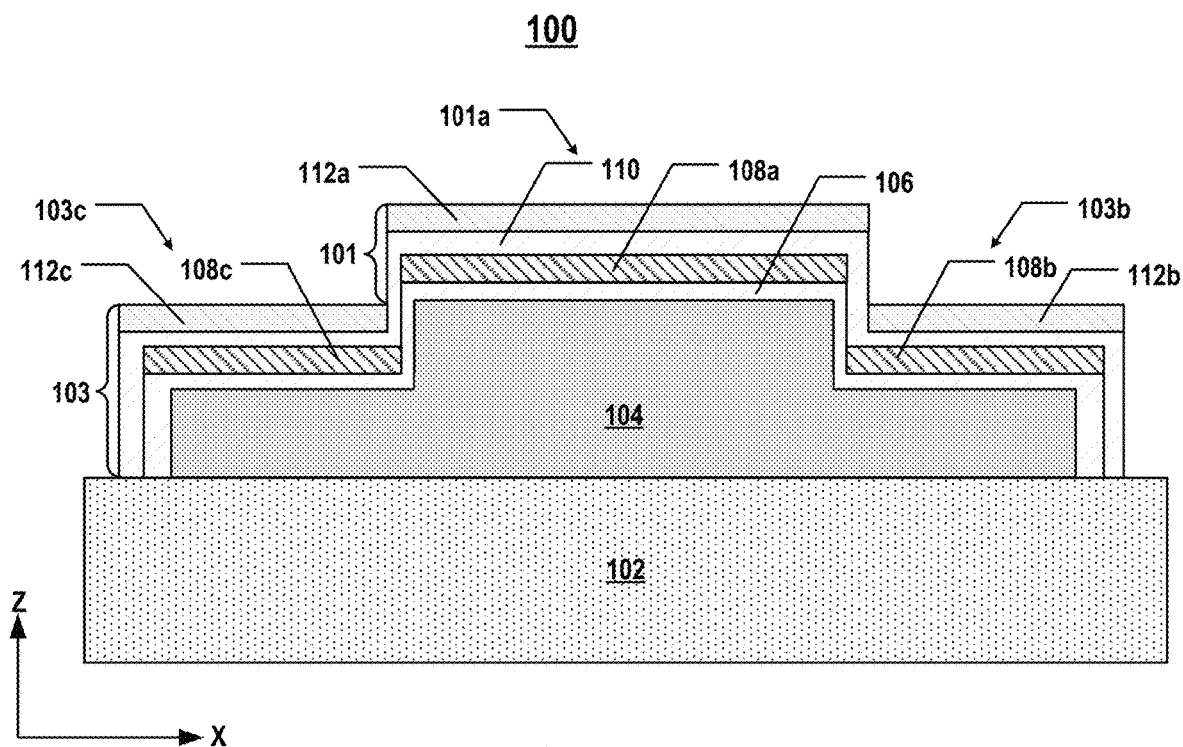
FIG. 1 illustrates a cross-section of an exemplary 3D memory device having a single memory deck, according to some embodiments of the present disclosure.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend laterally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which interconnect lines and/or via contacts are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with memory cells that can be arranged vertically on a laterally-oriented substrate so that the number of memory cells can be scaled up in the vertical direction with respect to the substrate. As used herein, the term "vertical/vertically" means nominally perpendicular to the lateral surface of a substrate.

In some 3D NAND flash memory devices, because the charge trapping layer (e.g., a silicon nitride layer) is a continuous layer shared by multiple memory cells in the same memory string, the performance of the device may be degraded due to coupling effect and charge spreading/loss effect, which limits the vertical scale-up of the 3D NAND flash memory devices by reducing the thickness of the gate-to-gate dielectric layers. To mitigate the issue caused by the continuous charge trapping layer, the continuous charge trapping layer is cut off to become separate charge trapping layers in each memory cell in some 3D NAND flash memory devices. However, this structure increases the fabrication complexity with due to smaller critical dimensions, thereby reducing the production yield.

Various embodiments in accordance with the present disclosure provide 3D memory devices with discrete charge trapping layers at different levels and fabrication methods thereof to mitigate the charge spreading effect without increasing fabrication complexity. A gate electrode having an inverted "T" shape or a double-sided staircase shape can be first formed above a substrate, followed by the formation of a memory film having multiple dielectric layers, including a blocking layer, a charge trapping layer, and a tunneling layer, on the gate electrode. By utilizing the ununiform thickness distribution of the charge trapping layer above the top surface of the inverted "T" or double-sided staircase-shaped gate electrode, multiple discrete charge trapping layers at different levels can be formed to mitigate the spreading effect without increasing fabrication complexity. Similarly, multiple discrete channel layers corresponding to the discrete charge trapping layers or a continuous channel layer can be formed on the memory film to form one or more memory cells in a memory deck. The 3D memory devices can be further vertically scaled-up by stacking multiple memory decks.

Figure 7:
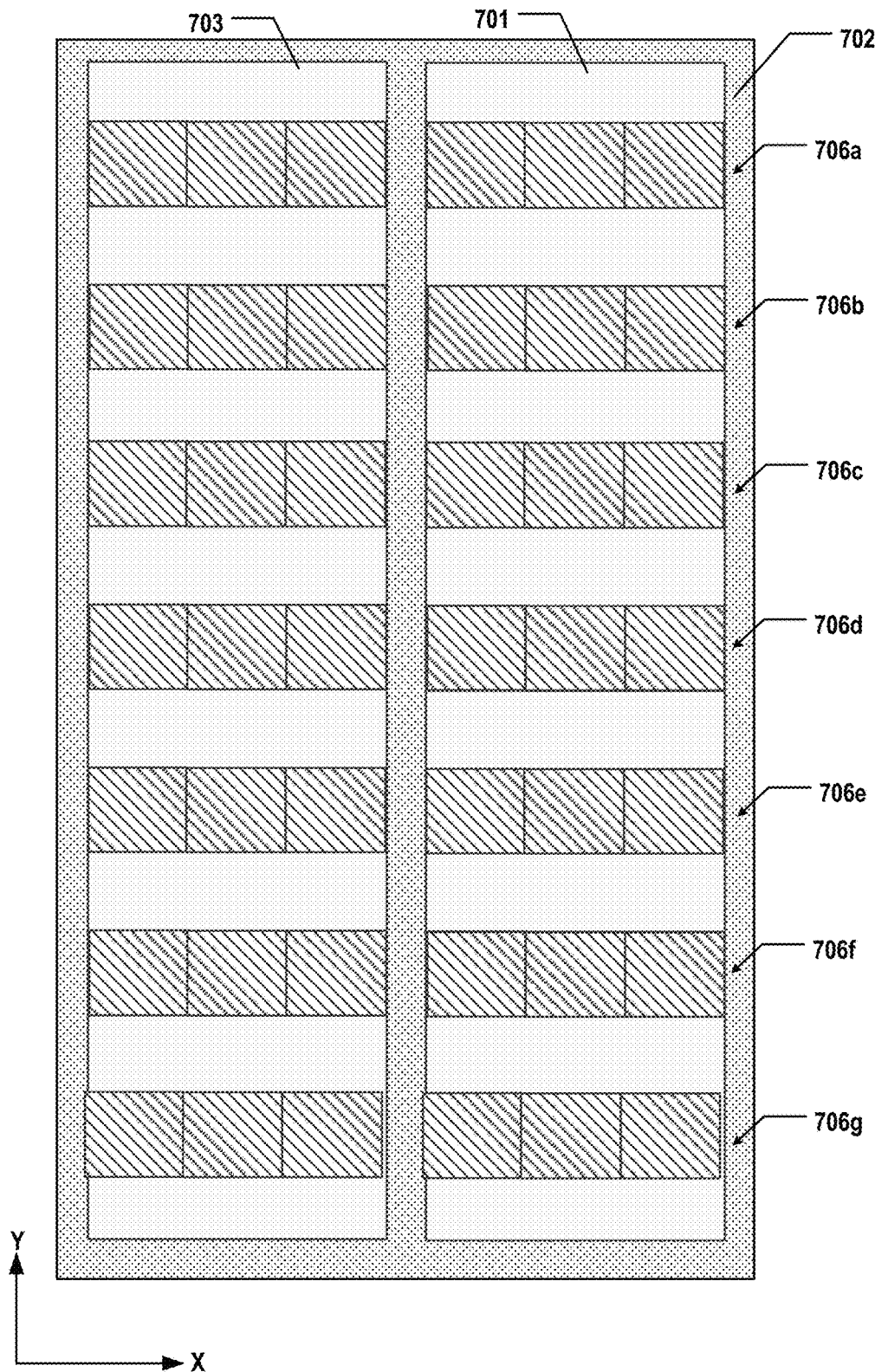
FIG. 7 illustrates a plan view of an exemplary 3D memory device having multiple gate lines, according to some embodiments of the present disclosure.

FIG. 1 illustrates a cross-section of an exemplary 3D memory device 100 having a single memory deck, according to some embodiments of the present disclosure. 3D memory device 100 can include a substrate 102, which can include silicon (e.g., single crystalline silicon), silicon germanium (SiGe), gallium arsenide (GaAs), germanium (Ge), silicon on insulator (SOI), or any other suitable materials. In some embodiments, substrate 102 is a thinned substrate (e.g., a semiconductor layer), which was thinned from a normal thickness by grinding, wet/dry etching, chemical mechanical polishing (CMP), or any combination thereof. It is noted that x- and z-axes are included in FIG. 1 to further illustrate the spatial relationships of the components in 3D memory device 100. The x- and y-axes are orthogonal in the x-y plane, which is parallel to the wafer surface (e.g., as shown in FIG. 7). Substrate 102 includes two lateral surfaces extending laterally in the x-y plane (i.e., in the lateral direction): a top surface on the front side of the wafer, and a bottom surface on the backside opposite to the front side of the wafer. The z-axis is perpendicular to both the x- and y-axes. As used herein, whether one component (e.g., a layer or a device) is "on," "above," or "below" another component (e.g., a layer or a device) of a semiconductor device (e.g., 3D memory device 100) is determined relative to the substrate of the semiconductor device (e.g., substrate 102) in the z-direction (the vertical direction perpendicular to the x-y plane) when the substrate is positioned in the lowest plane of the semiconductor device in the z-direction. The same notion for describing the spatial relationships is applied throughout the present disclosure.

3D memory device 100 can include a gate electrode 104 above substrate 102. In some embodiments, a pad layer (not shown), such as an in-situ steam generation (ISSG) silicon oxide, is formed between substrate 102 (e.g., a silicon substrate) and gate electrode 104. As shown in FIG. 1, gate electrode 104 can have an inverted "T" shape in the cross-section view. In some embodiments, the inverted "T" shape includes two "shoulders" and a "head" laterally between the two shoulders in the x-direction. In some embodiments, the two shoulders of the inverted "T" shape are in the same level that is below the level at which the head of the inverted "T" shape is. The top surface of gate electrode 104 can include a first part extending laterally and a second part extending vertically. For example, the upper sides of the head and shoulders of the inverted "T" shape of gate electrode 104 may be nominally parallel to the lateral surface of substrate 102, while the sidewalls connecting the head and each shoulder of the inverted "T" shape of gate electrode 104 may be nominally perpendicular to the lateral surface of substrate 102.

Gate electrode 104 can include conductive materials including, but not limited to, tungsten (W), cobalt (Co), copper (Cu), aluminum (Al), polysilicon, doped silicon, silicides, or any combination thereof. In some embodiments, gate electrode 104 includes a metal layer, such as a tungsten layer. In some embodiments, gate electrode 104 includes a doped polysilicon layer. Polysilicon can be doped to a desired doping concentration with any suitable dopant to become a conductive material that can be used as the material of gate electrode 104. Gate electrode 104 can extend laterally (e.g., in the y-direction perpendicular to both the x- and z-axes in FIG. 1) as a word line of 3D memory device 100.

3D memory device 100 can also include a blocking layer 106 (also known as "blocking oxide") on gate electrode 104. In some embodiments, a gate dielectric layer (not shown) is disposed between blocking layer 106 and gate electrode 104 or is part of gate electrode 104 (e.g., as the upper portion of gate electrode 104 in contact with blocking layer 106). For example, the gate dielectric layer may include high dielectric constant (high-k) dielectrics including, but not limited to, aluminum oxide ($Al_2O_3$), hafnium oxide ($HfO_2$), zirconium oxide ($ZnO_2$), tantalum oxide ($Ta_2O_5$), etc. As shown in FIG. 1, blocking layer 106 is continuous and disposed along at least the top surface of gate electrode 104, according to some embodiments. That is, blocking layer 106 can be a continuous layer that covers the upper sides of the head and shoulders of the inverted "T" shape of gate electrode 104 as well as the sidewalls connecting the head and each shoulder of the inverted "T" shape of gate electrode 104. In some embodiments, each end of blocking layer 106 can further extend vertically to cover the sidewalls connecting substrate 102 and each shoulder of the inverted "T" shape of gate electrode 104, i.e., completely covering gate electrode 104 in the x-direction. Blocking layer 106 can include silicon oxide, silicon oxynitride, high-k dielectrics, or any combination thereof. In some embodiments, blocking layer 106 is a composite dielectric layer including a plurality of sub-blocking layers, for example, a high-k dielectric layer, a first silicon oxide layer, a silicon oxynitride layer, and a second silicon oxide layer, in the bottom-up order.

3D memory device 100 can further include a plurality of charge trapping layers 108a, 108b, and 108c (also known as "storage nitride") on blocking layer 106. As illustrated in FIG. 1, charge trapping layers 108a, 108b, and 108c on blocking layer 106 are discrete (as opposed to a continuous layer) and disposed at different levels (i.e., having different distance from the lateral surface of substrate 102 in the vertical direction, as opposed to at the same level). In some embodiments, three discrete charge trapping layers: a first charge trapping layer 108a is disposed laterally between a second charge trapping layer 108b and a third charge trapping layer 108c. Second and third charge trapping layers 108b and 108c are disposed at the same level that is below the level at which first charge trapping layer 108a is disposed, according to some embodiments. For example, each of first, second, and third charge trapping layers 108a, 108b, and 108c may extend laterally, but not vertically, i.e., being disconnected at the sidewalls of blocking layer 106. In other words, each first, second, or third charge trapping layer 108a, 108b, or 108c does not include a part that extends vertically along the sidewalls of blocking layer 106 underneath, according to some embodiments. In some embodiments, first charge trapping layer 108a is disposed corresponding to the head of the inverted "T" shape of gate electrode 104. For example, first charge trapping layer 108a may be right above or cover the head of the inverted "T" shape of gate electrode 104. In some embodiments, second and third charge trapping layers 108b and 108c are disposed corresponding to the two shoulders of the inverted "T" shape of gate electrode 104, respectively. For example, each of second and third charge trapping layers 108b and 108c may be right above or cover a respective shoulder of the inverted "T" shape of gate electrode 104.

Each charge trapping layers 108a, 108b, or 108c can store charges, for example, electrons or holes from a semiconductor channel (e.g., channel layers 112a, 112b, and 112c in FIG. 1). The storage or removal of charge in charge trapping layers 108a, 108b, and 108c can impact the on/off state and/or the conductance of the semiconductor channel. Charge trapping layers 108a, 108b, and 108c can include silicon nitride, silicon oxynitride, silicon, or any combination thereof. In some embodiments, each charge trapping layer 108a, 108b, or 108c is a composite dielectric layer including a plurality of sub-charge trapping layers, for example, a first silicon nitride layer, a first silicon oxynitride layer, a second silicon nitride layer, a second silicon oxynitride layer, and a third silicon nitride layer, in the bottom-up order.

3D memory device 100 can further include a tunneling layer 110 (also known as "tunnel oxide") on charge trapping layers 108a, 108b, and 108c. As shown in FIG. 1, tunneling layer 110 is continuous and disposed along at least the top surfaces of charge trapping layers 108a, 108b, and 108c, according to some embodiments. That is, tunneling layer 110 can be a continuous layer that covers each charge trapping layer 108a, 108b, or 108c. In some embodiments, the part of tunneling layer 110 extending vertically is in contact with the part of blocking layer 106 extending vertically (e.g., the sidewalls of blocking layer 106). As a result, tunneling layer 110 completely covers charge trapping layers 108a, 108b, and 108c and blocking layer 106 in the x-direction, according to some embodiments. Charge trapping layers 108a, 108b, and 108c can be sandwiched between two continuous layers: tunneling layer 110 and blocking layer 106 in the z-direction. Charges, for example, electrons or holes from a semiconductor channel (e.g., channel layers 112a, 112b, and 112c in FIG. 1) can tunnel through tunneling layer 110 to charge trapping layers 108a, 108b, and 108c. Tunneling layer 110 can include silicon oxide, silicon oxynitride, or any combination thereof. In some embodiments, tunneling layer 110 is a composite dielectric layer including a plurality of sub-tunneling layers, for example, a first silicon oxide layer, a first silicon oxynitride layer, a second silicon oxynitride layer, a third silicon oxynitride layer, and a second silicon oxide layer, in the bottom-up order. Blocking layer 106, charge trapping layers 108a, 108b, and 108c, and tunneling layer 110 can be collectively referred to as a "memory film." In some embodiments, blocking layer 106 includes silicon oxide, each charge trapping layer 108a, 108b, or 108c includes silicon nitride, tunneling layer 110 includes silicon oxide, and the memory film is referred to as an "ONO" memory film for charge trapping-type of flash memory.

3D memory device 100 can further include a plurality of channel layers 112a, 112b, and 112c (also known as "semiconductor channel") on tunneling layer 110. As illustrated in FIG. 1, channel layers 112a, 112b, and 112c on tunneling layer 110 are discrete (as opposed to a continuous layer) and disposed at different levels (i.e., having different distance from the lateral surface of substrate 102 in the vertical direction, as opposed to at the same level). In some embodiments, three discrete channel layers: a first channel layer 112a is disposed laterally between a second channel layer 112b and a third channel layer 112c. Second and third channel layers 112b and 112c are disposed at the same level that is below the level at which first channel layer 112a is disposed, according to some embodiments. For example, each of first, second, and third channel layers 112a, 112b, and 112c may extend laterally, but not vertically, i.e., being disconnected at the sidewalls of tunneling layer 110. In other words, each first, second, or third channel layer 112a, 112b, and 112c does not include a part that extends vertically along the sidewalls of tunneling layer 110 underneath, according to some embodiments. In some embodiments, first channel layer 112a is disposed corresponding to the head of the inverted "T" shape of gate electrode 104. For example, first channel layer 112a may be right above or cover the head of the inverted "T" shape of gate electrode 104. In some embodiments, second and third channel layers 112b and 112c are disposed corresponding to the two shoulders of the inverted "T" shape of gate electrode 104, respectively. For example, each of second and third channel layers 112b and 112c may be right above or cover a respective shoulder of the inverted "T" shape of gate electrode 104.

In some embodiments, each channel layer 112a, 112b, or 112c corresponds to respective charge trapping layer 108a, 108b, or 108c. For example, first, second, and channel layers 112a, 112b, and 112c may correspond to (e.g., right above or cover) first, second, and third charge trapping layers 108a, 108b, and 108c, respectively. Each channel layer 112a, 112b, or 112c can provide charges, for example, electrons or holes, to respective first, second, or third charge trapping layer 108a, 108b, or 108c, tunneling through tunneling layer 110. Channel layers 112a, 112b, and 112c can include silicon, such as amorphous silicon, polysilicon, or single-crystal silicon. In some embodiments, each channel layer 112a, 112b, or 112c includes polysilicon.

Inverted "T"-shaped gate electrode 104 in conjunction with the memory film (including blocking layer 106, charge trapping layers 108a, 108b, and 108c, and tunneling layer 110) and channel layers 112a, 112b, and 112c disposed thereon can be referred to herein as a "memory deck," which is the basic unit for scaling up the storage capacity as described below in detail. The single memory deck of 3D memory device 100 includes two levels 101 and 103 corresponding to the head and shoulders of the inverted "T" shape of gate electrode 104, respectively, according to some embodiments. As described above, first charge trapping and channel layer 108a and 112a can be disposed at first level 101, and second charge trapping and channel layers 108b and 112b and third charge trapping and channel layers 108c and 112c can be disposed at second level 103 below first level 101.

In some embodiments, by separating both the charge trapping layer and channel layer into three discrete layers at different levels (e.g., at first and second levels 101 and 103 of the memory deck) corresponding to the head and shoulders of the inverted "T" shape of gate electrode 104, 3D memory device 100 in FIG. 1 includes three memory cells: a first memory cell 101a, a second memory cell 103b, and a third memory cell 103c. In some embodiments, first memory cell 101a is disposed at first level 101, and second and third memory cells 103b and 103c are disposed at second level 103 of the memory deck. For example, first memory cell 101a may include part of blocking layer 106, first charge trapping layer 108a, part of tunneling layer 110, and first channel layer 112a. Similarly, second memory cell 103b may include part of blocking layer 106, second charge trapping layer 108b, part of tunneling layer 110, and second channel layer 112b; third memory cell 103c may include part of blocking layer 106, third charge trapping layer 108c, part of tunneling layer 110, and third channel layer 112c. First, second, and third memory cells 101a, 103b, and 103c can share same gate electrode 104. First, second, and third memory cells 101a, 103b, and 103c of 3D memory device 100 can be controlled by gate electrode 104.

Although not shown in FIG. 1, it is understood that any other suitable components may be included as part of 3D memory device 100. For example, local contacts, such as bit line contacts, word line contacts, and source line contacts, may be included in 3D memory device 100 for pad-out, i.e., electrically connecting memory cells 101a, 103b, and 103c for metal routing to interconnects (e.g., middle-end-of-line (MEOL) interconnects and back-end-of-line (BEOL) interconnects). In one example, gate electrode 104 may be padded out using word line contacts through the sidewalls of the memory film. In another example, each channel layer 112a, 112b, or 112c may be padded out using bit line contacts from a respective top surface. In some embodiments, 3D memory device 100 further includes peripheral circuits, such as any suitable digital, analog, and/or mixed-signal peripheral circuits used for facilitating the operation of 3D memory device 100. For example, the peripheral circuits can include one or more of a page buffer, a decoder (e.g., a row decoder and a column decoder), a sense amplifier, a driver, a charge pump, a current or voltage reference, or any active or passive components of the circuits (e.g., transistors, diodes, resistors, or capacitors).

Figure 2:
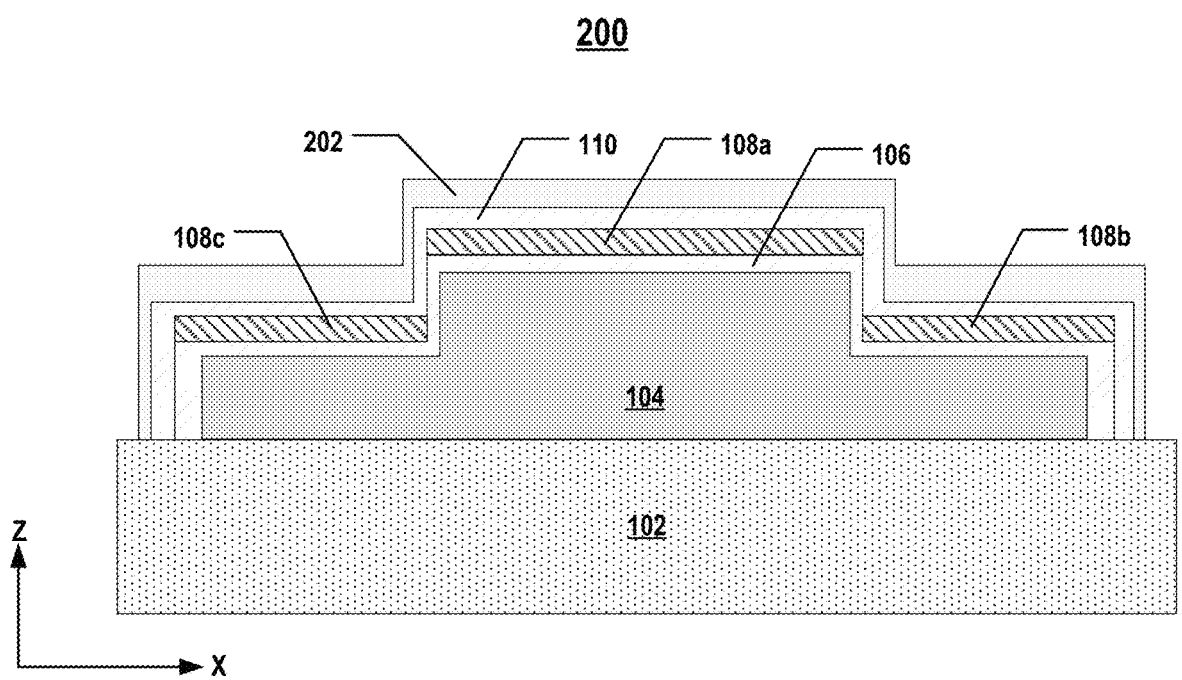
FIG. 2 illustrates a cross-section of another exemplary 3D memory device having a single memory deck, according to some embodiments of the present disclosure.

FIG. 2 illustrates a cross-section of another exemplary 3D memory device 200 having a single memory deck, according to some embodiments of the present disclosure. 3D memory device 200 is similar to 3D memory device 100 in FIG. 1 except for the channel layer. The structures, functions, and materials of the same components that have been described above with respect to 3D memory device 100 in FIG. 1 are not repeated for ease of description. Instead of having discrete channel layers (e.g., first, second, and third channel layers 112a, 112b, and 112c in 3D memory device 100), 3D memory device 200 includes a continuous channel layer 202 on tunneling layer 110. As shown in FIG. 2, channel layer 202 is continuous and disposed along at least the top surface of tunneling layer 110, according to some embodiments. That is, channel layer 202 can be a continuous layer that covers tunneling layer 110 underneath. Channel layer 202 can provide charges, for example, electrons or holes, to each first, second, and third charge trapping layer 108a, 108b, or 108c, tunneling through tunneling layer 110. Channel layer 202 can include silicon, such as amorphous silicon, polysilicon, or single-crystal silicon. In some embodiments, channel layer 202 includes polysilicon.

Due to the different design of the channel layer, the single memory deck of 3D memory device 200 includes a single memory cell, as opposed to three memory cells 101a, 103b, and 103c in the single memory deck of 3D memory device 100 in FIG. 1. That is, 3D memory device 200 can have one memory cell that includes blocking layer 106, first, second, and third charge trapping layers 108a, 108b, and 108c, tunneling layer 110, and channel layer 202. The memory cell of 3D memory device 200 can be controlled by gate electrode 104.

Figure 3:
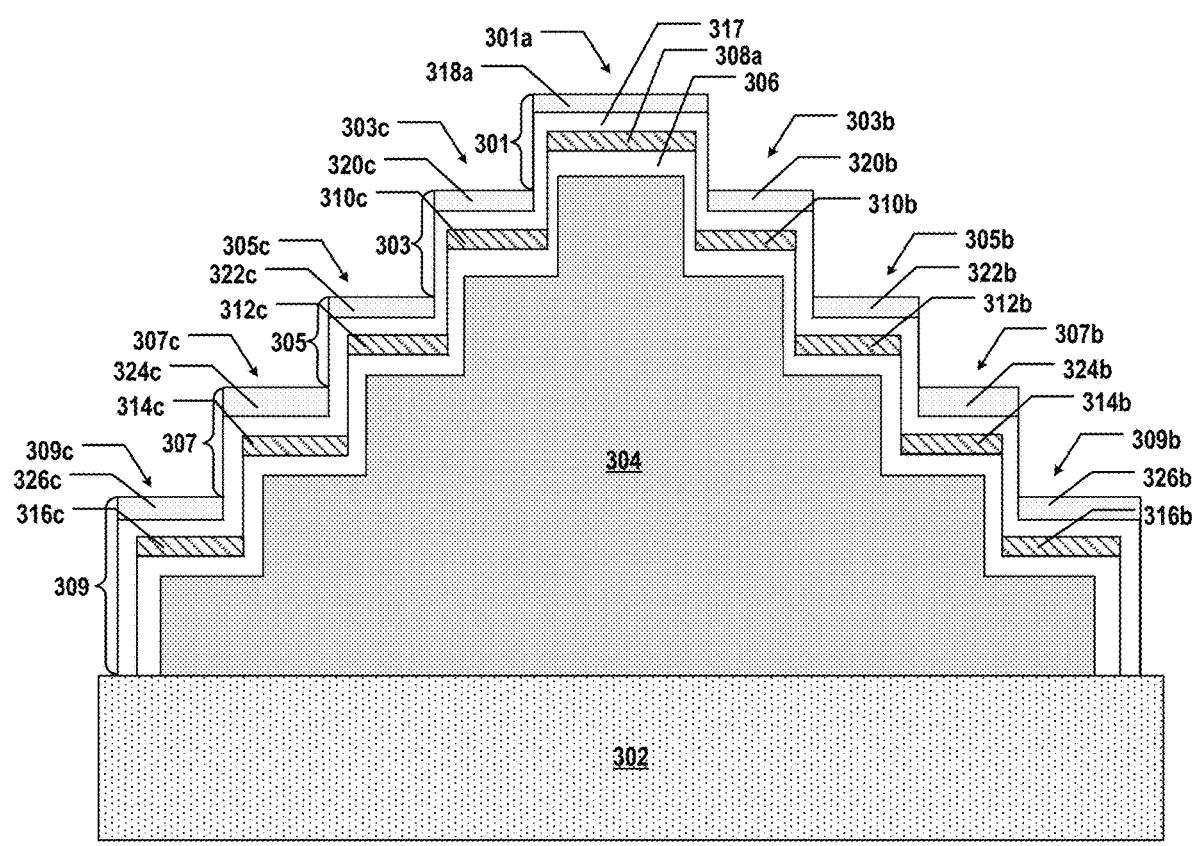
FIG. 3 illustrates a cross-section of still another exemplary 3D memory device having a single memory deck, according to some embodiments of the present disclosure.

One way to scale-up the memory cells in the 3D memory devices disclosed herein is to increase the number of levels in a single memory deck. FIG. 3 illustrates a cross-section of still another exemplary 3D memory device 300 having a single memory deck, according to some embodiments of the present disclosure. Similar to 3D memory device 100 in FIG. 1, 3D memory device 300 is another example of a 3D memory device having a single memory deck with multiple memory cells. Different from 3D memory device 100 in FIG. 1 including an inverted "T"-shaped gate electrode 104, 3D memory device 300 includes a two-sided staircase-shaped gate electrode 304. In some embodiments, the two-sided staircase shape of gate electrode 304 includes at least five stairs at three levels at which at least five memory cells can be disposed. Compared with the inverted "T" shape of gate electrode 104, which has one head and two shoulders at two levels 101 and 103 at which three memory cells 101a, 103b, and 103c are disposed, the number of memory cells in a single memory deck can be increased in 3D memory device 300 in FIG. 3.

3D memory device 300 can include gate electrode 304 above a substrate 302. Substrate 302 can include silicon (e.g., single crystalline silicon), SiGe, GaA, Ge, SOI, or any other suitable materials. In some embodiments, a pad layer (not shown), such as an ISSG silicon oxide, is formed between substrate 302 (e.g., a silicon substrate) and gate electrode 304. Gate electrode 304 can include conductive materials including, but not limited to, W, Co, Cu, Al, polysilicon, doped silicon, silicides, or any combination thereof. In some embodiments, gate electrode 304 includes a metal layer, such as a tungsten layer. In some embodiments, gate electrode 304 includes a doped polysilicon layer. Polysilicon can be doped to a desired doping concentration with any suitable dopant to become a conductive material that can be used as the material of gate electrode 304. Gate electrode 304 can extend laterally (e.g., in the y-direction perpendicular to both the x- and z-axes in FIG. 3) as a word line of 3D memory device 300.

As shown in FIG. 3, gate electrode 304 can have a two-sided staircase shape in the cross-section view. In some embodiments, the two-sided staircase shape includes at least three levels, such as five levels 301, 303, 305, 307, and 309 as shown in FIG. 3. Besides the top level, which has one stair, each other level of the two-sided staircase shape can have two stairs on each side, making the total number of stairs in the two-sided staircase shape being 2L−1, where L is the number of levels. Accordingly, the two-sided staircase shape of gate electrode 304 has at least five stairs at three levels. In some embodiments, the two stairs at each level 303, 305, 307, or 309 are below the top stair at top level 301. The stairs of the two-sided staircase shape of gate electrode 304 can be symmetric in the lateral direction (e.g., the x-direction). In some embodiments, the two stairs on the same side at adjacent levels of the two-sided staircase shape of gate electrode 304 are offset by a nominally same distance in the vertical direction (the z-direction) and a nominally same distance in the lateral direction (e.g., the x-direction). For each two adjacent levels of the two-sided staircase shape, the first level that is closer to substrate 302 can extend laterally further than the second level, thereby forming two platforms (similar to the two shoulders of the inverted "T" shape of gate electrode 104 of 3D memory device 100 in FIG. 1) where memory cells can form. The top surface of gate electrode 304 can include a first part extending laterally and a second part extending vertically. For example, the upper sides of each stair of the two-sided staircase shape of gate electrode 304 may be nominally parallel to the lateral surface of substrate 302, while the sidewalls connecting the stairs at adjacent levels of the two-sided staircase shape of gate electrode 304 may be nominally perpendicular to the lateral surface of substrate 302. The first part of the top surface of gate electrode 304 extending laterally corresponds to the platforms where memory cells can form, according to some embodiments.

3D memory device 300 can also include a blocking layer 306 on gate electrode 304. In some embodiments, a gate dielectric layer (not shown) is disposed between blocking layer 306 and gate electrode 304 or is part of gate electrode 304 (e.g., as the upper portion of gate electrode 304 in contact with blocking layer 306). For example, the gate dielectric layer may include high-k dielectrics including, but not limited to, $Al_2O_3$, $HfO_2$, $ZnO_2$, $Ta_2O_5$, etc. As shown in FIG. 3, blocking layer 306 is continuous and disposed along at least the top surface of gate electrode 304, according to some embodiments. That is, blocking layer 306 can be a continuous layer that covers the upper sides of the stairs of the two-sided staircase shape of gate electrode 304 as well as the sidewalls connecting the stairs of the two-sided staircase shape of gate electrode 304. In some embodiments, each end of blocking layer 306 can further extend vertically to cover the sidewalls connecting substrate 302 and the stairs at the lowest level (e.g., 309), i.e., completely covering gate electrode 304 in the x-direction. Blocking layer 306 can include silicon oxide, silicon oxynitride, high-k dielectrics, or any combination thereof. In some embodiments, blocking layer 306 is a composite dielectric layer including a plurality of sub-blocking layers, for example, a high-k dielectric layer, a first silicon oxide layer, a silicon oxynitride layer, and a second silicon oxide layer, in the bottom-up order.

3D memory device 300 can further include a plurality of charge trapping layers 308a, 310b, 310c, 312b, 312c, 314b, 314c, 316b, and 316c on blocking layer 306. As illustrated in FIG. 3, charge trapping layers 308a, 310b, 310c, 312b, 312c, 314b, 314c, 316b, and 316c on blocking layer 306 are discrete (as opposed to a continuous layer) and disposed at different levels 301, 303, 305, 307, and 309 (i.e., having different distance from the lateral surface of substrate 302 in the vertical direction, as opposed to at the same level). In some embodiments, nine discrete charge trapping layers: a top charge trapping layer 308a is disposed laterally between a set of left charge trapping layer 310c, 312c, 314c, and 316c, and a set of right charge trapping layers 310b, 312b, 314b, and 316b. Each pair of left and right charge trapping layers 310b and 310c, 312b and 312c, 314b and 314b, or 316b and 316c are disposed at the same level that is below top level 301 at which top charge trapping layer 308a is disposed, according to some embodiments. For example, each of charge trapping layers 308a, 310b, 310c, 312b, 312c, 314b, 314c, 316b, and 316c may extend laterally, but not vertically, i.e., being disconnected at the sidewalls of blocking layer 306. In other words, each charge trapping layer 308a, 310b, 310c, 312b, 312c, 314b, 314c, 316b, or 316c does not include a part that extends vertically along the sidewalls of blocking layer 306 underneath, according to some embodiments. In some embodiments, top charge trapping layer 308a is disposed corresponding to the top stair at top level 301 of the two-sided staircase shape of gate electrode 304. For example, top charge trapping layer 308a may be right above or cover the top stair of the two-sided staircase shape of gate electrode 304. In some embodiments, left and right charge trapping layers 310b, 310c, 312b, 312c, 314b, 314c, 316b, and 316c are disposed corresponding to other stairs at other levels 303, 305, 307, and 309 of the two-sided staircase shape of gate electrode 304, respectively. For example, each of left and right charge trapping layers 310b, 310c, 312b, 312c, 314b, 314c, 316b, and 316c may be right above or cover a respective stair of the two-sided staircase shape of gate electrode 304.

Each charge trapping layer 308a, 310b, 310c, 312b, 312c, 314b, 314c, 316b, or 316c can store charges for example, electrons or holes from a semiconductor channel (e.g., channel layers 318a, 320b, 320c, 322b, 322c, 324b, 324c, 326b, and 326c in FIG. 3). The storage or removal of charge in charge trapping layers 308a, 310b, 310c, 312b, 312c, 314b, 314c, 316b, and 316c can impact the on/off state and/or the conductance of the semiconductor channel Charge trapping layers 308a, 310b, 310c, 312b, 312c, 314b, 314c, 316b, and 316c can include silicon nitride, silicon oxynitride, silicon, or any combination thereof. In some embodiments, each charge trapping layer 308a, 310b, 310c, 312b, 312c, 314b, 314c, 316b, or 316c is a composite dielectric layer including a plurality of sub-charge trapping layers, for example, a first silicon nitride layer, a first silicon oxynitride layer, a second silicon nitride layer, a second silicon oxynitride layer, and a third silicon nitride layer, in the bottom-up order. It is understood that although nine charge trapping layers are shown in FIG. 3, it is understood that 3D memory device 300 may have different numbers of charge trapping layers in other embodiments. The number of the charge trapping layers can correspond to the number of levels, stairs, and platforms of the two-sided staircase shape of gate electrode 304, as described above in detail. In some embodiments, 3D memory device 300 includes at least five discrete charge trapping layers at three levels.

3D memory device 300 can further include a tunneling layer 317 on charge trapping layers 308a, 310b, 310c, 312b, 312c, 314b, 314c, 316b, and 316c. As shown in FIG. 1, tunneling layer 317 is continuous and disposed along at least the top surfaces of charge trapping layers 308a, 310b, 310c, 312b, 312c, 314b, 314c, 316b, and 316c, according to some embodiments. That is, tunneling layer 317 can be a continuous layer that covers each charge trapping layer 308a, 310b, 310c, 312b, 312c, 314b, 314c, 316b, or 316c. In some embodiments, the part of tunneling layer 317 extending vertically is in contact with the part of blocking layer 306 extending vertically (e.g., the sidewalls of blocking layer 306). As a result, tunneling layer 317 completely covers charge trapping layers 308a, 310b, 310c, 312b, 312c, 314b, 314c, 316b, and 316c and blocking layer 306 in the x-direction, according to some embodiments. Charge trapping layers 308a, 310b, 310c, 312b, 312c, 314b, 314c, 316b, and 316c can be sandwiched between two continuous layers: tunneling layer 317 and blocking layer 306 in the z-direction. Charges for example, electrons or holes from a semiconductor channel (e.g., channel layers 318a, 320b, 320c, 322b, 322c, 324b, 324c, 326b, and 326c in FIG. 3) can tunnel through tunneling layer 317 to charge trapping layers 308a, 310b, 310c, 312b, 312c, 314b, 314c, 316b, and 316c. Tunneling layer 317 can include silicon oxide, silicon oxynitride, or any combination thereof. In some embodiments, tunneling layer 317 is a composite dielectric layer including a plurality of sub-tunneling layers, for example, a first silicon oxide layer, a first silicon oxynitride layer, a second silicon oxynitride layer, a third silicon oxynitride layer, and a second silicon oxide layer, in the bottom-up order. Blocking layer 306, charge trapping layers 308a, 310b, 310c, 312b, 312c, 314b, 314c, 316b, and 316c, and tunneling layer 317 can be collectively referred to as a "memory film." In some embodiments, blocking layer 306 includes silicon oxide, each charge trapping layer 308a, 310b, 310c, 312b, 312c, 314b, 314c, 316b, or 316c includes silicon nitride, tunneling layer 317 includes silicon oxide, and the memory film is referred to as an "ONO" memory film for charge trapping-type of flash memory.

3D memory device 300 can further include a plurality of channel layers 318a, 320b, 320c, 322b, 322c, 324b, 324c, 326b, and 326c on tunneling layer 317. As illustrated in FIG. 3, channel layers 318a, 320b, 320c, 322b, 322c, 324b, 324c, 326b, and 326c on tunneling layer 317 are discrete (as opposed to a continuous layer) and disposed at different levels (i.e., having different distance from the lateral surface of substrate 302 in the vertical direction, as opposed to at the same level). In some embodiments, nine discrete channel layers: a top channel layer 318a is disposed laterally between a set of left channel layers 320c, 322c, 324c, and 326c and a set of right channel layers 320b, 322b, 324b, and 326b. Each pair of left and right channel layers 320b and 320c, 322b and 322c, 324b and 324c, or 326b and 326c are disposed at the same level that is below top level 301 at which top channel layer 318a is disposed, according to some embodiments. For example, each of top, left, and right channel layers 318a, 320b, 320c, 322b, 322c, 324b, 324c, 326b, and 326c may extend laterally, but not vertically, i.e., being disconnected at the sidewalls of tunneling layer 317. In other words, each top, left, and right channel layers 318a, 320b, 320c, 322b, 322c, 324b, 324c, 326b, or 326c does not include a part that extends vertically along the sidewalls of tunneling layer 317 underneath, according to some embodiments. In some embodiments, top channel layer 318a is disposed corresponding to the top stair at top level 301 of the two-sided staircase shape of gate electrode 304. For example, top channel layer 318a may be right above or cover the top stair of the two-sided staircase shape of gate electrode 304. In some embodiments, left and right channel layers 320b, 320c, 322b, 322c, 324b, 324c, 326b, and 326c are disposed corresponding to other stairs at other levels 303, 305, 307, and 309 of the two-sided staircase shape of gate electrode 304, respectively. For example, each of left and right channel layers 320b, 320c, 322b, 322c, 324b, 324c, 326b, and 326c may be right above or cover a respective stair of the two-sided staircase shape of gate electrode 304.

In some embodiments, each channel layer 318a, 320b, 320c, 322b, 322c, 324b, 324c, 326b, or 326c corresponds to respective charge trapping layer 308a, 310b, 310c, 312b, 312c, 314b, 314c, 316b, or 316c. For example, top, left, and right channel layers 318a, 320b, 320c, 322b, 322c, 324b, 324c, 326b, and 326c may correspond to (e.g., right above or cover) first, left, and right charge trapping layers 308a, 310b, 310c, 312b, 312c, 314b, 314c, 316b, and 316c, respectively. Each channel layer 318a, 320b, 320c, 322b, 322c, 324b, 324c, 326b, or 326c can provide charges, for example, electrons or holes, to respective charge trapping layer 308a, 310b, 310c, 312b, 312c, 314b, 314c, 316b, or 316c, tunneling through tunneling layer 317. Channel layers 318a, 320b, 320c, 322b, 322c, 324b, 324c, 326b, and 326c can include silicon, such as amorphous silicon, polysilicon, or single-crystal silicon. In some embodiments, each channel layer 318a, 320b, 320c, 322b, 322c, 324b, 324c, 326b, or 326c includes polysilicon. It is understood that although nine channel layers are shown in FIG. 3, it is understood that 3D memory device 300 may have different numbers of channel layers in other embodiments. The number of the channel layers can correspond to the number of levels, stairs, and platforms of the two-sided staircase shape of gate electrode 304, as described above in detail. In some embodiments, 3D memory device 300 includes at least five discrete channel layers at three levels.

Two-sided staircase-shaped gate electrode 304 in conjunction with the memory film (including blocking layer 306, charge trapping layers 308a, 310b, 310c, 312b, 312c, 314b, 314c, 316b, and 316c, and tunneling layer 317) and channel layers 318a, 320b, 320c, 322b, 322c, 324b, 324c, 326b, and 326c disposed thereon can be referred to herein as a single memory deck, which has more memory cells compared with the single memory deck in 3D memory device 100 in FIG. 1. In some embodiments, by separating both the charge trapping layer and channel layer into nine discrete layers at five levels 301, 303, 305, 307, and 309 corresponding to the stairs of the two-sided staircase shape of gate electrode 304, 3D memory device 300 in FIG. 3 includes nine memory cells: a top memory cell 301a, a set of left memory cells 303c, 305c, 307c, and 309c, and a set of right memory cells 303b, 305b, 307b, and 309b. Top memory cell 301a is disposed at top level 301, and each pair of left and right memory cells 303b and 303c, 305b and 305c, 307b and 307c, or 309b and 309c are disposed at respective level 303, 305, 307, or 309 of the memory deck. For example, top memory cell 301a may include part of blocking layer 306, top charge trapping layer 308a, part of tunneling layer 317, and top channel layer 318a. Similarly, each left memory cell 303c, 305c, 307c, or 309c may include part of blocking layer 306, respective left charge trapping layer 310c, 312c, 314c, or 316c, part of tunneling layer 317, and respective left channel layer 320c, 322c, 324c, or 326c. Similarly, each right memory cell 303b, 305b, 307b, or 309b may include part of blocking layer 306, respective right charge trapping layer 310b, 312b, 314b, or 316b, part of tunneling layer 317, and respective right channel layer 320b, 322b, 324b, or 326b. Top, left, and right memory cells 301a, 303b, 303c, 305b, 305c, 307b, 307c, 309b, and 309c can share same gate electrode 304. Top, left, and right memory cells 301a, 303b, 303c, 305b, 305c, 307b, 307c, 309b, and 309c of 3D memory device 300 can be controlled by gate electrode 304.

It is understood that although nine memory cells are shown in FIG. 3, it is understood that 3D memory device 300 may have different numbers of memory cells in other embodiments. The number of memory cells can correspond to the number of levels, stairs, and platforms of the two-sided staircase shape of gate electrode 304, as described above in detail. In some embodiments, 3D memory device 300 includes at least five memory cells at three levels. Although not shown in FIG. 3, it is understood that any other suitable components may be included as part of 3D memory device 300. For example, local contacts, such as bit line contacts, word line contacts, source line contacts, may be included in 3D memory device 300 for pad-out, i.e., electrically connecting memory cells 301*a*, 303*b*, 303*c*, 305*b*, 305*c*, 307*b*, 307*c*, 309*b*, and 309*c* for metal routing to interconnects (e.g., MEOL interconnects and BEOL interconnects). In one example, gate electrode 304 may be padded out using word line contacts through the sidewalls of the memory film. In another example, each channel layer 318*a*, 320*b*, 320*c*, 322*b*, 322*c*, 324*b*, 324*c*, 326*b*, or 326*c* may be padded out using bit line contacts from a respective top surface. In some embodiments, 3D memory device 300 further includes peripheral circuits, such as any suitable digital, analog, and/or mixed-signal peripheral circuits used for facilitating the operation of 3D memory device 300. For example, the peripheral circuits can include one or more of a page buffer, a decoder (e.g., a row decoder and a column decoder), a sense amplifier, a driver, a charge pump, a current or voltage reference, or any active or passive components of the circuits (e.g., transistors, diodes, resistors, or capacitors).

Figure 4:
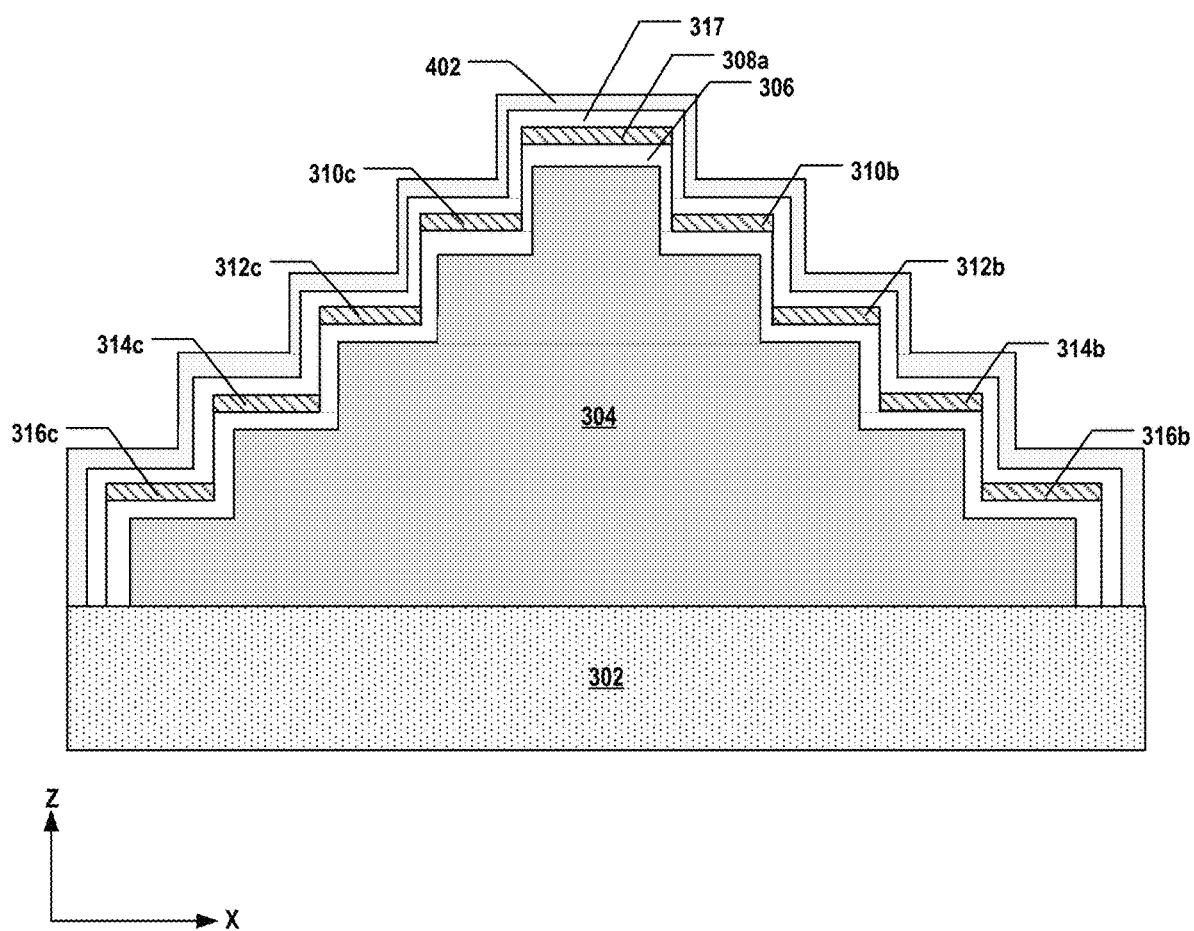
FIG. 4 illustrates a cross-section of yet another exemplary 3D memory device having a single memory deck, according to some embodiments of the present disclosure.

FIG. 4 illustrates a cross-section of yet another exemplary 3D memory device 400 having a single memory deck, according to some embodiments of the present disclosure. 3D memory device 400 is similar to 3D memory device 300 in FIG. 3 except for the channel layer. The structures, functions, and materials of the same components that have been described above with respect to 3D memory device 300 in FIG. 3 are not repeated for ease of description. Instead of having discrete channel layers (e.g., top, left, and right channel layers 318*a*, 320*b*, 320*c*, 322*b*, 322*c*, 324*b*, 324*c*, 326*b*, and 326*c* in 3D memory device 300), 3D memory device 400 includes a continuous channel layer 402 on tunneling layer 317. As shown in FIG. 4, channel layer 402 is continuous and disposed along at least the top surface of tunneling layer 317, according to some embodiments. That is, channel layer 402 can be a continuous layer that covers tunneling layer 317 underneath. Channel layer 402 can provide charges, for example, electrons or holes, to top, left, and right charge trapping layer 308*a*, 310*b*, 310*c*, 312*b*, 312*c*, 314*b*, 314*c*, 316*b*, and 316*c*, tunneling through tunneling layer 317. Channel layer 402 can include silicon, such as amorphous silicon, polysilicon, or single-crystal silicon. In some embodiments, channel layer 402 includes polysilicon.

Due to the different design of the channel layer, the single memory deck of 3D memory device 400 includes a single memory cell, as opposed to nine memory cells 301*a*, 303*b*, 303*c*, 305*b*, 305*c*, 307*b*, 307*c*, 309*b*, and 309*c* in the single memory deck of 3D memory device 300 in FIG. 3. That is, 3D memory device 400 can have one memory cell that includes blocking layer 306, top, left, and right charge trapping layers 308*a*, 310*b*, 310*c*, 312*b*, 312*c*, 314*b*, 314*c*, 316*b*, and 316*c*, tunneling layer 317, and channel layer 402. The memory cell of 3D memory device 400 can be controlled by gate electrode 304.

Figure 5A:
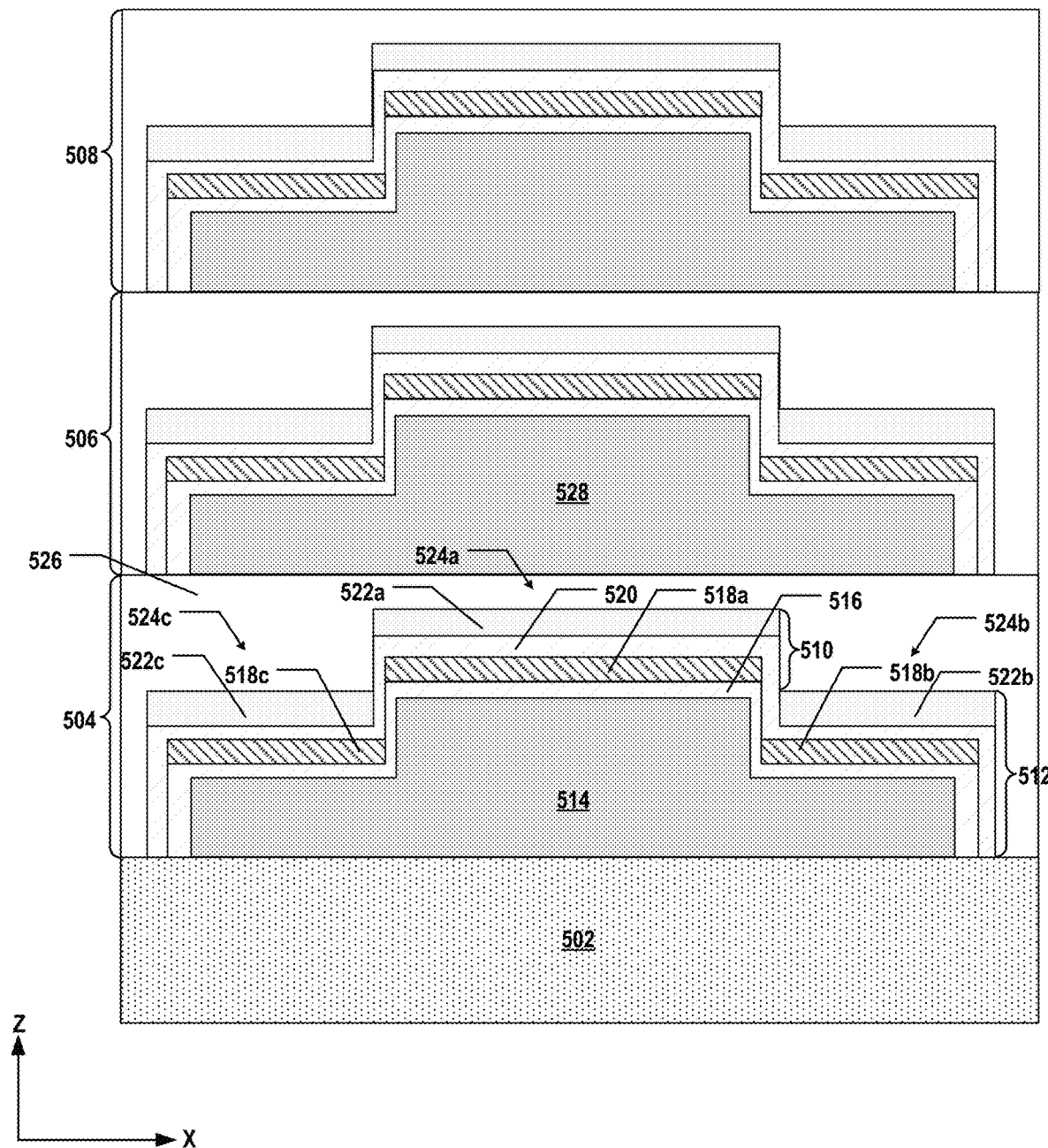
FIG. 5A illustrates a cross-section of an exemplary 3D memory device having multiple memory decks, according to some embodiments of the present disclosure.

Another way to scale-up the memory cells in the 3D memory devices disclosed herein is to increase the number of memory decks, for example, by stacking multiple memory decks. Any memory deck disclosed herein (e.g., the single memory decks in 3D memory devices 100, 200, 300, and 400) can be used as the basic unit for scaling up the storage capacity, for example, by stacking one over another. FIG. 5A illustrates a cross-section of an exemplary 3D memory device 500 having multiple memory decks, according to some embodiments of the present disclosure. 3D memory device 500 can include a plurality of memory decks 504, 506, and 508 stacked above a substrate 502 to increase the memory density without occupying more chip area. Two adjacent memory decks (e.g., 504 and 506) can be separated (e.g., insulated) by an inter-deck dielectric layer (e.g., 526). Each memory deck 504, 506, or 508 is substantially similar to the single memory deck in 3D memory device 100 in FIG. 1 (with the additional inter-deck dielectric layer). Thus, the components of each memory deck 504, 506, or 508 are substantially similar to their counterparts in 3D memory device 100 in FIG. 1 and thus, are not be repeated in detail herein As illustrated in FIG. 5A, memory deck 504 of 3D memory device 500 can include a gate electrode 514, a blocking layer 516 on gate electrode 514, a plurality of charge trapping layers 518*a*, 518*b*, and 518*c* on blocking layer 516, a tunneling layer 520 on charge trapping layers 518*a*, 518*b*, and 518*c*, and a plurality of channel layers 522*a*, 522*b*, and 522*c* on tunneling layer 520. Gate electrode 514 can have an inverted "T" shape, which includes a head at a first level 510 and two shoulders at a second level 512 below first level 510. Charge trapping layers 518*a*, 518*b*, and 518*c* are discrete and disposed at different levels 510 and 512, according to some embodiments. In some embodiments, first charge trapping layer 518*a* is disposed laterally between second and third charge trapping layers 518*b* and 518*c*. In some embodiments, second and third charge trapping layers 518*b* and 518*c* are disposed at same second level 512 that is below first level 510 at which first charge trapping layer 518*a* is disposed. For example, second and third charge trapping layers 518*b* and 518*c* may be disposed corresponding to the two shoulders of the inverted "T" shape of gate electrode 514, respectively, and first charge trapping layer 518*a* is disposed corresponding to the head of the inverted "T" shape of gate electrode 514. Similarly, channel layers 522*a*, 522*b*, and 522*c* are discrete and disposed at different levels 510 and 512, according to some embodiments. Each channel layer 522*a*, 522*b*, or 522*c* can correspond to respective one of charge trapping layers 518*a*, 518*b*, and 518*c*. In some embodiments, first channel layer 522*a* is disposed laterally between second and third channel layers 522*b* and 522*c*. In some embodiments, second and third channel layers 522*b* and 522*c* are disposed at same second level 512 that is below first level 510 at which first channel layer 522*a* is disposed. For example, second and third channel layers 522*b* and 522*c* may be disposed corresponding to the two shoulders of the inverted "T" shape of gate electrode 514, respectively, and first channel layer 522*a* is disposed corresponding to the head of the inverted "T" shape of gate electrode 514.

In some embodiments, blocking layer 516 is continuous and disposed along at least the top surface of gate electrode 514. In some embodiments, tunneling layer 520 is continuous and disposed along at least the top surfaces of each charge trapping layer 518*a*, 518*b*, or 518*c*. Blocking layer 516 includes silicon oxide, each charge trapping layer 518*a*, 518*b*, or 518*c* includes silicon nitride, and tunneling layer 520 includes silicon oxide, according to some embodiments. In some embodiments, each channel layer 522*a*, 522*b*, or 522*c* includes polysilicon. Memory deck 504 of 3D memory device 500 can include a first memory cell 524*a*, a second memory cell 524*b*, and a third memory cell 524*c*. In some embodiments, first, second, and third memory cells 524*a*, 524*b*, and 524*c* include first, second, and third charge trapping layers 518*a*, 518*b*, and 518*c*, respectively. In some embodiments, first, second, and third memory cells 524*a*, 524*b*, and 524*c* include first, second, and third channel layers 522a, 522b, and 522c, respectively. In some embodiments, each of first, second, and third memory cells 524a, 524b, and 524c includes a respective part of blocking layer 516 and a respective part of tunneling layer 520.

As illustrated in FIG. 5A, memory deck 504 can further include inter-deck dielectric layer 526 on channel layers 522a, 522b, and 522c. In some embodiments, the top surface of inter-deck dielectric layer 526 is nominally flat. For example, the top surface of inter-deck dielectric layer 526 may be nominally parallel to the lateral surface of substrate 502. A gate electrode 528 of memory deck 506 immediately above memory deck 504 is disposed on the top surface of inter-deck dielectric layer 526, according to some embodiments. In some embodiments, the bottom surface of gate electrode 528 is nominally flat. For example, the bottom surface of gate electrode 528 may be nominally parallel to the lateral surface of substrate 502 as well. In other words, the top surface of inter-deck dielectric layer 526 can fit the bottom surface of gate electrode 528 thereabove. Inter-deck dielectric layer 526 can be a single dielectric layer or a composite dielectric layer having multiple sub-dielectric layers. In some embodiments, inter-dielectric layer 526 includes silicon oxide, silicon nitride, silicon oxynitride, or any combinations thereof.

It is understood that memory decks 506 and 508 are substantially similar to memory deck 504. Thus, the components of memory decks 506 and 508 are not repeated herein for ease of description. Separated by inter-deck dielectric layers (e.g., 526), each gate electrode (e.g., 514 or 528) of 3D memory device 500 can be individually addressed to control the respective memory cells disposed thereon. It is also understood that the number of memory decks stacked above substrate 502 is not limited to the example described with respect to FIG. 5A and can be any positive integer greater than one. It is further understood that any suitable interconnects between memory decks 504, 506, and 508 for electrically connecting memory decks 504, 506, and 508 as well as pad-out interconnects of 3D memory device 500 can be included as part of 3D memory device 500, along with any suitable peripheral circuits for 3D memory device 500.

Figure 5B:
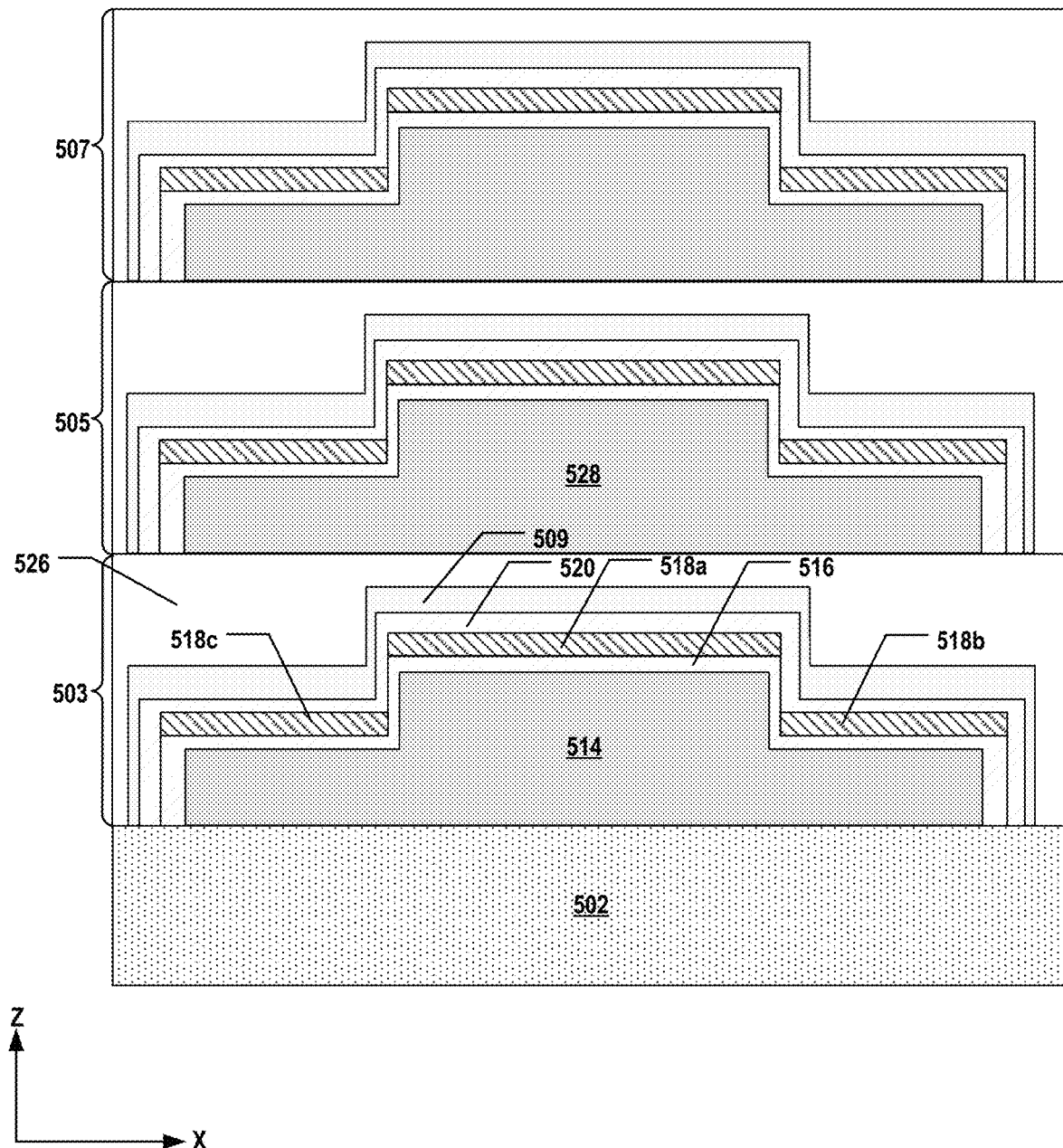
FIG. 5B illustrates a cross-section of another exemplary 3D memory device having multiple memory decks, according to some embodiments of the present disclosure.

FIG. 5B illustrates a cross-section of another exemplary 3D memory device 501 having multiple memory decks 503, 505, and 507, according to some embodiments of the present disclosure. 3D memory device 501 is similar to 3D memory device 500 in FIG. 5A except for the channel layer in each memory deck 503, 505, or 507. The structures, functions, and materials of the same components that have been described above with respect to 3D memory device 500 in FIG. 5A are not repeated for ease of description. Instead of having discrete channel layers (e.g., first, second, and third channel layers 522a, 522b, and 522c in 3D memory device 500), 3D memory device 501 includes a continuous channel layer 509 on tunneling layer 520. As shown in FIG. 5B, channel layer 509 in memory deck 503 is continuous and disposed along at least the top surface of tunneling layer 520, according to some embodiments. That is, channel layer 509 can be a continuous layer that covers tunneling layer 520 underneath. Channel layer 509 can provide charges, for example, electrons or holes, to first, second, and third charge trapping layer 518a, 518b, or 518c, tunneling through tunneling layer 520. Channel layer 509 can include silicon, such as amorphous silicon, polysilicon, or single-crystal silicon. In some embodiments, channel layer 509 includes polysilicon.

Due to the different design of the channel layer, each memory deck 503, 505, or 507 of 3D memory device 501 includes a single memory cell, as opposed to three memory cells (e.g., 524a, 524b, and 524c) in each memory deck 504, 506, or 508 of 3D memory device 500 in FIG. 5A. That is, each memory deck 503, 505, or 507 of 3D memory device 501 can have one memory cell that includes blocking layer 516, first, second, and third charge trapping layers 518a, 518b, and 518c, tunneling layer 520, and channel layer 509. The memory cell in each memory deck 504, 506, or 508 of 3D memory device 501 can be controlled by a respective gate electrode (e.g., 514 or 528). Separated by inter-deck dielectric layers (e.g., 526), each gate electrode (e.g., 514 or 528) of 3D memory device 501 can be individually addressed to control the respective memory cell disposed thereon. It is understood that any other memory decks disclosed herein, such as the memory decks of 3D memory devices 300 and 400 in FIGS. 3 and 4, may be stacked above substrate 502 in the same manner as described above with respect to FIGS. 5A and 5B (with inter-deck dielectric layers, e.g., 526).

Figure 6A:
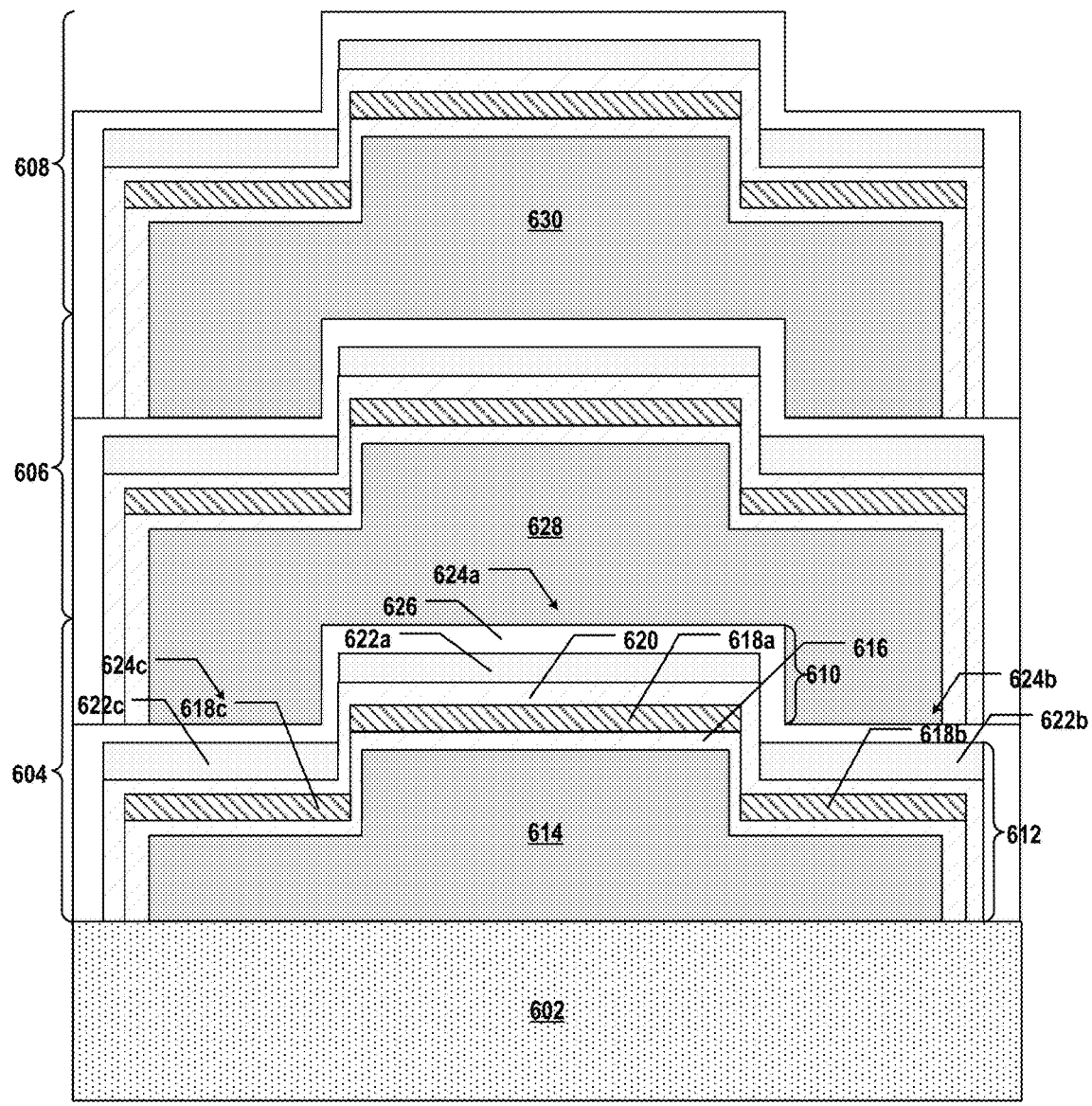
FIG. 6A illustrates a cross-section of still another exemplary 3D memory device having multiple memory decks, according to some embodiments of the present disclosure.

FIG. 6A illustrates a cross-section of still another exemplary 3D memory device 600 having multiple memory decks, according to some embodiments of the present disclosure. 3D memory device 600 can include a plurality of memory decks 604, 606, and 608 stacked above a substrate 602 to increase the memory density without occupying more chip area. Two adjacent memory decks (e.g., 604 and 606) can be separated (e.g., insulated) by an inter-deck dielectric layer (e.g., 626). Each memory deck 604, 606, or 608 is substantially similar to the single memory deck in 3D memory device 100 in FIG. 1 (with the additional inter-deck dielectric layer). Thus, the components of each memory deck 604, 606, or 608 are substantially similar to their counterparts in 3D memory device 100 in FIG. 1 and thus, are not be repeated in detail herein As illustrated in FIG. 6A, bottom memory deck 604 of 3D memory device 600 is the memory deck immediately above substrate 602. Bottom memory deck 604 can include a bottom gate electrode 614, a blocking layer 616 on bottom gate electrode 614, a plurality of charge trapping layers 618a, 618b, and 618c on blocking layer 616, a tunneling layer 620 on charge trapping layers 618a, 618b, and 618c, and a plurality of channel layers 622a, 622b, and 622c on tunneling layer 620. Bottom gate electrode 614 can have an inverted "T" shape, which includes a head at a first level 610 and two shoulders at a second level 612 below first level 610. Charge trapping layers 618a, 618b, and 618c are discrete and disposed at different levels 610 and 612, according to some embodiments. In some embodiments, first charge trapping layer 618a is disposed laterally between second and third charge trapping layers 618b and 618c. In some embodiments, second and third charge trapping layers 618b and 618c are disposed at same second level 612 that is below first level 610 at which first charge trapping layer 618a is disposed. For example, second and third charge trapping layers 618b and 618c may be disposed corresponding to the two shoulders of the inverted "T" shape of bottom gate electrode 614, respectively, and first charge trapping layer 618a is disposed corresponding to the head of the inverted "T" shape of bottom gate electrode 614. Similarly, channel layers 622a, 622b, and 622c are discrete and disposed at different levels 610 and 612, according to some embodiments. Each channel layer 622a, 622b, or 622c can correspond to respective one of charge trapping layers 618a, 618b, and 618c. In some embodiments, first channel layer 622a is disposed laterally between second and third channel layers 622b and 622c. In some embodiments, second and third channel layers 622b and 622c are disposed at same second level 612 that is below first level 610 at which first channel layer 622a is disposed. For example, second and third channel layers 622b and 622c may be disposed corresponding to the two shoulders of the inverted "T" shape of bottom gate electrode 614, respectively, and first channel layer 622a is disposed corresponding to the head of the inverted "T" shape of bottom gate electrode 614.

In some embodiments, blocking layer 616 is continuous and disposed along at least the top surface of bottom gate electrode 614. In some embodiments, tunneling layer 620 is continuous and disposed along at least the top surfaces of each charge trapping layer 618a, 618b, or 618c. Blocking layer 616 includes silicon oxide, each charge trapping layer 618a, 618b, or 618c includes silicon nitride, and tunneling layer 620 includes silicon oxide, according to some embodiments. In some embodiments, each channel layer 622a, 622b, or 622c includes polysilicon. Bottom memory deck 604 of 3D memory device 600 can include a first memory cell 624a, a second memory cell 624b, and a third memory cell 624c. In some embodiments, first, second, and third memory cells 624a, 624b, and 624c include first, second, and third charge trapping layers 618a, 618b, and 618c, respectively. In some embodiments, first, second, and third memory cells 624a, 624b, and 624c include first, second, and third channel layers 622a, 622b, and 622c, respectively. In some embodiments, each of first, second, and third memory cells 624a, 624b, and 624c includes a respective part of blocking layer 616 and a respective part of tunneling layer 620.

As illustrated in FIG. 6A, memory deck 604 can further include inter-deck dielectric layer 626 on channel layers 622a, 622b, and 622c. Different from inter-deck dielectric layer 526 with a nominally flat top surface, in some embodiments, the top surface of inter-deck dielectric layer 626 fits the top surface of bottom gate electrode 614. For example, the top surface of inter-deck dielectric layer 626 may have the profile that matches the profile of the top surface of bottom gate electrode 614. A gate electrode 628 of memory deck 606 immediately above bottom memory deck 604 is disposed on the top surface of inter-deck dielectric layer 626, according to some embodiments. In some embodiments, the bottom surface of bottom gate electrode 614 is nominally flat, and the bottom surface of each gate electrode 628 or 630 of other memory decks 606 and 608 (i.e., other than bottom memory deck 604) fits the top surface of respective gate electrode 628 or 630. For example, the bottom surface of bottom gate electrode 614 may be nominally parallel to the lateral surface of substrate 602 as well, and the bottom surface of each other gate electrode 628 or 630 may have the profile that matches the profile of the top surface of respective gate electrode 628 or 630. In some embodiments, the bottom surface of gate electrode 628 or 630 has a concave shape, and the top surface of gate electrode 628 or 630 has a convex shape. Inter-deck dielectric layer 626 can be a single dielectric layer or a composite dielectric layer having multiple sub-dielectric layers. In some embodiments, inter-dielectric layer 626 includes silicon oxide, silicon nitride, silicon oxynitride, or any combinations thereof.

It is understood that memory decks 606 and 608 are substantially similar to memory deck 604 except for the shape of the gate electrodes as described above. Thus, the components of memory decks 606 and 608 are not repeated herein for ease of description. Separated by inter-deck dielectric layers (e.g., 626), each gate electrode 614, 628, or 630 of 3D memory device 600 can be individually addressed to control the respective memory cells disposed thereon. It is also understood that the number of memory decks stacked above substrate 602 is not limited to the example described with respect to FIG. 6A and can be any positive integer greater than one. It is further understood that any suitable interconnects between memory decks 604, 606, and 608 for electrically connecting memory decks 604, 606, and 608 as well as pad-out interconnects of 3D memory device 600 can be included as part of 3D memory device 600, along with any suitable peripheral circuits for 3D memory device 600.

Figure 6B:
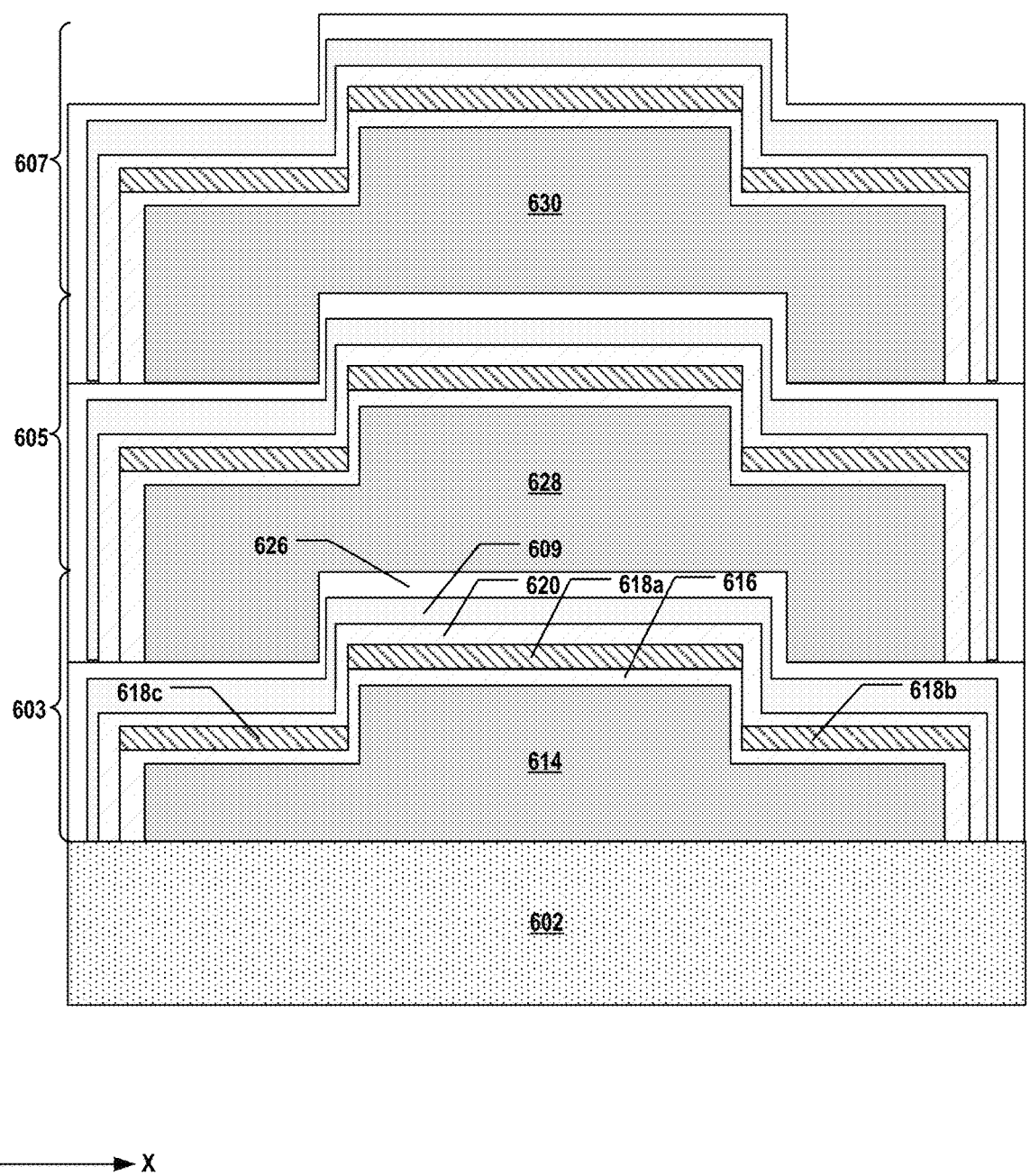
FIG. 6B illustrates a cross-section of yet another exemplary 3D memory device having multiple memory decks, according to some embodiments of the present disclosure.

FIG. 6B illustrates a cross-section of yet another exemplary 3D memory device 601 having multiple memory decks 603, 605, and 607, according to some embodiments of the present disclosure. 3D memory device 601 is similar to 3D memory device 600 in FIG. 6A except for the channel layer in each memory deck 603, 605, or 607. The structures, functions, and materials of the same components that have been described above with respect to 3D memory device 600 in FIG. 6A are not repeated for ease of description. Instead of having discrete channel layers (e.g., first, second, and third channel layers 622a, 622b, and 622c in 3D memory device 600), 3D memory device 601 includes a continuous channel layer 609 on tunneling layer 620. As shown in FIG. 6B, channel layer 609 in memory deck 603 is continuous and disposed along at least the top surface of tunneling layer 620, according to some embodiments. That is, channel layer 609 can be a continuous layer that covers tunneling layer 620 underneath. Channel layer 609 can provide charges, for example, electrons or holes, to first, second, and third charge trapping layer 618a, 618b, or 618c, tunneling through tunneling layer 620. Channel layer 609 can include silicon, such as amorphous silicon, polysilicon, or single-crystal silicon. In some embodiments, channel layer 609 includes polysilicon.

Due to the different design of the channel layer, each memory deck 603, 605, or 607 of 3D memory device 601 includes a single memory cell, as opposed to three memory cells (e.g., 624a, 624b, and 624c) in each memory deck 604, 606, or 608 of 3D memory device 600 in FIG. 6A. That is, each memory deck 603, 605, or 607 of 3D memory device 601 can have one memory cell that includes blocking layer 616, first, second, and third charge trapping layers 618a, 618b, and 618c, tunneling layer 620, and channel layer 609. The memory cell in each memory deck 603, 605, or 607 of 3D memory device 601 can be controlled by respective gate electrode 614, 628, or 630. Separated by inter-deck dielectric layers (e.g., 626), each gate electrode 614, 628, or 630 of 3D memory device 601 can be individually addressed to control the respective memory cell disposed thereon. It is understood that any other memory decks disclosed herein, such as the memory decks of 3D memory devices 300 and 400 in FIGS. 3 and 4, may be stacked above substrate 602 in the same manner as described above with respect to FIGS. 6A and 6B (with inter-deck dielectric layers, e.g., 626).

Still another way to scale-up the memory cells in the 3D memory devices disclosed herein is to have multiple memory films along the y-direction (perpendicular to the cross-sections in FIGS. 1-4, 5A, 5B, 6A, and 6B) and/or have multiple gate electrodes in the same plane along the x-direction. FIG. 7 illustrates a plan view of an exemplary 3D memory device 700 having multiple gate electrodes, according to some embodiments of the present disclosure. 3D memory device 700 can include a plurality of gate electrodes 701 and 703 in the same plane above a substrate 702. It is understood that more than two gate electrodes 701 and 703 may be included along the x-direction. Each gate electrode 701 it 703 can be individually addressed to control the memory cells formed thereon.

In some embodiments, a plurality of memory films are disposed on each gate electrode 701 or 703. As described above, a memory film can correspond to one or three memory cells depending on whether the channel layer is a continuous layer or three discrete layers. For example, a plurality of memory films 706a, 706b, 706c, 706d, 706e, 706f, and 706g may be disposed on gate electrode 701, and each memory film 706a, 706b, 706c, 706d, 706e, 706f, or 706g may correspond to three memory cells. It is understood that the example of FIG. 7 may be combined with the examples of FIGS. 5A, 5B, 6A, and 6B, such that the number of memory cells can be scaled-up in multiple dimensions. For example, each gate electrode 701 or 703 in FIG. 7 can further have multiple memory decks stacked above substrate 702 as described above in detail with respect to FIGS. 5A, 5B, 6A, and 6B.

Figure 12:
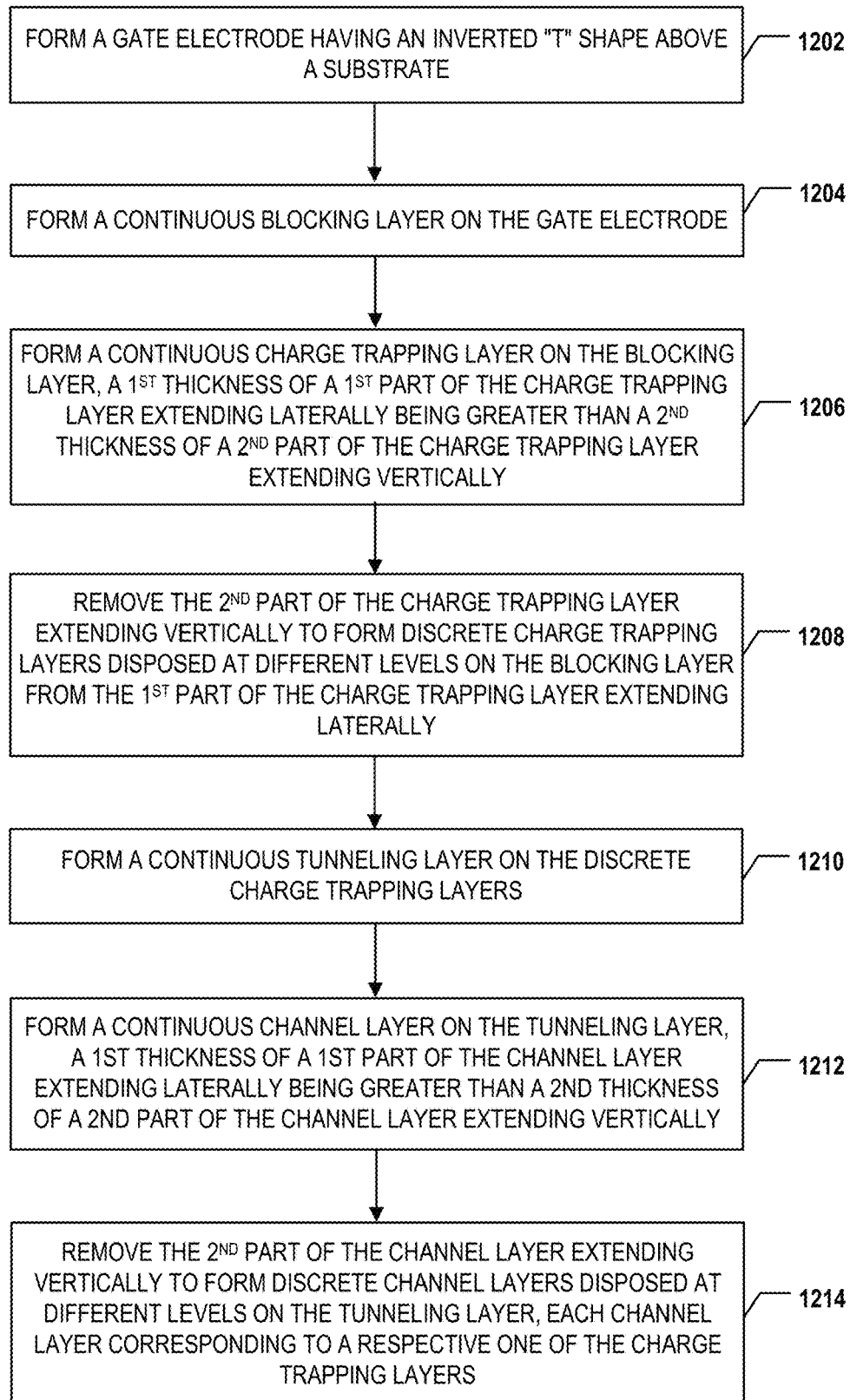
FIG. 12 is a flowchart of an exemplary method for forming a 3D memory device having a single memory deck, according to some embodiments.

FIGS. 8A-8H illustrate an exemplary fabrication process for forming a 3D memory device having a single memory deck, according to some embodiments of the present disclosure. FIG. 12 is a flowchart of an exemplary method for forming a 3D memory device having a single memory deck, according to some embodiments. Examples of the 3D memory device depicted in FIGS. 8A-8H and 12 include 3D memory devices 100 and 200 depicted in FIGS. 1 and 2, respectively. FIGS. 8A-8H and 12 will be described together. It is understood that the operations shown in method 1200 are not exhaustive and that other operations can be performed as well before, after, or between any of the illustrated operations. Further, some of the operations may be performed simultaneously, or in a different order than shown in FIG. 12.

Referring to FIG. 12, method 1200 starts at operation 1202, in which a gate electrode having an inverted "T" shape is formed above a substrate. In some embodiments, to form the gate electrode, a gate electrode layer is deposited above the substrate, and the gate electrode layer is patterned to have the inverted "T" shape. In some embodiments, to form the gate electrode, a first gate electrode layer is formed above the substrate, and a second gate electrode layer is formed on the first gate electrode layer. A lateral dimension of the first gate electrode layer is greater than a lateral dimension of the second gate electrode layer, according to some embodiments. The substrate can be a silicon substrate.

Figure 8A:
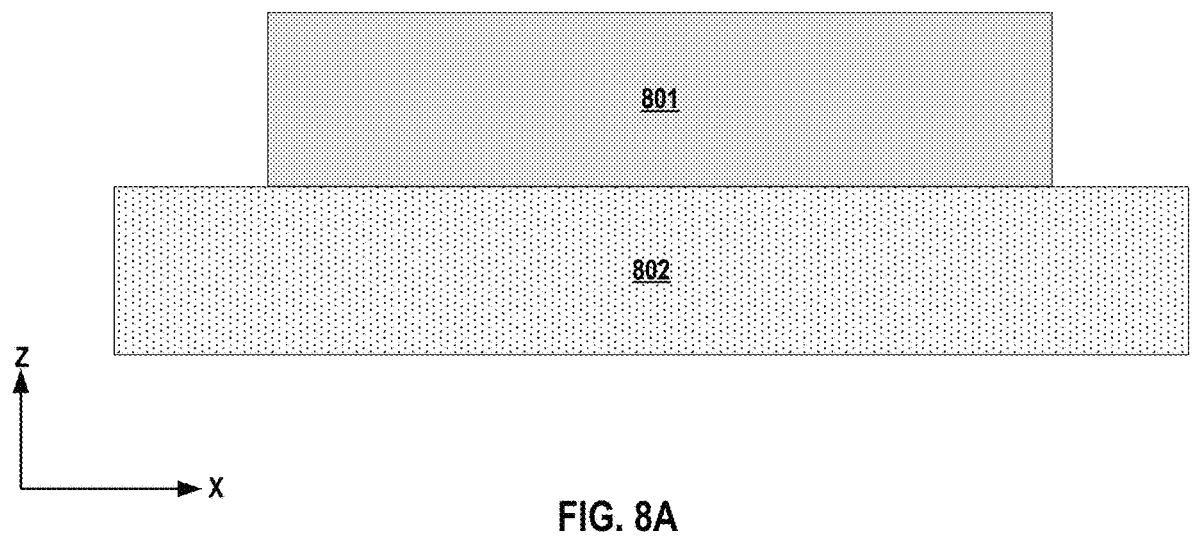
FIGS. 8A-8H illustrate an exemplary fabrication process for forming a 3D memory device having a single memory deck, according to some embodiments of the present disclosure.
Figure 8B:
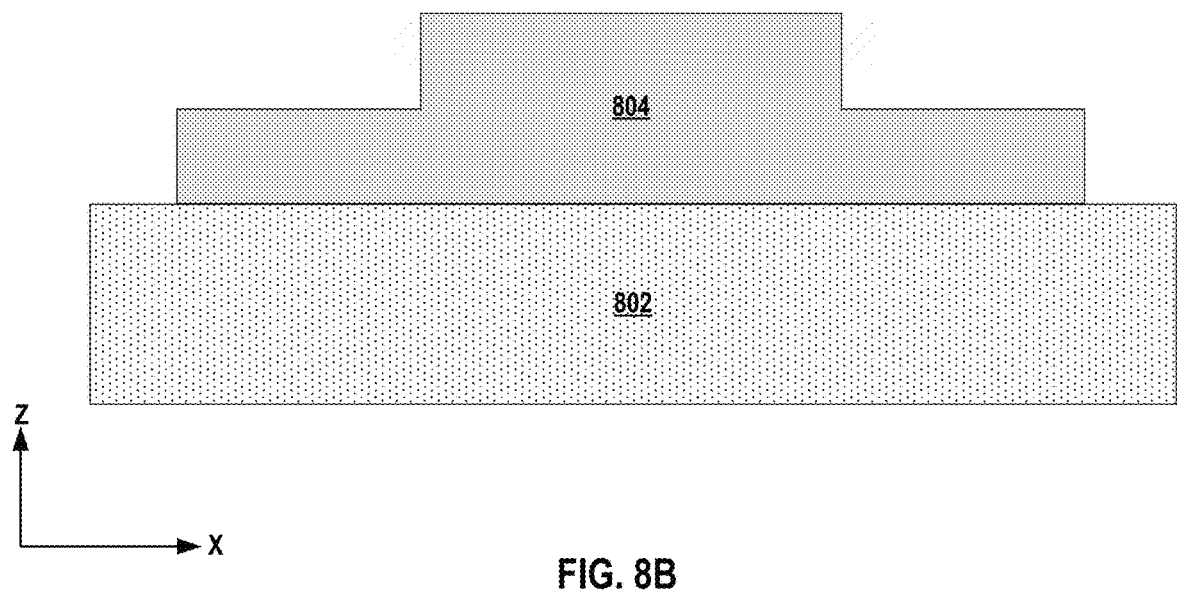

As illustrated in FIG. 8B, a gate electrode 804 having an inverted "T" shape is formed above a silicon substrate 802. To form the inverted "T" shaped gate electrode 804, as illustrated in FIG. 8A, a gate electrode layer 801 is first formed above silicon substrate 802. In some embodiments, a pad layer (not shown) is deposited on silicon substrate 802 first before the formation of gate electrode layer 801. Gate electrode layer 801 and the pad layer (if any) can be deposited by one or more deposition processes including, but not limited to, physical vapor deposition (PVD), chemical vapor deposition (CVD), atomic layer deposition (ALD), electroplating, electroless plating, or any combination thereof. In some embodiments, gate electrode layer 801 is further patterned to have the inverted "T" shape, i.e., becoming gate electrode 804 (as shown in FIG. 8B) by processes including photolithography, development, wet etching and/or drying etching, etc. For example, two dents at the edges of gate electrode layer 801 (in the x-direction) may be etched to form the inverted "T" shape of gate electrode 804. In some embodiments, instead of patterning gate electrode layer 801, another gate electrode layer (e.g., becoming the head of the inverted "T" shape of gate electrode 804 as shown in FIG. 8B) having a lateral dimension (in the x-direction) smaller than the lateral dimension of gate electrode layer 801 is further deposited on gate electrode layer 801 to form the inverted "T" shape of gate electrode 804. The other gate electrode layer can be deposited by one or more deposition processes including, but not limited to, PVD, CVD, ALD, electroplating, electroless plating, or any combination thereof.

Figure 8C:
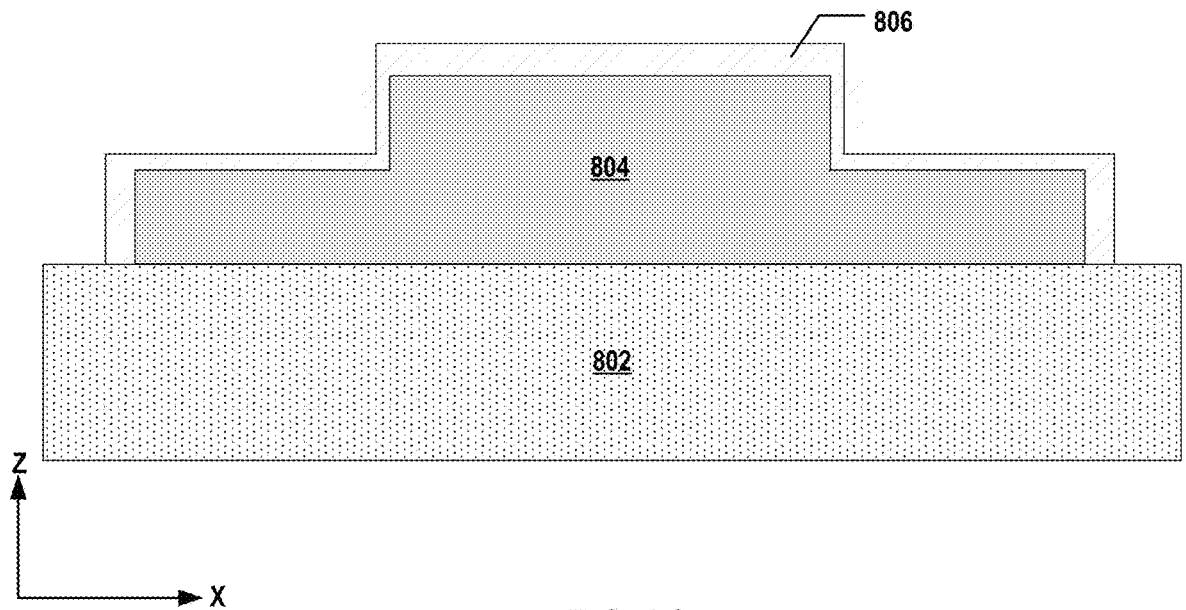

Method 1200 proceeds to operation 1204, as illustrated in FIG. 12, in which a continuous blocking layer is formed on the gate electrode. As illustrated in FIG. 8C, a continuous blocking layer 806 is formed on gate electrode 804. Blocking layer 806 can be deposited by one or more thin film deposition processes including, but not limited to, PVD, CVD, ALD, or any combination thereof. In some embodiments, blocking layer 806 is deposited on gate electrode 804 using ALD. In some embodiments, blocking layer 806 is formed by subsequently depositing a high-k dielectric layer, a first silicon oxide layer, a silicon oxynitride layer, and a second silicon oxide layer in this order on gate electrode 804 using ALD.

Method 1200 proceeds to operation 1206, as illustrated in FIG. 12, in which a continuous charge trapping layer is deposited on the blocking layer. A first thickness of a first part of the charge trapping layer extending laterally can be greater than a second thickness of a second part of the charge trapping layer extending vertically. In some embodiments, to form the continuous charge trapping layer, the charge trapping layer is deposited on the blocking layer using CVD, such as ALD.

Figure 8D:
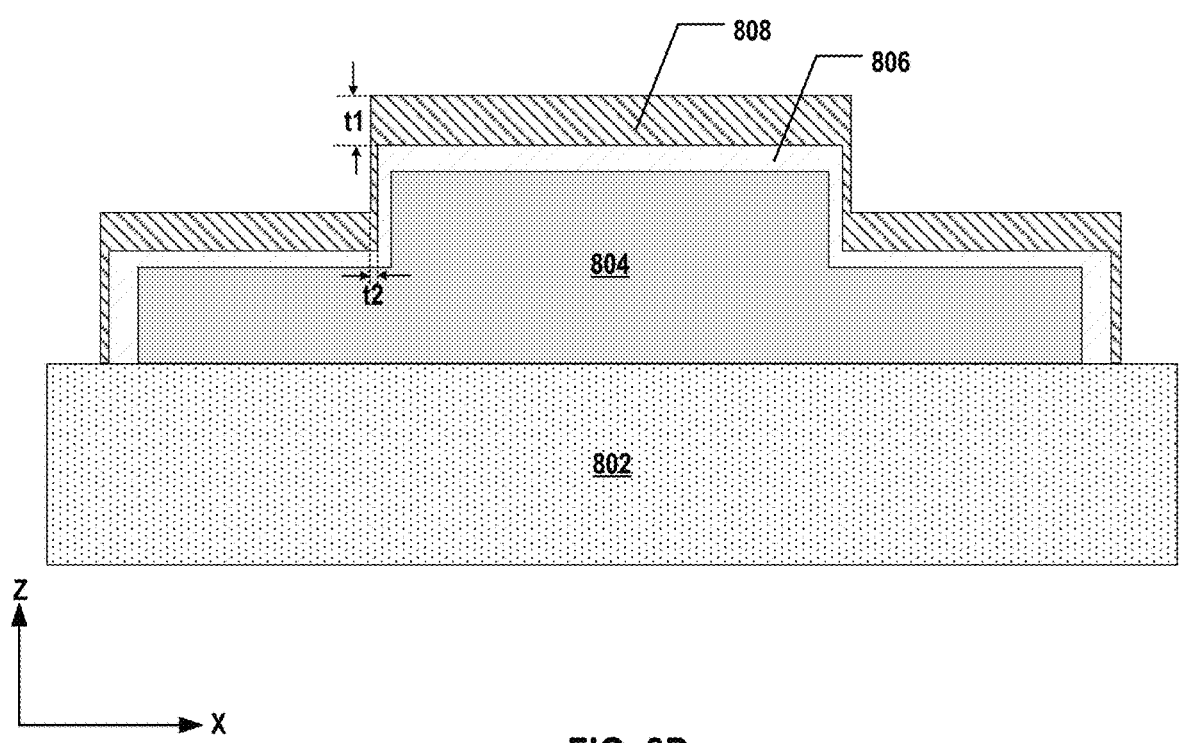

As illustrated in FIG. 8D, a continuous charge trapping layer 808 is formed on blocking layer 806. Charge trapping layer 808 can be deposited by one or more thin film deposition processes including, but not limited to, PVD, CVD, ALD, or any combination thereof. In some embodiments, charge trapping layer 808 is deposited on blocking layer 806 using CVD, such as ALD. In some embodiments, charge trapping layer 808 is formed by subsequently depositing a first silicon nitride layer, a first silicon oxynitride layer, a second silicon nitride layer, a second silicon oxynitride layer, and a third silicon nitride layer in this order on blocking layer 806 using ALD. Due to the uneven top surface of blocking layer 806, charge trapping layer 808 deposited thereon can be a nonuniform layer with a variation of thickness, in particular between the first part deposited on the upper sides of blocking layer 806 extending laterally and the second part deposited on the sidewalls of blocking layer 806 extending vertically. As shown in FIG. 8D, the first thickness t1 of the first part of charge trapping layer 808 extending laterally is greater than the second thickness t2 of the second part of charge trapping layer 808 extending vertically.

Method 1200 proceeds to operation 1208, as illustrated in FIG. 12, in which the second part of the charge trapping layer extending vertically is removed to form a plurality of discrete charge trapping layers disposed at different levels on the blocking layer from the first part of the charge trapping layer extending laterally. In some embodiments, to remove the second part of the charge trapping layer, the charge trapping layer is etched using wet etching until the second part of the charge trapping layer extending vertically is removed.

Figure 8E:
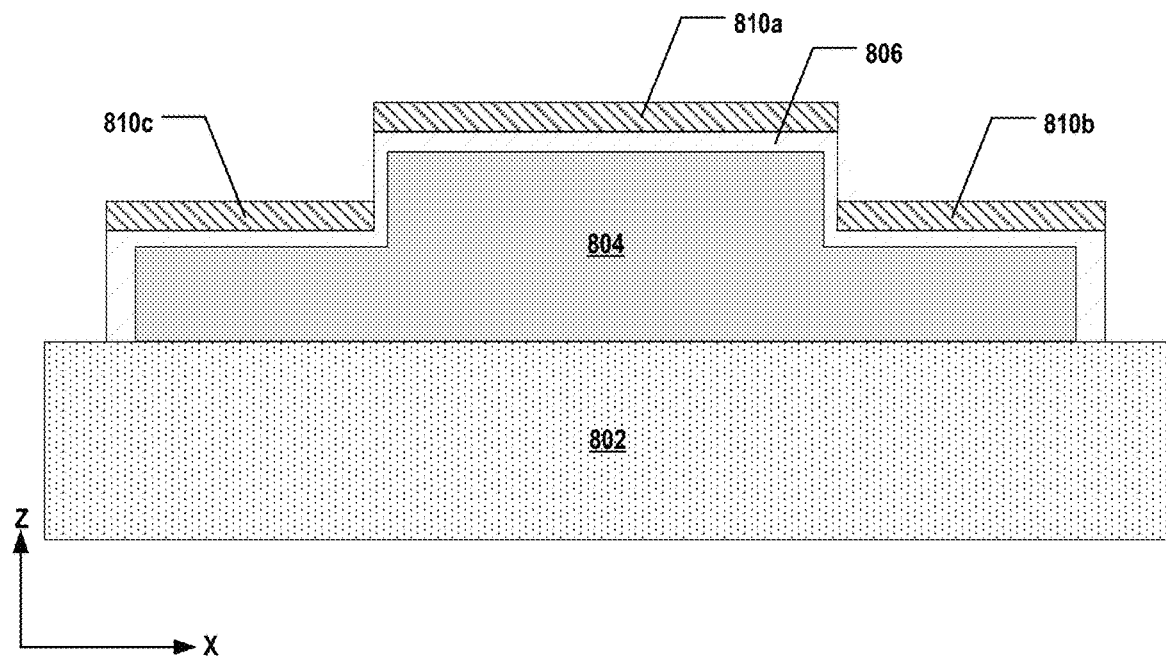

As illustrated in FIG. 8E, the second part of charge trapping layer 808 extending vertically (shown in FIG. 8D) is removed, for example, by wet etching using any suitable etchants. In some embodiments, charge trapping layer 808 is etched using wet etching until the second part of charge trapping layer 808 extending vertically is removed, for example, by controlling the etching time. Other etching conditions, such as etchant concentration, temperature, stirring, etc., can be adjusted accordingly to control the suitable stop timing of the wet etching. Due to the thickness difference between t1 and t2, the second part of charge trapping layer 808 extending vertically can be removed faster than the first part of charge trapping layer 808 extending laterally. As a result, by controlling the stop timing of wet etching, discrete charge trapping layers 810a, 810b, and 810c disposed at different levels on blocking layer 806 can be formed from the first part of charge trapping layer 808 extending laterally (e.g., with a reduced thickness due to the etching).

Figure 8F:
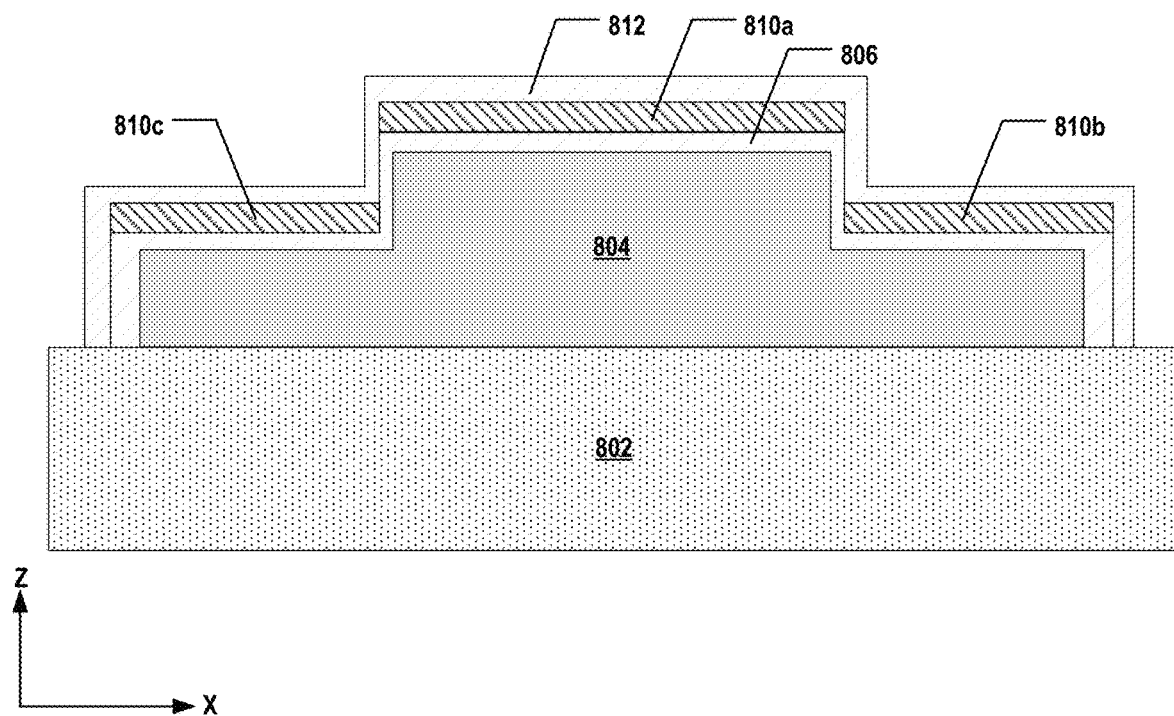

Method 1200 proceeds to operation 1210, as illustrated in FIG. 12, in which a continuous tunneling layer is formed on the discrete charge trapping layers. As illustrated in FIG. 8F, a continuous tunneling layer 812 is formed on charge trapping layers 810a, 810b, and 810c. Tunneling layer 812 can be deposited by one or more thin film deposition processes including, but not limited to, PVD, CVD, ALD, or any combination thereof. In some embodiments, tunneling layer 812 is deposited on charge trapping layers 810a, 810b, and 810c using ALD. In some embodiments, tunneling layer 812 is formed by subsequently depositing a first silicon oxide layer, a first silicon oxynitride layer, a second silicon oxynitride layer, a third silicon oxynitride layer, and a second silicon oxide layer in this order on charge trapping layers 810a, 810b, and 810c using ALD.

Figure 8G:
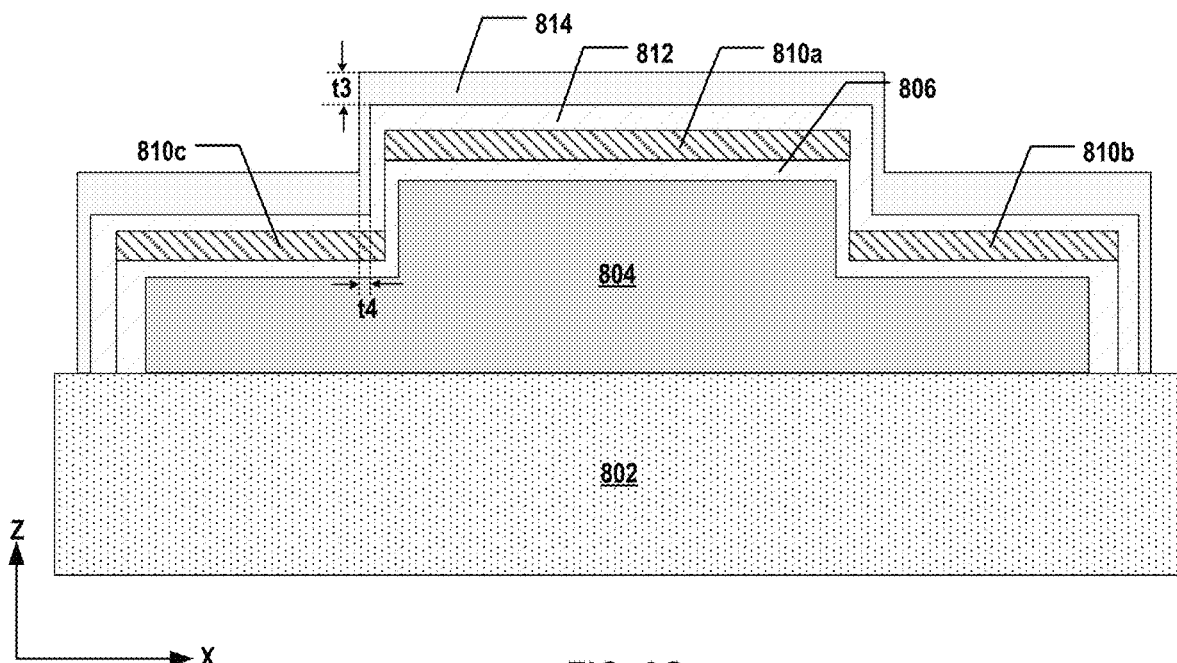

Method 1200 proceeds to operation 1212, as illustrated in FIG. 12, in which a continuous channel layer is formed on the tunneling layer. In some embodiments, to form the continuous channel layer, the channel layer is deposited on the tunneling layer using CVD, such as ALD. As illustrated in FIG. 8G, a continuous channel layer 814 is formed on tunneling layer 812. Channel layer 814 can be deposited by one or more thin film deposition processes including, but not limited to, PVD, CVD, ALD, or any combination thereof. In some embodiments, channel layer 814 is deposited on tunneling layer 812 using ALD.

Similar to the charge trapping layer, a first thickness of a first part of the channel layer extending laterally is greater than a second thickness of a second part of channel layer extending vertically, according to some embodiments. It is understood that in some embodiments, method 1200 may proceed to operation 1214, as illustrated in FIG. 12, in which the second part of the channel layer extending vertically may be removed to form a plurality of discrete channel layers disposed at different levels on the tunneling layer. Each of the channel layers may correspond to a respective one of the charge trapping layers. In some embodiments, to remove the second part of the channel layer, the channel layer is etched using wet etching until the second part of the channel layer extending vertically is removed.

As illustrated in FIG. 8G, due to the uneven top surface of tunneling layer 812, channel layer 814 deposited thereon can be a nonuniform layer with a variation of thickness, in particular between the first part deposited on the upper sides of tunneling layer 812 extending laterally and the second part deposited on the sidewalls of tunneling layer 812 extending vertically. As shown in FIG. 8G, the first thickness t3 of the first part of channel layer 814 extending laterally is greater than the second thickness t4 of the second part of channel layer 814 extending vertically.

Figure 8H:
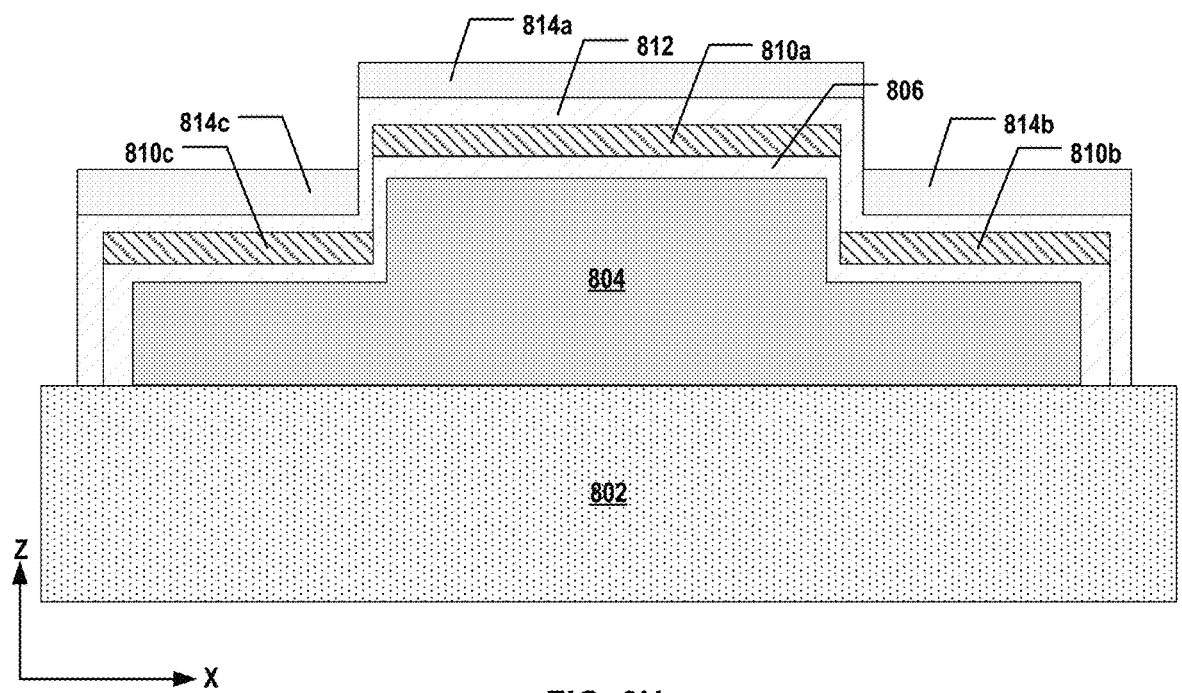

As illustrated in FIG. 8H, the second part of channel layer 814 extending vertically (shown in FIG. 8G) is removed, for example, by wet etching using any suitable etchants. In some embodiments, channel layer 814 is etched using wet etching until the second part of channel layer 814 extending vertically is removed, for example, by controlling the etching time. Other etching conditions, such as etchant concentration, temperature, stirring, etc., can be adjusted accordingly to control the suitable stop timing of the wet etching. Due to the thickness difference between t3 and t4, the second part of channel layer 814 extending vertically can be removed faster than the first part of channel layer 814 extending laterally. As a result, by controlling the stop timing of wet etching, discrete channel layers 814a, 814b, and 814c disposed at different levels on tunneling layer 812 can be formed from the first part of channel layer 814 extending laterally (e.g., with a reduced thickness due to the etching). Each discrete channel layer 814a, 814b, or 814c can correspond to respective discrete charge trapping layer 810a, 810b, or 810c.

Figure 13:
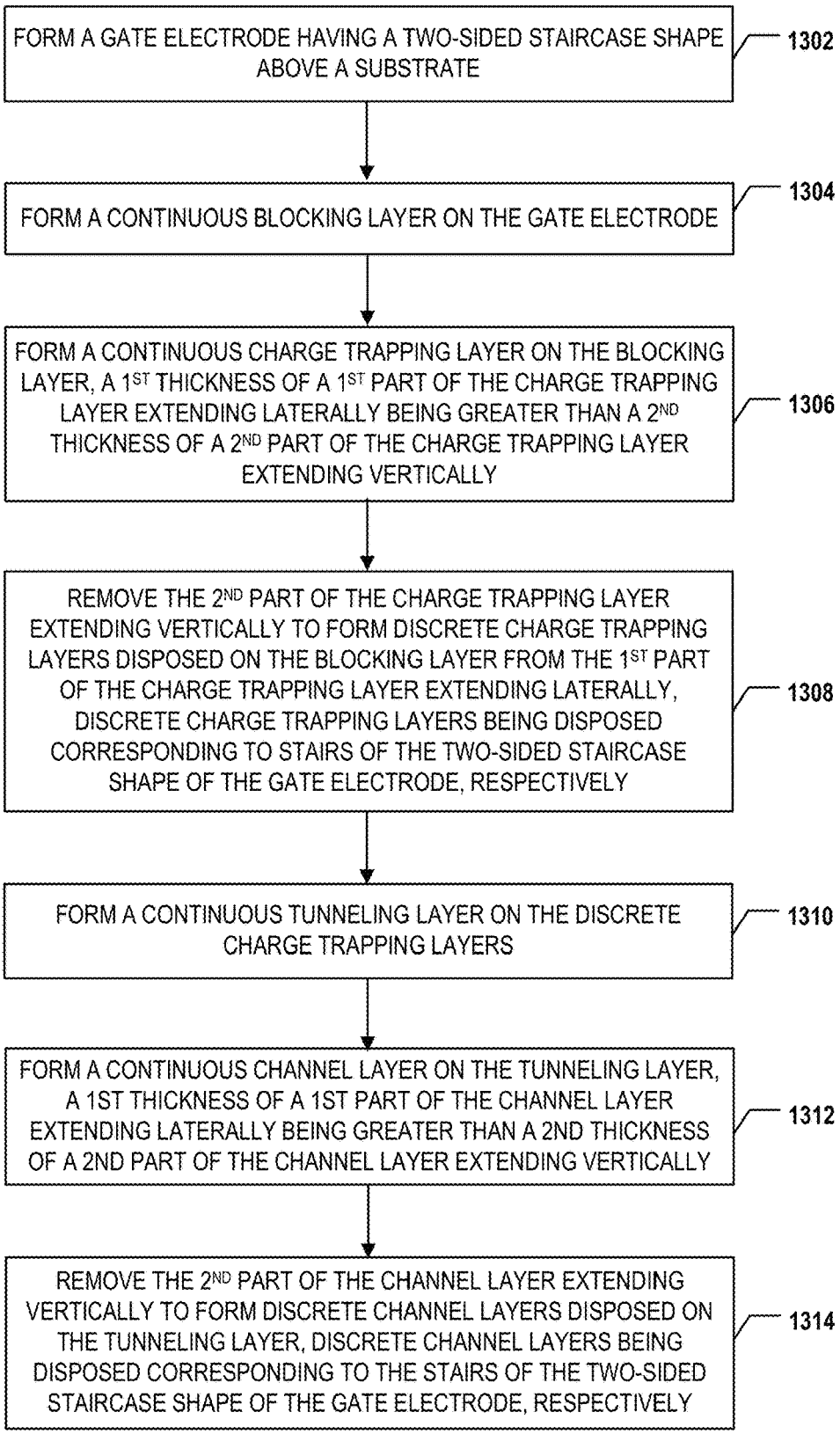
FIG. 13 is a flowchart of another exemplary method for forming a 3D memory device having a single memory deck, according to some embodiments.

FIGS. 9A-9G illustrate an exemplary fabrication process for forming another 3D memory device having a single memory deck, according to some embodiments of the present disclosure. FIG. 13 is a flowchart of another exemplary method for forming a 3D memory device having a single memory deck, according to some embodiments. Examples of the 3D memory device depicted in FIGS. 9A-9G and 13 include 3D memory devices 300 and 400 depicted in FIGS. 3 and 4, respectively. FIGS. 9A-9G and 13 will be described together. It is understood that the operations shown in method 1300 are not exhaustive and that other operations can be performed as well before, after, or between any of the illustrated operations. Further, some of the operations may be performed simultaneously, or in a different order than shown in FIG. 13.

Referring to FIG. 13, method 1300 starts at operation 1302, in which a gate electrode having a two-sided staircase shape is formed above a substrate. In some embodiments, to form the gate electrode, a gate electrode layer is deposited above the substrate, a photoresist layer is coated on the gate electrode layer, and the gate electrode layer is patterned to have the two-sided staircase shape by a plurality of cycles of trimming the photoresist layer and etching the gate electrode layer. In some embodiments, to form the gate electrode, a plurality of gate electrode layers are subsequently deposited above the substrate. A lateral dimension of each of the gate electrode layers can be greater than a lateral dimension of the subsequently deposited gate electrode layer. The substrate can be a silicon substrate.

Figure 9A:
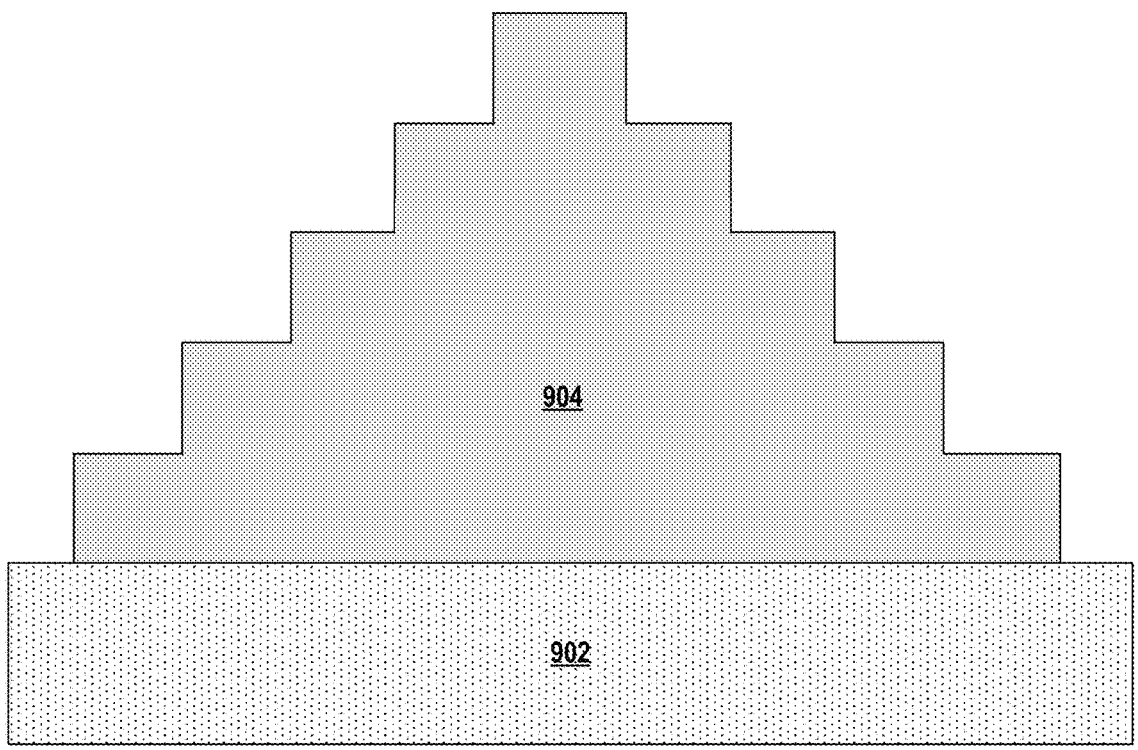
FIGS. 9A-9G illustrate an exemplary fabrication process for forming another 3D memory device having a single memory deck, according to some embodiments of the present disclosure.

As illustrated in FIG. 9A, a gate electrode 904 having a two-sided staircase shape is formed above a silicon substrate 902. To form the two-sided staircase-shaped gate electrode 904, a gate electrode layer (not shown) can be first formed above silicon substrate 902. In some embodiments, a pad layer (not shown) is deposited on silicon substrate 902 first before the formation of the gate electrode layer. The gate electrode and the pad layer (if any) can be deposited by one or more deposition processes including, but not limited to, PVD, CVD, ALD, electroplating, electroless plating, or any combination thereof. In some embodiments, a photoresist layer (not shown) can be coated on the gate electrode layer using spin coating, spray coating, etc. The two-sided staircase shape of gate electrode 904 then can be formed by the so-called "trim-etch" processes, which, in each cycle, trim (e.g., etching incrementally and inwardly, often from all directions) a patterned photoresist layer, followed by etching the exposed portions of the gate electrode layer using the trimmed photoresist layer as an etch mask to form a pair of stairs in one level of the two-sided staircase shape of gate electrode 904. That is, the gate electrode layer can be patterned to have the two-sided staircase shape by a plurality of cycles of trimming the photoresist layer and etching the gate electrode layer.

In some embodiments, instead of patterning a single gate electrode layer (with sufficient thickness) by the trim-etch processes, a plurality of gate electrode layers are subsequently deposited above silicon substrate 902. The lateral dimension (in the x-direction) of each of the gate electrode layers can be greater than the lateral dimension of the subsequently deposited gate electrode layer, such that deposited multiple gate electrode layers can become the two-sided staircase-shaped gate electrode 904. The gate electrode layers can be subsequently deposited by a plurality of deposition processes including, but not limited to, PVD, CVD, ALD, electroplating, electroless plating, or any combination thereof.

Figure 9B:
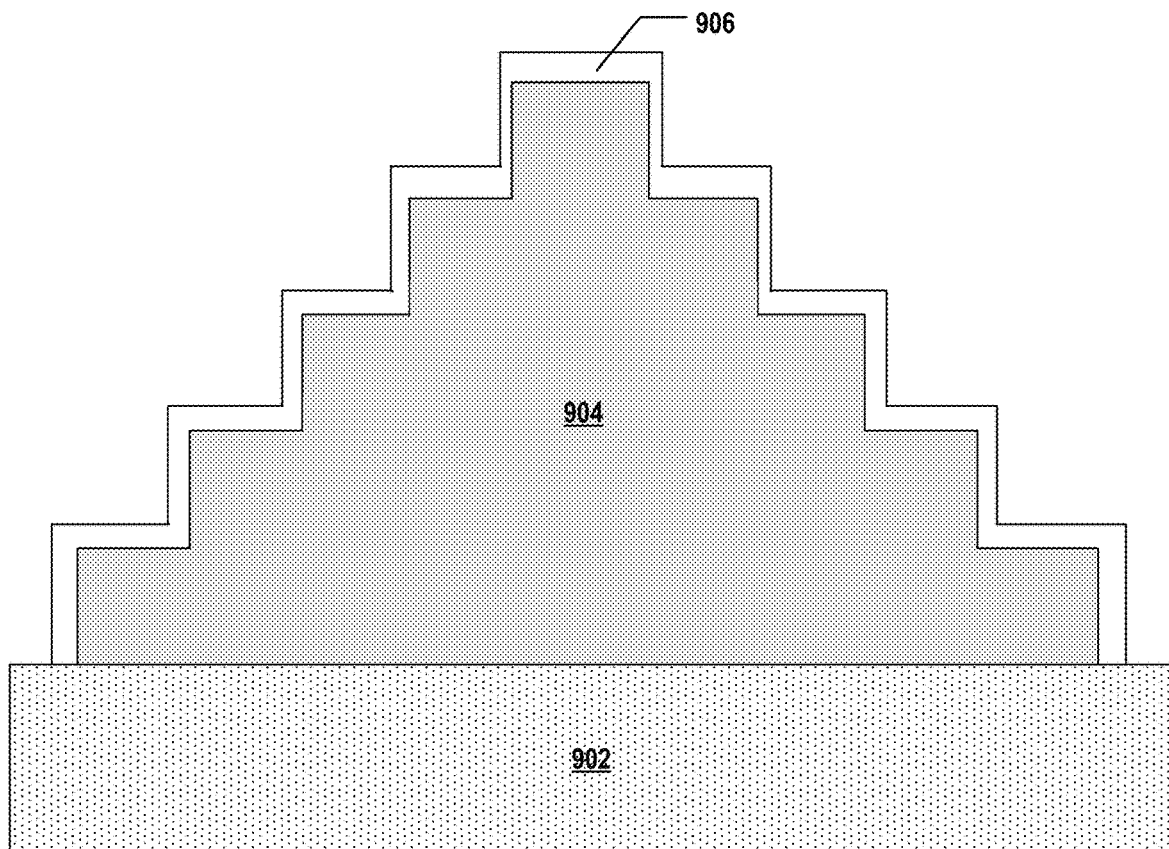

Method 1300 proceeds to operation 1304, as illustrated in FIG. 13, in which a continuous blocking layer is formed on the gate electrode. As illustrated in FIG. 9B, a continuous blocking layer 906 is formed on gate electrode 904. Blocking layer 906 can be deposited by one or more thin film deposition processes including, but not limited to, PVD, CVD, ALD, or any combination thereof. In some embodiments, blocking layer 906 is deposited on gate electrode 904 using ALD. In some embodiments, blocking layer 906 is formed by subsequently depositing a high-k dielectric layer, a first silicon oxide layer, a silicon oxynitride layer, and a second silicon oxide layer in this order on gate electrode 904 using ALD.

Method 1300 proceeds to operation 1306, as illustrated in FIG. 13, in which a continuous charge trapping layer is deposited on the blocking layer. A first thickness of a first part of the charge trapping layer extending laterally can be greater than a second thickness of a second part of the charge trapping layer extending vertically. In some embodiments, to form the continuous charge trapping layer, the charge trapping layer is deposited on the blocking layer using CVD, such as ALD.

Figure 9C:
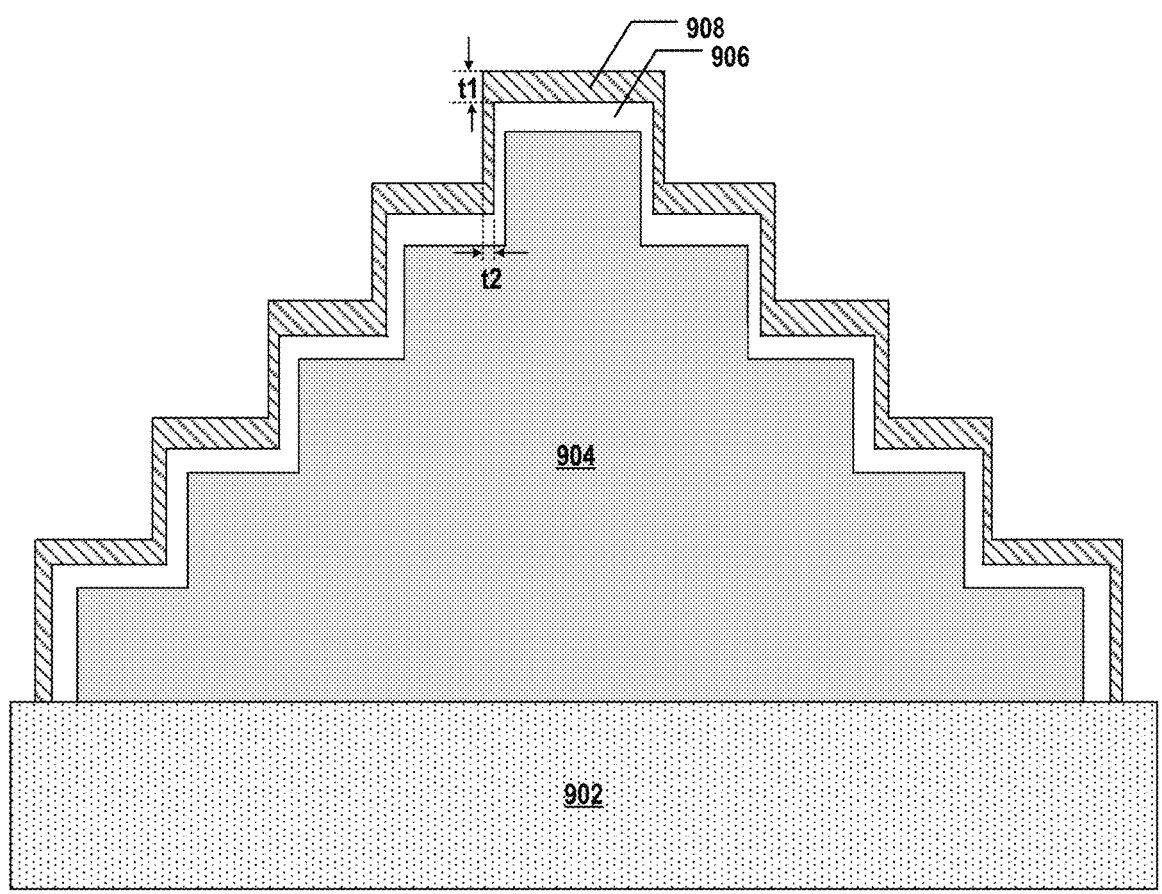

As illustrated in FIG. 9C, a continuous charge trapping layer 908 is formed on blocking layer 906. Charge trapping layer 908 can be deposited by one or more thin film deposition processes including, but not limited to, PVD, CVD, ALD, or any combination thereof. In some embodiments, charge trapping layer 908 is deposited on blocking layer 906 using CVD, such as ALD. In some embodiments, charge trapping layer 908 is formed by subsequently depositing a first silicon nitride layer, a first silicon oxynitride layer, a second silicon nitride layer, a second silicon oxynitride layer, and a third silicon nitride layer in this order on blocking layer 906 using ALD. Due to the uneven top surface of blocking layer 906, charge trapping layer 908 deposited thereon can be a nonuniform layer with a variation of thickness, in particular between the first part deposited on the upper sides of blocking layer 906 extending laterally and the second part deposited on the sidewalls of blocking layer 906 extending vertically. As shown in FIG. 9C, the first thickness t1 of the first part of charge trapping layer 908 extending laterally is greater than the second thickness t2 of the second part of charge trapping layer 908 extending vertically.

Method 1300 proceeds to operation 1308, as illustrated in FIG. 13, in which the second part of the charge trapping layer extending vertically is removed to form a plurality of discrete charge trapping layers disposed on the blocking layer from the first part of the charge trapping layer extending laterally. The plurality of discrete charge trapping layers can be formed corresponding to stairs of the two-sided staircase shape of the gate electrode, respectively. In some embodiments, to remove the second part of the charge trapping layer, the charge trapping layer is etched using wet etching until the second part of the charge trapping layer extending vertically is removed.

Figure 9D:
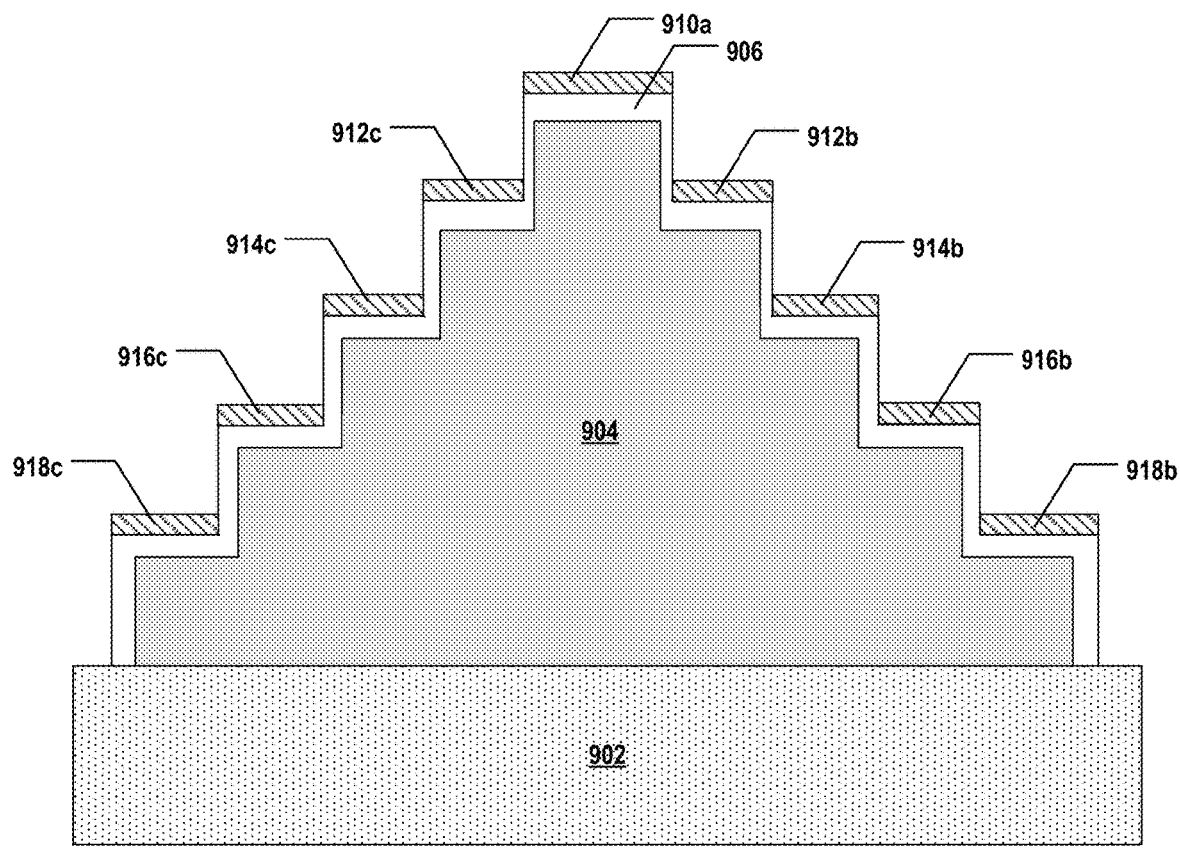

As illustrated in FIG. 9D, the second part of charge trapping layer 908 extending vertically (shown in FIG. 9C) is removed, for example, by wet etching using any suitable etchants. In some embodiments, charge trapping layer 908 is etched using wet etching until the second part of charge trapping layer 908 extending vertically is removed, for example, by controlling the etching time. Other etching conditions, such as etchant concentration, temperature, stirring, etc., can be adjusted accordingly to control the suitable stop timing of the wet etching. Due to the thickness difference between t1 and t2, the second part of charge trapping layer 908 extending vertically can be removed faster than the first part of charge trapping layer 908 extending laterally. As a result, by controlling the stop timing of wet etching, discrete charge trapping layers 910a, 912b, 912c, 914b, 914c, 916b, 916c, 918b, and 918c disposed at different levels on blocking layer 906 can be formed from the first part of charge trapping layer 908 extending laterally (e.g., with a reduced thickness due to the etching). Discrete charge trapping layer 910a, 912b, 912c, 914b, 914c, 916b, 916c, 918b, and 918c are formed corresponding to the stairs of the two-sided staircase shape of gate electrode 904, respectively, according to some embodiments.

Figure 9E:
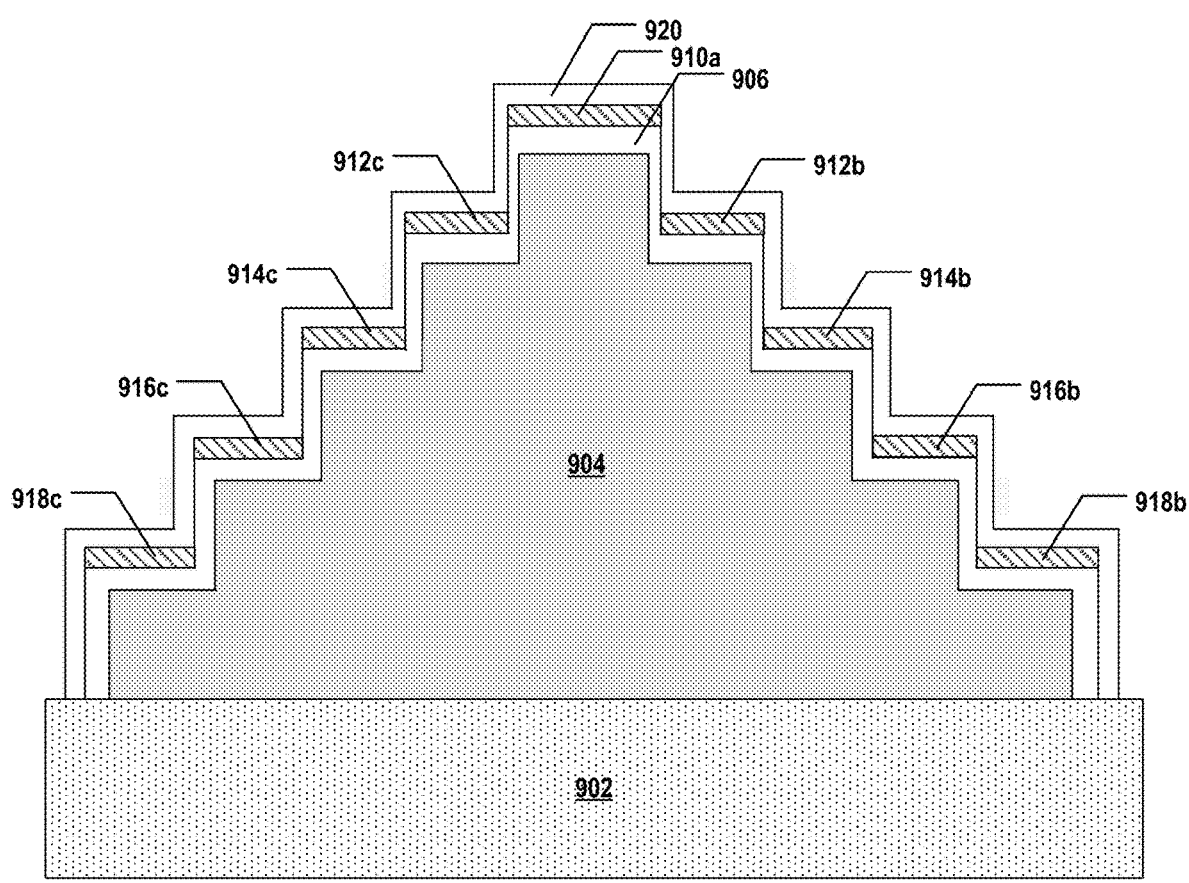
Figure 9E:

Method 1300 proceeds to operation 1310, as illustrated in FIG. 13, in which a continuous tunneling layer is formed on the discrete charge trapping layers. As illustrated in FIG. 9E, a continuous tunneling layer 920 is formed on charge trapping layers 910a, 912b, 912c, 914b, 914c, 916b, 916c, 918b, and 918c. Tunneling layer 920 can be deposited by one or more thin film deposition processes including, but not limited to, PVD, CVD, ALD, or any combination thereof. In some embodiments, tunneling layer 920 is deposited on charge trapping layers 910a, 912b, 912c, 914b, 914c, 916b, 916c, 918b, and 918c using ALD. In some embodiments, tunneling layer 920 is formed by subsequently depositing a first silicon oxide layer, a first silicon oxynitride layer, a second silicon oxynitride layer, a third silicon oxynitride layer, and a second silicon oxide layer in this order on charge trapping layers 910a, 912b, 912c, 914b, 914c, 916b, 916c, 918b, and 918c using ALD.

Figure 9F:
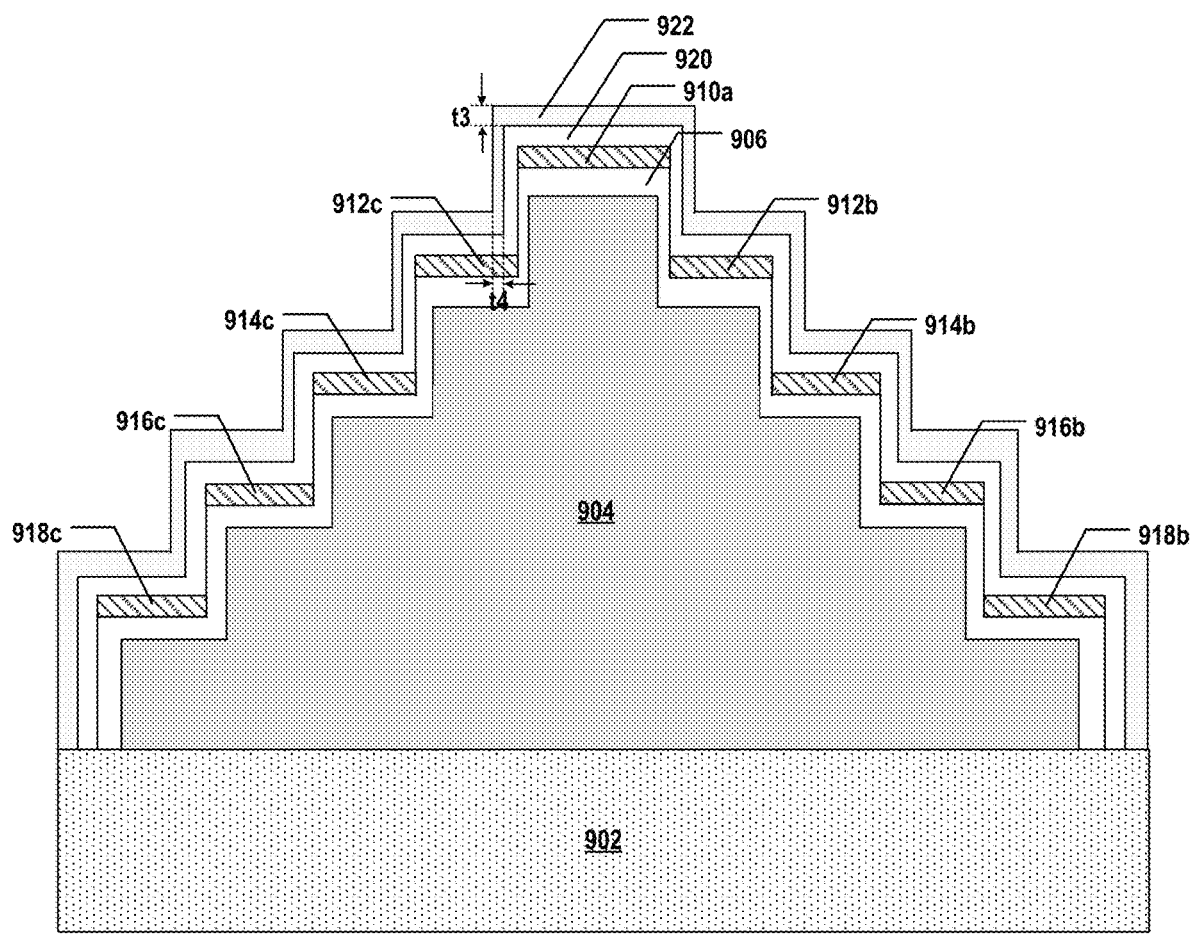

Method 1300 proceeds to operation 1312, as illustrated in FIG. 13, in which a continuous channel layer is formed on the tunneling layer. In some embodiments, to form the continuous channel layer, the channel layer is deposited on the tunneling layer using CVD, such as ALD. As illustrated in FIG. 9F, a continuous channel layer 922 is formed on tunneling layer 920. Channel layer 922 can be deposited by one or more thin film deposition processes including, but not limited to, PVD, CVD, ALD, or any combination thereof. In some embodiments, channel layer 922 is deposited on tunneling layer 920 using ALD.

Similar to the charge trapping layer, a first thickness of a first part of the channel layer extending laterally is greater than a second thickness of a second part of channel layer extending vertically, according to some embodiments. It is understood that in some embodiments, method 1300 may proceed to operation 1314, as illustrated in FIG. 13, in which the second part of the channel layer extending vertically may be removed to form a plurality of discrete channel layers disposed on the tunneling layer. The plurality of discrete channel layers can be formed corresponding to the stairs of the two-sided staircase shape of the gate electrode, respectively. In some embodiments, to remove the second part of the channel layer, the channel layer is etched using wet etching until the second part of the channel layer extending vertically is removed.

As illustrated in FIG. 9F, due to the uneven top surface of tunneling layer 920, channel layer 922 deposited thereon can be a nonuniform layer with a variation of thickness, in particular between the first part deposited on the upper sides of tunneling layer 920 extending laterally and the second part deposited on the sidewalls of tunneling layer 920 extending vertically. As shown in FIG. 9F, the first thickness t3 of the first part of channel layer 922 extending laterally is greater than the second thickness t4 of the second part of channel layer 922 extending vertically.

Figure 9G:
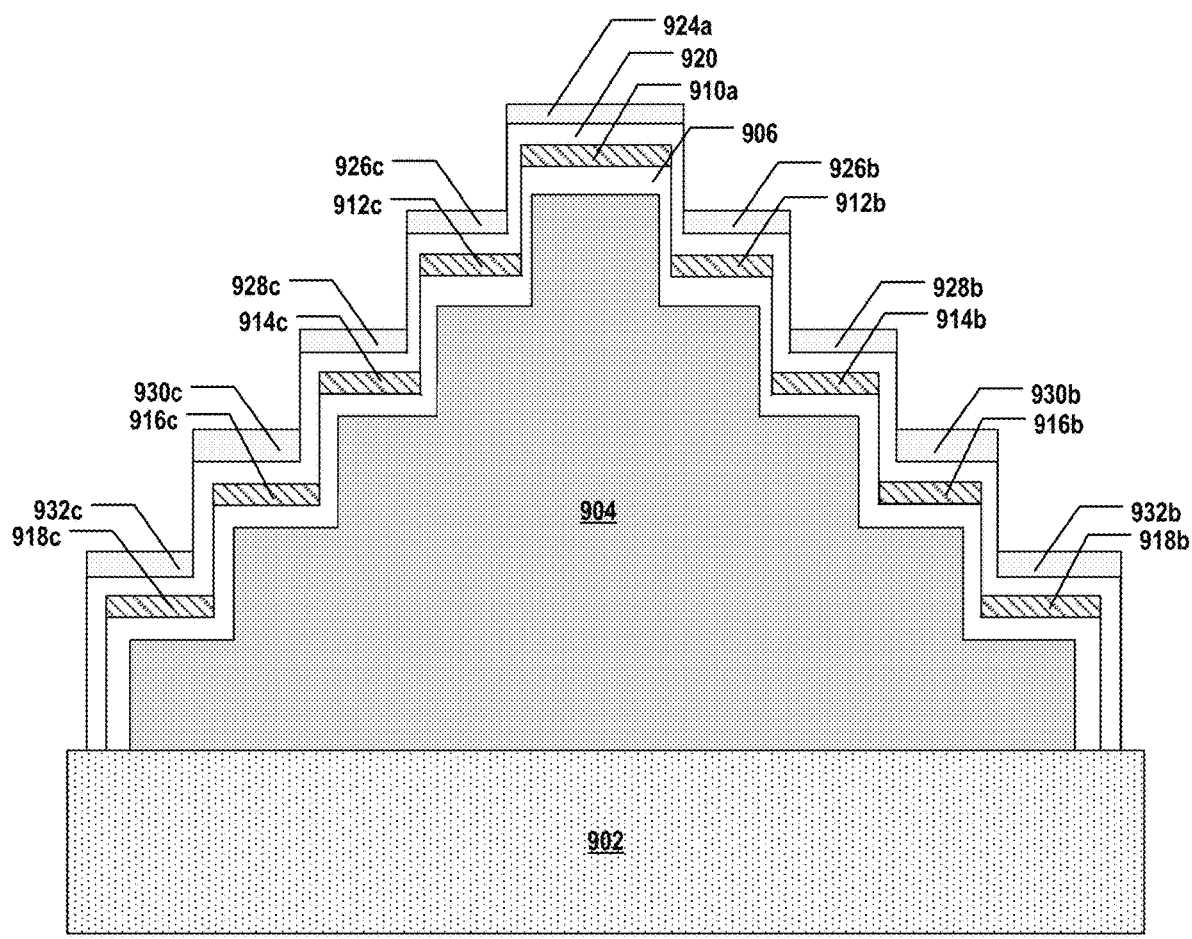

As illustrated in FIG. 9G, the second part of channel layer 922 extending vertically (shown in FIG. 9F) is removed, for example, by wet etching using any suitable etchants. In some embodiments, channel layer 922 is etched using wet etching until the second part of channel layer 922 extending vertically is removed, for example, by controlling the etching time. Other etching conditions, such as etchant concentration, temperature, stirring, etc., can be adjusted accordingly to control the suitable stop timing of the wet etching. Due to the thickness difference between t3 and t4, the second part of channel layer 922 extending vertically can be removed faster than the first part of channel layer 922 extending laterally. As a result, by controlling the stop timing of wet etching, discrete channel layers 924a, 926b, 926c, 928b, 928c, 930b, 930c, 932b, and 932c disposed at different levels on tunneling layer 920 can be formed from the first part of channel layer 922 extending laterally (e.g., with a reduced thickness due to the etching). Discrete channel layers 924a, 926b, 926c, 928b, 928c, 930b, 930c, 932b, and 932c are formed corresponding to the stairs of the two-sided staircase shape of gate electrode 904, respectively, according to some embodiments. Each discrete channel layer 924a, 926b, 926c, 928b, 928c, 930b, 930c, 932b, or 932c can also correspond to respective discrete charge trapping layer 910a, 912b, 912c, 914b, 914c, 916b, 916c, 918b, or 918c.

Figure 10A:
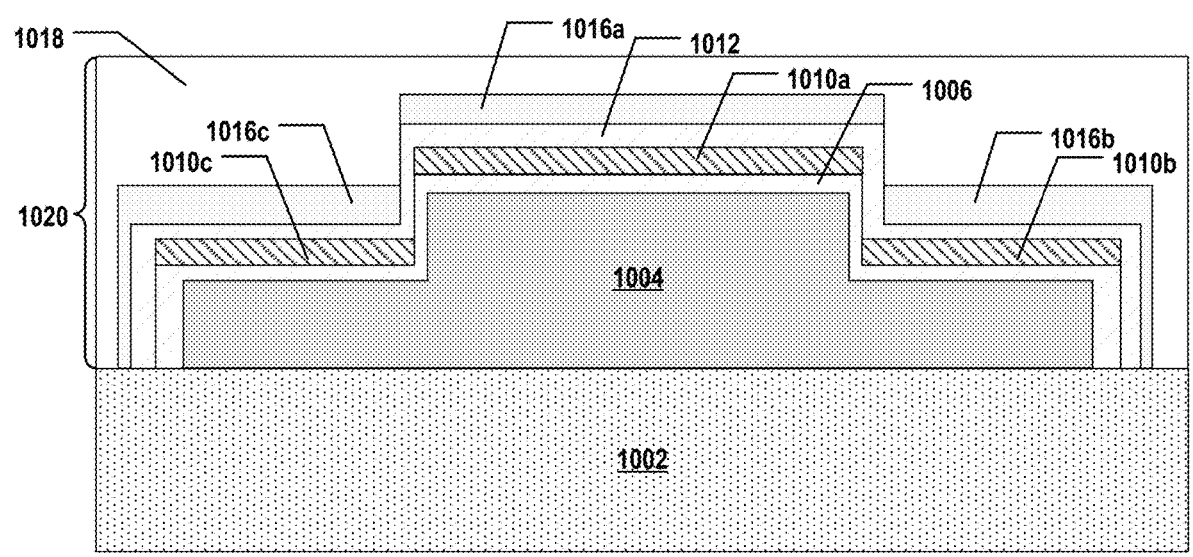
FIGS. 10A and 10B illustrate an exemplary fabrication process for forming a 3D memory device having multiple memory decks, according to some embodiments of the present disclosure.
Figure 10B:
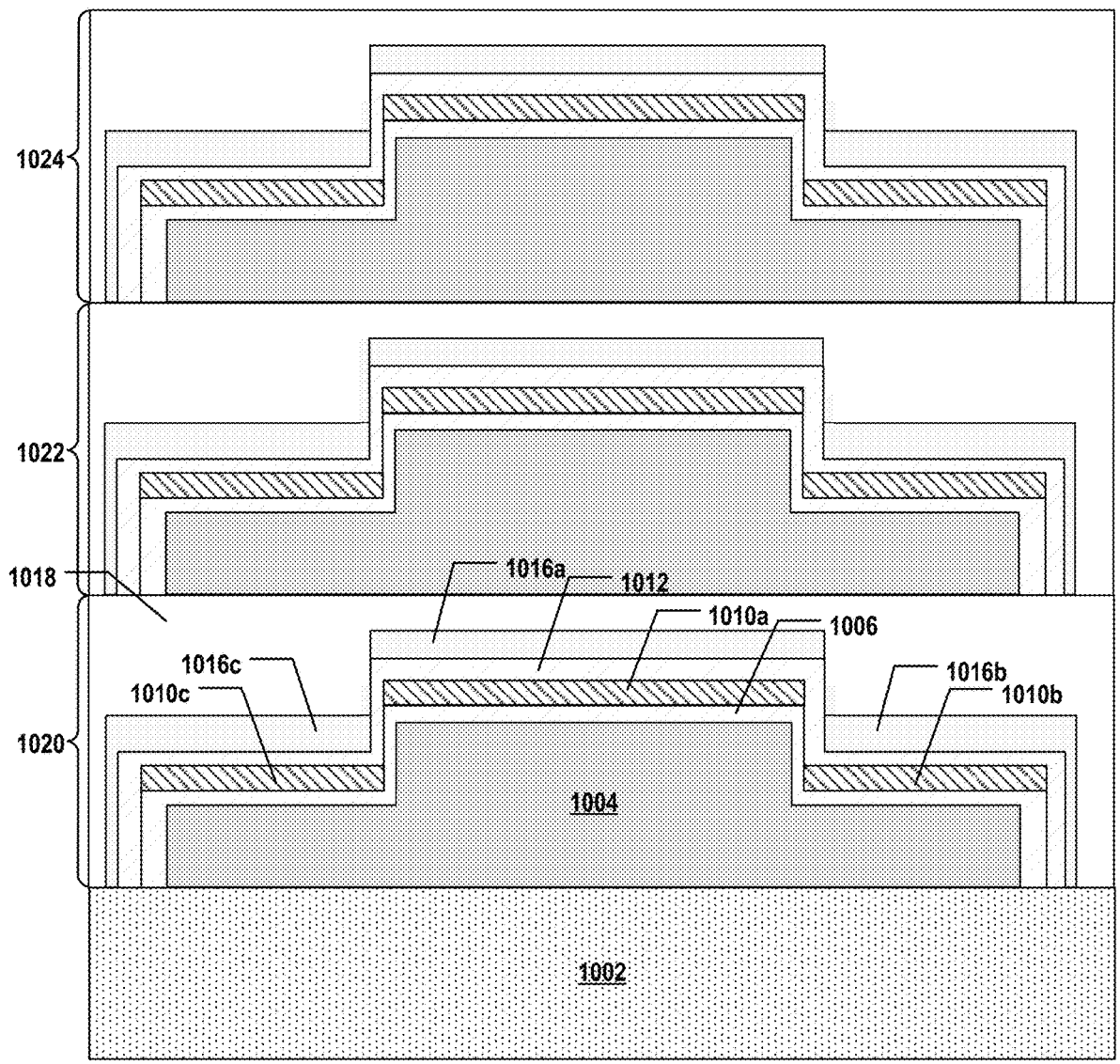
Figure 14:
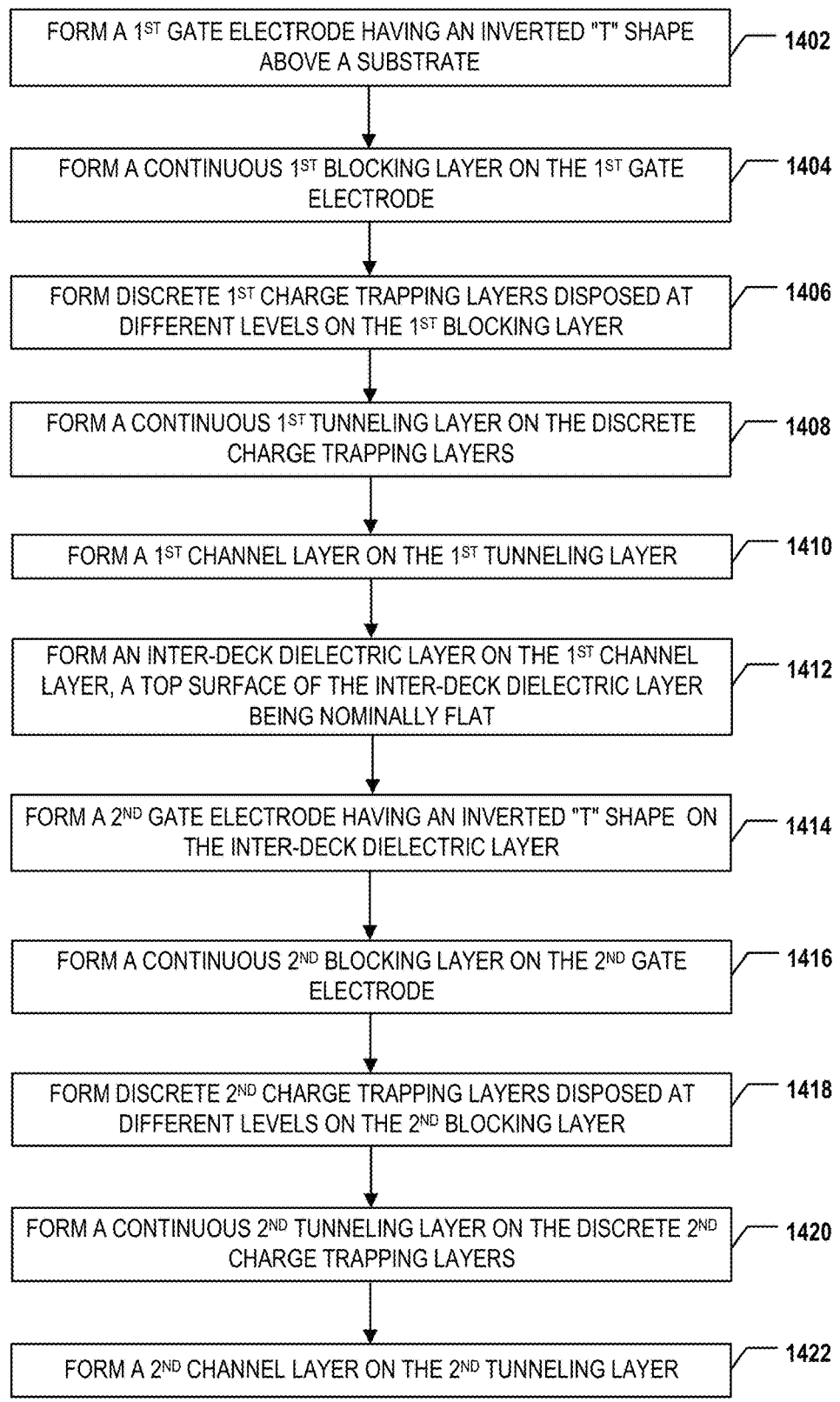
FIG. 14 is a flowchart of an exemplary method for forming a 3D memory device having multiple memory decks, according to some embodiments.

FIGS. 10A and 10B illustrate an exemplary fabrication process for forming a 3D memory device having multiple memory decks, according to some embodiments of the present disclosure. FIG. 14 is a flowchart of an exemplary method for forming a 3D memory device having multiple memory decks, according to some embodiments. Examples of the 3D memory device depicted in FIGS. 10A, 10B, and 14 include 3D memory device 500 depicted in FIG. 5A. FIGS. 10A, 10B, and 14 will be described together. It is understood that the operations shown in method 1400 are not exhaustive and that other operations can be performed as well before, after, or between any of the illustrated operations. Further, some of the operations may be performed simultaneously, or in a different order than shown in FIG. 14.

Referring to FIG. 14, method 1400 starts at operation 1402, in which a first gate electrode having an inverted "T" shape is formed above a substrate. In some embodiments, to form the first gate electrode, a gate electrode layer is deposited above the substrate, and the gate electrode layer is patterned to have the inverted "T" shape. In some embodiments, to form the first gate electrode, a lower gate electrode layer is deposited above the substrate, and an upper gate electrode layer is formed on the lower gate electrode layer. A lateral dimension of the lower gate electrode layer is greater than a lateral dimension of the upper gate electrode layer, according to some embodiments. The substrate can be a silicon substrate. As illustrated in FIG. 10A, a first gate electrode 1004 having an inverted "T" shape is formed above a silicon substrate 1002. The details of forming first gate electrode 1004 are substantially similar to those of gate electrode 804 in FIG. 8B and thus, are not repeated for ease of description.

Method 1400 proceeds to operation 1404, as illustrated in FIG. 14 in which a continuous first blocking layer is formed on the first gate electrode. As illustrated in FIG. 10A, a continuous first blocking layer 1006 is formed on first gate electrode 1004. The details of forming first blocking layer 1006 are substantially similar to those of blocking layer 806 in FIG. 8C and thus, are not repeated for ease of description.

Method 1400 proceeds to operation 1406, as illustrated in FIG. 14, in which a plurality of discrete first charge trapping layers disposed at different levels are formed on the first blocking layer. In some embodiments, to form the plurality of discrete first charge trapping layers, a continuous charge trapping layer is formed. A first thickness of a first part of the charge trapping layer extending laterally can be greater than a second thickness of a second part of the charge trapping layer extending vertically. In some embodiments, to form the plurality of discrete first charge trapping layers, the second part of the charge trapping layer extending vertically is removed. In some embodiments, to remove the second part of the charge trapping layer, the charge trapping layer is removed using wet etching until the second part of the charge trapping layer extending vertically is removed. As illustrated in FIG. 10A, discrete first charge trapping layers 1010a, 1010b, and 1010c disposed at different levels are formed on first blocking layer 1006. The details of forming discrete first charge trapping layers 1010a, 1010b, and 1010c are substantially similar to those of discrete charge trapping layers 810a, 810b, and 810c in FIGS. 8D and 8E and thus, are not repeated for ease of description.

Method 1400 proceeds to operation 1408, as illustrated in FIG. 14, in which a continuous first tunneling layer is formed on the discrete first charge trapping layers. As illustrated in FIG. 10A, a continuous first tunneling layer 1012 is formed on first charge trapping layers 1010a, 1010b, and 1010c. The details of forming first tunneling layer 1012 are substantially similar to those of tunneling layer 812 in FIG. 8F and thus, are not repeated for ease of description.

Method 1400 proceeds to operation 1410, as illustrated in FIG. 14, in which a first channel layer is formed on the first tunneling layer. In some embodiments, to form the first channel layer, a continuous channel layer is formed. A first thickness of a first part of the channel layer extending laterally can be greater than a second thickness of a second part of the channel layer extending vertically. In some embodiments, to form the first channel layer, the second part of the channel layer extending vertically is removed. In some embodiments, to remove the second part of the channel layer, the channel layer is removed using wet etching until the second part of the channel layer extending vertically is removed. As illustrated in FIG. 10A, discrete first channel layers 1016a, 1016b, and 1016c disposed at different levels are formed on first tunneling layer 1012. The details of forming discrete first channel layers 1016a, 1016b, and 1016c are substantially similar to those of discrete channel layers 814a, 814b, and 814c in FIGS. 8G and 8H and thus, are not repeated for ease of description.

Method 1400 proceeds to operation 1412, as illustrated in FIG. 14, in which an inter-deck dielectric layer is formed on the first channel layer. A top surface of the inter-deck dielectric layer can be nominally flat. In some embodiments, to form the inter-deck dielectric layer, the inter-deck dielectric layer is deposited on the first channel layer, and the top surface of the inter-deck dielectric layer is planarized.

As illustrated in FIG. 10A, an inter-deck dielectric layer 1018 is formed on first channel layers 1016a, 1016b, and 1016c. The top surface of inter-deck dielectric layer 1018 is nominally flat, for example, parallel to the lateral surface of silicon substrate 1002, according to some embodiments. Inter-deck dielectric layer 1018 can be formed by one or more deposition processes including, but not limited to, PVD, CVD, ALD, electroplating, electroless plating, or any combination thereof, followed by one or more planarization processes, including but not limited to, CMP, wet etching, drying etching, or any combination thereof. For example, the deposition processes may be used to provide a sufficient thickness for the planarization process to ensure that the top surface of inter-deck dielectric layer 1018 after the planarization process is nominally flat and covers each first channel layer 1016a, 1016b, or 1016c underneath. A first memory deck 1020 immediately above silicon substrate 1002 including first gate electrode 1004, first blocking layer 1006, first charge trapping layers 1010a, 1010b, and 1010c, first tunneling layer 1012, first channel layers 1016a, 1016b, and 1016c, and inter-deck dielectric layer 1018 is thereby formed.

Referring to FIG. 14, method 1400 starts at operation 1414, in which a second gate electrode having an inverted "T" shape is formed on the inter-deck dielectric layer. In some embodiments, to form the second gate electrode, a gate electrode layer is deposited on the inter-deck dielectric layer, and the gate electrode layer is patterned to have the inverted "T" shape. In some embodiments, to form the second gate electrode, a lower gate electrode layer is deposited on the inter-deck dielectric layer, and an upper gate electrode layer is formed on the lower gate electrode layer. A lateral dimension of the lower gate electrode layer is greater than a lateral dimension of the upper gate electrode layer, according to some embodiments.

Method 1400 proceeds to operation 1416, as illustrated in FIG. 14 in which a continuous second blocking layer is formed on the second gate electrode. Method 1400 proceeds to operation 1418, as illustrated in FIG. 14, in which a plurality of discrete second charge trapping layers disposed at different levels are formed on the second blocking layer. In some embodiments, to form the plurality of discrete second charge trapping layers, a continuous charge trapping layer is formed. A first thickness of a first part of the charge trapping layer extending laterally can be greater than a second thickness of a second part of the charge trapping layer extending vertically. In some embodiments, to form the plurality of discrete second charge trapping layers, the second part of the charge trapping layer extending vertically is removed. In some embodiments, to remove the second part of the charge trapping layer, the charge trapping layer is removed using wet etching until the second part of the charge trapping layer extending vertically is removed.

Method 1400 proceeds to operation 1420, as illustrated in FIG. 14, in which a continuous second tunneling layer is formed on the discrete second charge trapping layers. Method 1400 proceeds to operation 1422, as illustrated in FIG. 14, in which a second channel layer is formed on the second tunneling layer. In some embodiments, to form the second channel layer, a continuous channel layer is formed. A first thickness of a first part of the channel layer extending laterally can be greater than a second thickness of a second part of the channel layer extending vertically. In some embodiments, to form the second channel layer, the second part of the channel layer extending vertically is removed. In some embodiments, to remove the second part of the channel layer, the channel layer is removed using wet etching until the second part of the channel layer extending vertically is removed.

As illustrated in FIG. 10B, a second memory deck 1022 is formed on first memory deck 1020. Second memory deck 1022 includes a second gate electrode, a second blocking layer, second charge trapping layers, a second tunneling layer, and second channel layers, which are substantially similar to their counterparts in first memory deck 1020. The details of forming the components in second memory deck 1022 are substantially similar to those of first memory deck 1020 in FIG. 10A and thus, are not repeated for ease of description. Similarly, another inter-deck dielectric layer, on which a third memory deck 1024 can be formed, is formed in second memory deck 1022, according to some embodiments. Accordingly, more memory decks each including substantially similar components as in first memory deck 1020 can be further stacked one over another to increase the memory density using substantially similar processes as described above with respect to FIGS. 10A, 10B, and 14.

Figure 15:
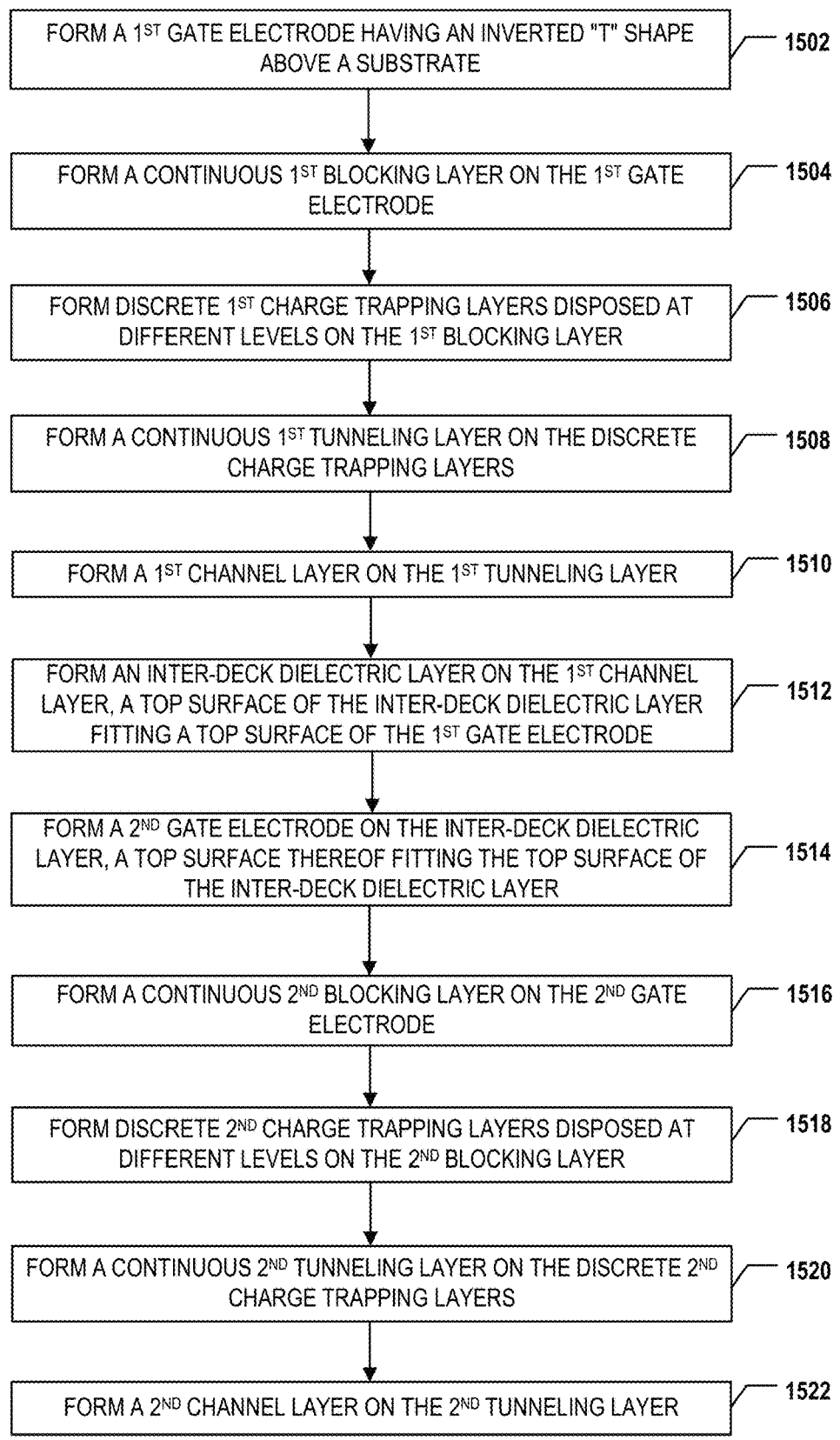
FIG. 15 is a flowchart of another exemplary method for forming a 3D memory device having multiple memory decks, according to some embodiments.

FIGS. 11A-11D illustrate an exemplary fabrication process for forming another 3D memory device having multiple memory decks, according to some embodiments of the present disclosure. FIG. 15 is a flowchart of another exemplary method for forming a 3D memory device having multiple memory decks, according to some embodiments. Examples of the 3D memory device depicted in FIGS. 11A-11D and 15 include 3D memory device 600 depicted in FIG. 6A. FIGS. 11A-11D and 15 will be described together. It is understood that the operations shown in method 1500 are not exhaustive and that other operations can be performed as well before, after, or between any of the illustrated operations. Further, some of the operations may be performed simultaneously, or in a different order than shown in FIG. 15.

Figure 11A:
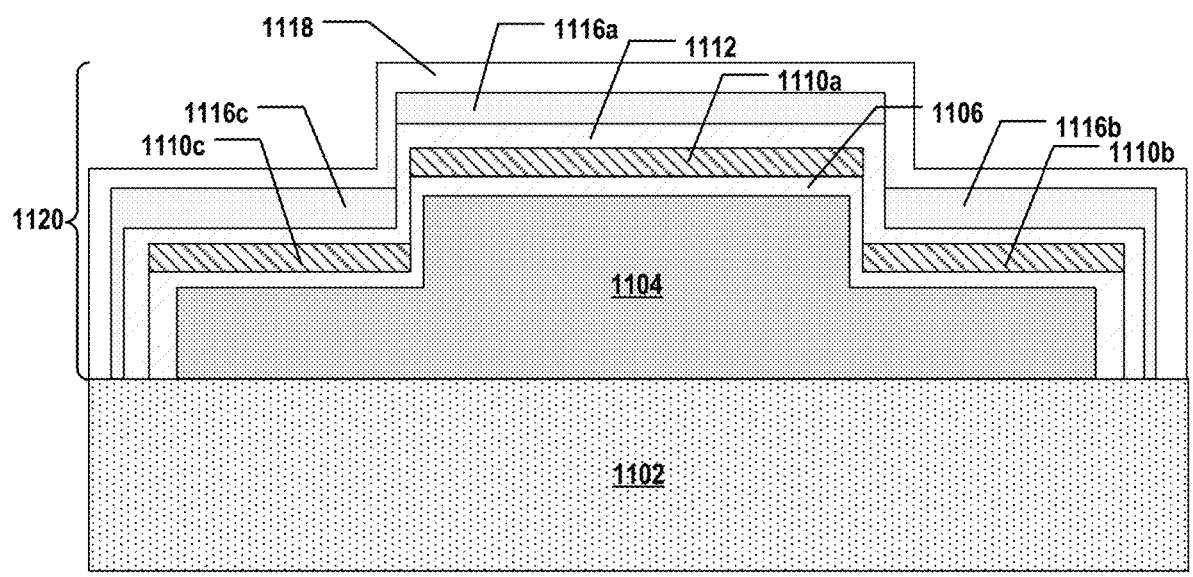
FIGS. 11A-11D illustrate an exemplary fabrication process for forming another 3D memory device having multiple memory decks, according to some embodiments of the present disclosure.

Referring to FIG. 15, method 1500 starts at operation 1502, in which a first gate electrode having an inverted "T" shape is formed above a substrate. In some embodiments, to form the first gate electrode, a gate electrode layer is deposited above the substrate, and the gate electrode layer is patterned to have the inverted "T" shape. In some embodiments, to form the first gate electrode, a lower gate electrode layer is deposited above the substrate, and an upper gate electrode layer is deposited on the lower gate electrode layer. A lateral dimension of the lower gate electrode layer is greater than a lateral dimension of the upper gate electrode layer, according to some embodiments. The substrate can be a silicon substrate. As illustrated in FIG. 11A, a first gate electrode 1104 having an inverted "T" shape is formed above a silicon substrate 1102. The details of forming first gate electrode 1104 are substantially similar to those of gate electrode 804 in FIG. 8B and thus, are not repeated for ease of description.

Method 1500 proceeds to operation 1504, as illustrated in FIG. 15 in which a continuous first blocking layer is formed on the first gate electrode. As illustrated in FIG. 11A, a continuous first blocking layer 1106 is formed on first gate electrode 1104. The details of forming first blocking layer 1106 are substantially similar to those of blocking layer 806 in FIG. 8C and thus, are not repeated for ease of description.

Method 1500 proceeds to operation 1506, as illustrated in FIG. 15, in which a plurality of discrete first charge trapping layers disposed at different levels are formed on the first blocking layer. In some embodiments, to form the plurality of discrete first charge trapping layers, a continuous charge trapping layer is formed. A first thickness of a first part of the charge trapping layer extending laterally can be greater than a second thickness of a second part of the charge trapping layer extending vertically. In some embodiments, to form the plurality of discrete first charge trapping layers, the second part of the charge trapping layer extending vertically is removed. In some embodiments, to remove the second part of the charge trapping layer, the charge trapping layer is removed using wet etching until the second part of the charge trapping layer extending vertically is removed. As illustrated in FIG. 11A, discrete first charge trapping layers 1110a, 1110b, and 1110c disposed at different levels are formed on first blocking layer 1106. The details of forming discrete first charge trapping layers 1110a, 1110b, and 1110c are substantially similar to those of discrete charge trapping layers 810a, 810b, and 810c in FIGS. 8D and 8E and thus, are not repeated for ease of description.

Method 1500 proceeds to operation 1508, as illustrated in FIG. 15, in which a continuous first tunneling layer is formed on the discrete first charge trapping layers. As illustrated in FIG. 11A, a continuous first tunneling layer 1112 is formed on first charge trapping layers 1110a, 1110b, and 1110c. The details of forming first tunneling layer 1112 are substantially similar to those of tunneling layer 812 in FIG. 8F and thus, are not repeated for ease of description.

Method 1500 proceeds to operation 1510, as illustrated in FIG. 15, in which a first channel layer is formed on the first tunneling layer. In some embodiments, to form the first channel layer, a continuous channel layer is formed. A first thickness of a first part of the channel layer extending laterally can be greater than a second thickness of a second part of the channel layer extending vertically. In some embodiments, to form the first channel layer, the second part of the channel layer extending vertically is removed. In some embodiments, to remove the second part of the channel layer, the channel layer is removed using wet etching until the second part of the channel layer extending vertically is removed. As illustrated in FIG. 11A, discrete first channel layers 1116a, 1116b, and 1116c disposed at different levels are formed on first tunneling layer 1112. The details of forming discrete first channel layers 1116a, 1116b, and 1116c are substantially similar to those of discrete channel layers 814a, 814b, and 814c in FIGS. 8G and 8H and thus, are not repeated for ease of description.

Method 1500 proceeds to operation 1512, as illustrated in FIG. 15, in which an inter-deck dielectric layer is formed on the first channel layer. A top surface of the inter-deck dielectric layer can fit a top surface of the first gate electrode. In some embodiments, to form the inter-deck dielectric layer, the inter-deck dielectric layer is deposited using ALD.

As illustrated in FIG. 11A, an inter-deck dielectric layer 1118 is formed on first channel layers 1116a, 1116b, and 1116c. The top surface of inter-deck dielectric layer 1118 fits the top surface of first gate electrode 1104, according to some embodiments. Inter-deck dielectric layer 1118 can be formed by one or more thin film deposition processes including, but not limited to, PVD, CVD, ALD, or any combination thereof. In some embodiments, inter-deck dielectric layer 1118 is formed on first channel layers 1116a, 1116b, and 1116c using ALD. For example, the deposition processes may be used to provide a proper thickness to ensure that the top surface of inter-deck dielectric layer 1118 after the deposition process fits the top surface of first gate electrode 1104. A first memory deck 1120 immediately above substrate 1102 including first gate electrode 1104, first blocking layer 1106, first charge trapping layers 1110a, 1110b, and 1110c, first tunneling layer 1112, first channel layers 1116a, 1116b, and 1116c, and inter-deck dielectric layer 1118 is thereby formed.

Referring to FIG. 15, method 1500 starts at operation 1514, in which a second gate electrode is formed on the inter-deck dielectric layer. A top surface of the second gate electrode can fit the top surface of the inter-deck dielectric layer. In some embodiments, to form the second gate electrode, a gate electrode layer is deposited on the inter-deck dielectric layer, and the gate electrode layer is patterned to have a top surface of the gate electrode layer fits the top surface of the first gate electrode. In some embodiments, to form the second gate electrode, a lower gate electrode layer is deposited on the inter-deck dielectric layer, and an upper gate electrode layer is deposited on the lower gate electrode layer. A lateral dimension of the lower gate electrode layer is greater than a lateral dimension of the upper gate electrode layer, according to some embodiments.

Figure 11B:
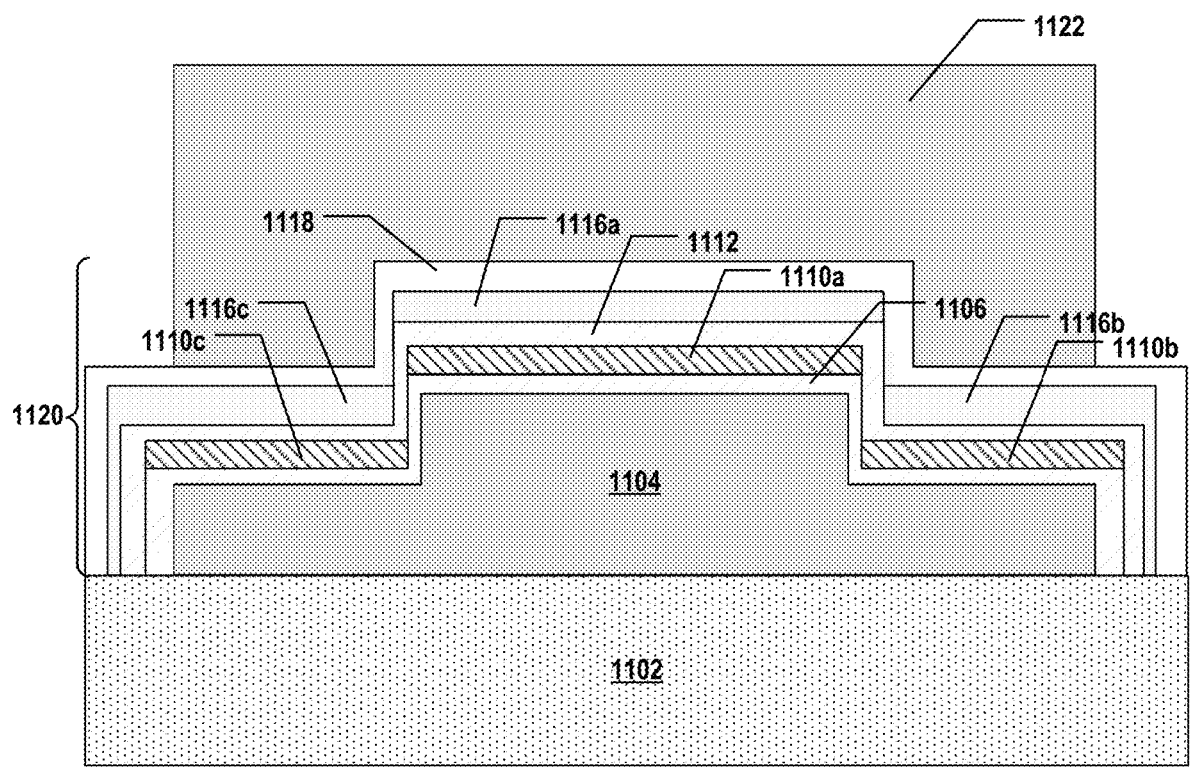
Figure 11C:
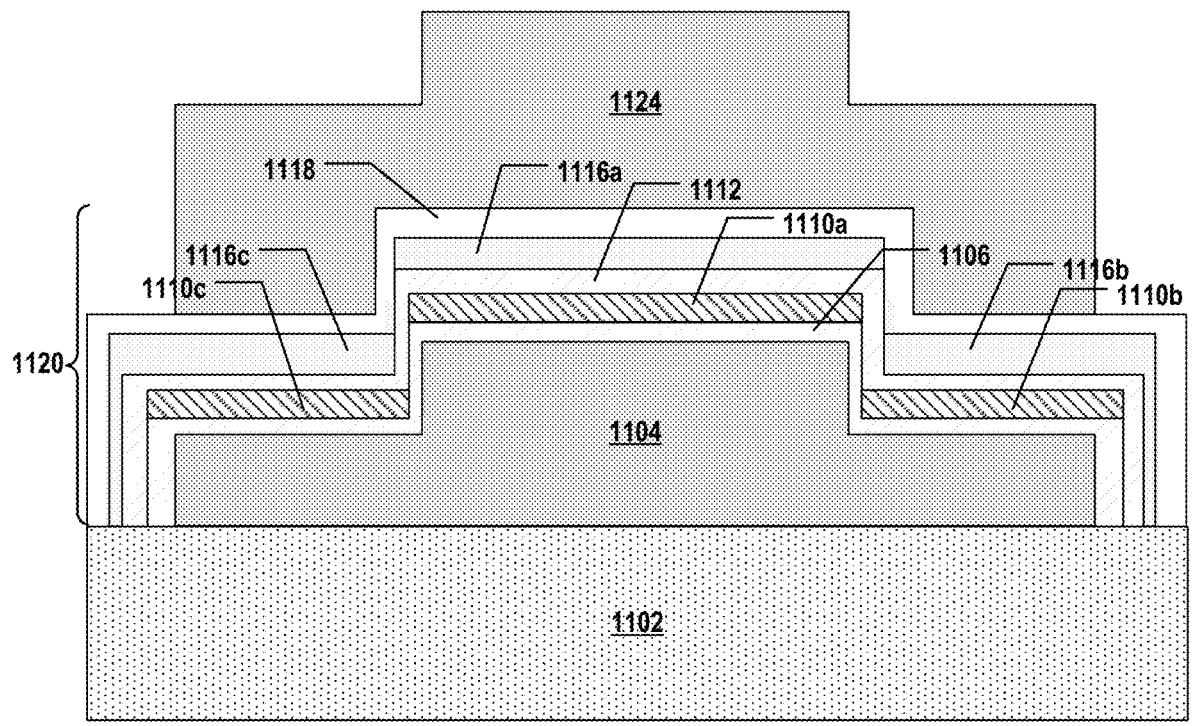

As illustrated in FIG. 11C, a second gate electrode 1124 is formed on inter-deck dielectric layer 1118. The top surface of second gate electrode 1124 can fit the top surface of inter-deck dielectric layer 1118. To form second gate electrode 1124, as illustrated in FIG. 11B, a gate electrode layer 1122 is first formed on inter-deck dielectric layer 1118 by one or more deposition processes including, but not limited to, PVD, CVD, ALD, or any combination thereof. In some embodiments, gate electrode layer 1122 is further patterned to have the top surface thereof fits the top surface of first gate electrode 1104, i.e., becoming second gate electrode 1124 (as shown in FIG. 11C) by processes including photolithography, development, wet etching and/or drying etching, etc. For example, two dents at the edges of gate electrode layer 1122 (in the x-direction) may be etched. In some embodiments, instead of patterning gate electrode layer 1122 (e.g., the lower gate electrode layer), an upper gate electrode layer having a lateral dimension (in the x-direction) smaller than the lateral dimension of lower gate electrode layer 1122 is further deposited on lower gate electrode layer 1122 to form second gate electrode 1124. The upper gate electrode layer can be deposited by one or more deposition processes including, but not limited to, PVD, CVD, ALD, electroplating, electroless plating, or any combination thereof.

Figure 11D:
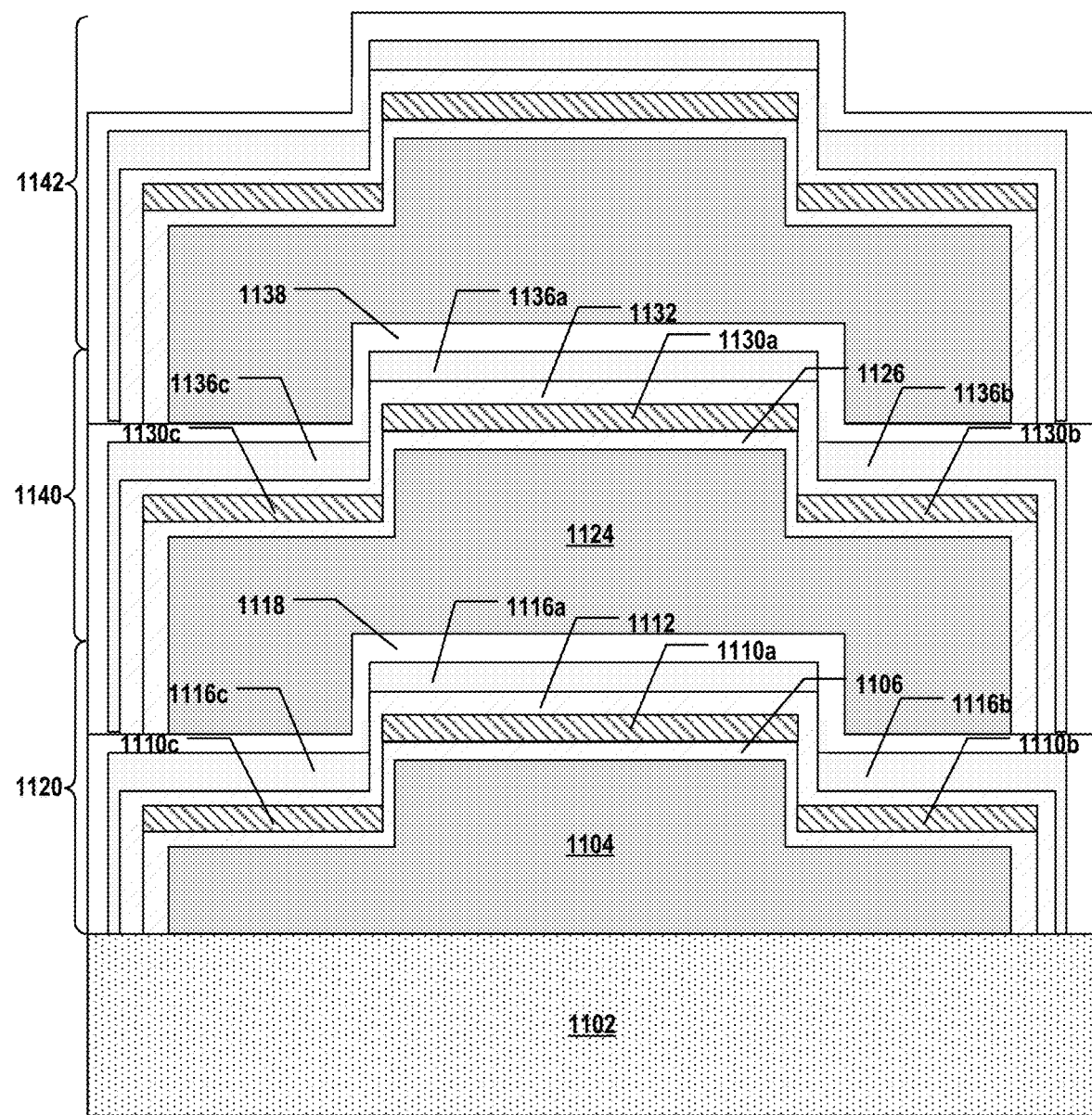

Method 1500 proceeds to operation 1516, as illustrated in FIG. 15 in which a continuous second blocking layer is formed on the second gate electrode. As illustrated in FIG. 11D, a continuous second blocking layer 1126 is formed on second gate electrode 1124. The details of forming second blocking layer 1126 are substantially similar to those of blocking layer 806 in FIG. 8C and thus, are not repeated for ease of description.

Method 1500 proceeds to operation 1518, as illustrated in FIG. 15, in which a plurality of discrete second charge trapping layers disposed at different levels are formed on the second blocking layer. In some embodiments, to form the plurality of discrete second charge trapping layers, a continuous charge trapping layer is formed. A first thickness of a first part of the charge trapping layer extending laterally can be greater than a second thickness of a second part of the charge trapping layer extending vertically. In some embodiments, to form the plurality of discrete second charge trapping layers, the second part of the charge trapping layer extending vertically is removed. In some embodiments, to remove the second part of the charge trapping layer, the charge trapping layer is removed using wet etching until the second part of the charge trapping layer extending vertically is removed. As illustrated in FIG. 11D, discrete second charge trapping layers 1130a, 1130b, and 1130c disposed at different levels are formed on second blocking layer 1126. The details of forming discrete second charge trapping layers 1130a, 1130b, and 1130c are substantially similar to those of discrete charge trapping layers 810*a*, 810*b*, and 810*c* in FIGS. 8D and 8E and thus, are not repeated for ease of description.

Method 1500 proceeds to operation 1520, as illustrated in FIG. 15, in which a continuous second tunneling layer is formed on the discrete second charge trapping layers. As illustrated in FIG. 11D, a continuous second tunneling layer 1132 is formed on second charge trapping layers 1130*a*, 1130*b*, and 1130*c*. The details of forming second tunneling layer 1132 are substantially similar to those of tunneling layer 812 in FIG. 8F and thus, are not repeated for ease of description.

Method 1500 proceeds to operation 1522, as illustrated in FIG. 15, in which a second channel layer is formed on the second tunneling layer. In some embodiments, to form the second channel layer, a continuous channel layer is formed. A first thickness of a first part of the channel layer extending laterally can be greater than a second thickness of a second part of the channel layer extending vertically. In some embodiments, to form the second channel layer, the second part of the channel layer extending vertically is removed. In some embodiments, to remove the second part of the channel layer, the channel layer is removed using wet etching until the second part of the channel layer extending vertically is removed. As illustrated in FIG. 11D, discrete second channel layers 1136*a*, 1136*b*, and 1136*c* disposed at different levels are formed on second tunneling layer 1132. The details of forming discrete second channel layers 1136*a*, 1136*b*, and 1136*c* are substantially similar to those of discrete channel layers 814*a*, 814*b*, and 814*c* in FIGS. 8G and 8H and thus, are not repeated for ease of description.

As illustrated in FIG. 11D, another inter-deck dielectric layer 1138 is also formed on second channel layers 1136*a*, 1136*b*, and 1136*c* using substantially similar processes for forming inter-deck dielectric layer 1118. A second memory deck 1140 including second gate electrode 1124, second blocking layer 1126, second charge trapping layers 1130*a*, 1130*b*, and 1130*c*, second tunneling layer 1132, second channel layers 1136*a*, 1136*b*, 1136*c*, and inter-deck dielectric layer 1138 is thereby formed on first memory deck 1120. As illustrated in FIG. 11D, a third memory deck 1142 is formed on second memory deck 1140. Third memory deck 1142 includes a third gate electrode, a third blocking layer, third charge trapping layers, a third tunneling layer, and third channel layers, which are substantially similar to their counterparts in second memory deck 1140. The details of forming the components in third memory deck 1142 are substantially similar to those of second memory deck 1140 in FIGS. 11B-11D and thus, are not repeated for ease of description. Accordingly, more memory decks each including substantially similar components as in second memory deck 1140 can be further stacked one over another to increase the memory density using substantially similar processes as described above with respect to FIGS. 11A-11D and 14.

According to one aspect of the present disclosure, a 3D memory device includes a substrate and a plurality of memory decks stacked above the substrate. Each of the memory decks includes a gate electrode, a blocking layer on the gate electrode, a plurality of charge trapping layers on the blocking layer, a tunneling layer on the plurality of charge trapping layers, a channel layer on the tunneling layer, and an inter-deck dielectric layer on the channel layer. The plurality of charge trapping layers are discrete and disposed at different levels. A top surface of the inter-deck dielectric layer is nominally flat. The gate electrode of another one of the memory decks immediately above the memory deck is disposed on the top surface of the inter-deck dielectric layer.

In some embodiments, the gate electrode has an inverted "T" shape.

In some embodiments, the blocking layer is continuous and disposed along at least a top surface of the gate electrode. In some embodiments, the tunneling layer is continuous and disposed along at least top surfaces of each of the charge trapping layers. In some embodiments, the channel layer is continuous and disposed along a top surface of the tunneling layer.

In some embodiments, the plurality of charge trapping layers include a first charge trapping layer, a second charge trapping layer, and a third charge trapping layer, and the first charge trapping layer is disposed laterally between the second and third charge trapping layers. In some embodiments, the second and third charge trapping layers are disposed at a same level that is below a level at which the first charge trapping layer is disposed.

In some embodiments, the second and third charge trapping layers are disposed corresponding to two shoulders of the inverted "T" shape of the gate electrode, respectively. In some embodiments, the first charge trapping layer is disposed corresponding to a head of the inverted "T" shape of the gate electrode.

In some embodiments, the plurality of channel layers include a first channel layer, a second channel layer, and a third channel layer, and the first channel layer is disposed laterally between the second and third channel layers. In some embodiments, the second and third channel layers are disposed at a same level that is below a level at which the first channel layer is disposed.

In some embodiments, the second and third channel layers are disposed corresponding to the two shoulders of the inverted "T" shape of the gate electrode, respectively. In some embodiments, the first channel layer is disposed corresponding to the head of the inverted "T" shape of the gate electrode.

In some embodiments the memory deck includes a first memory cell, a second memory cell, and a third memory cell, the first, second, and third memory cells include the first, second, and third charge trapping layers, respectively, the first, second, and third memory cells include the first, second, and third channel layers, respectively, and each the first, second, and third memory cells includes a respective part of the blocking layer and a respective part of the tunneling layer.

In some embodiments, the blocking layer includes silicon oxide, each of the charge trapping layers includes silicon nitride, and the tunneling layer includes silicon oxide. In some embodiments, the channel layer includes polysilicon.

In some embodiments, a bottom surface of the gate electrode is nominally flat.

According to another aspect of the present disclosure, a 3D memory device includes a substrate and a plurality of memory decks stacked above the substrate. Each of the memory decks includes a gate electrode, a blocking layer on the gate electrode, a plurality of charge trapping layers on the blocking layer, a tunneling layer on the plurality of charge trapping layers, a channel layer on the tunneling layer, and an inter-deck dielectric layer on the channel layer. The plurality of charge trapping layers are discrete and disposed at different levels. A top surface of the inter-deck dielectric layer fits a top surface of the gate electrode. The gate electrode of another one of the memory decks immediately above the memory deck is disposed on the top surface of the inter-deck dielectric layer.

In some embodiments, the gate electrode the memory deck immediately above the substrate has an inverted "T" shape. In some embodiments, a bottom surface of the gate electrode of the memory deck immediately above the substrate is nominally flat.

In some embodiments, a bottom surface of the gate electrode of each of the memory decks other than the memory deck immediately above the substrate fits the top surface of the gate electrode. In some embodiments, the bottom surface of the gate electrode has a concave shape, and the top surface of the gate electrode has a convex shape.

In some embodiments, the blocking layer is continuous and disposed along at least a top surface of the gate electrode. In some embodiments, the tunneling layer is continuous and disposed along at least top surfaces of each of the charge trapping layers. In some embodiments, the channel layer is continuous and disposed along a top surface of the tunneling layer.

In some embodiments, the plurality of charge trapping layers include a first charge trapping layer, a second charge trapping layer, and a third charge trapping layer, and the first charge trapping layer is disposed laterally between the second and third charge trapping layers. In some embodiments, the second and third charge trapping layers are disposed at a same level that is below a level at which the first charge trapping layer is disposed.

In some embodiments, the channel layer includes a plurality of discrete channel layers disposed at different levels. Each of the channel layers corresponds to a respective one of the charge trapping layers.

In some embodiments, the plurality of channel layers include a first channel layer, a second channel layer, and a third channel layer, and the first channel layer is disposed laterally between the second and third channel layers. In some embodiments, the second and third channel layers are disposed at a same level that is below a level at which the first channel layer is disposed.

In some embodiments the memory deck includes a first memory cell, a second memory cell, and a third memory cell, the first, second, and third memory cells include the first, second, and third charge trapping layers, respectively, the first, second, and third memory cells include the first, second, and third channel layers, respectively, and each the first, second, and third memory cells includes a respective part of the blocking layer and a respective part of the tunneling layer.

In some embodiments, the blocking layer includes silicon oxide, each of the charge trapping layers includes silicon nitride, and the tunneling layer includes silicon oxide. In some embodiments, the channel layer includes polysilicon.

According to still another aspect of the present disclosure, a method for forming a 3D memory device is disclosed. A first gate electrode having an inverted "T" shape is formed above a substrate. A continuous first blocking layer is formed on the first gate electrode. A plurality of discrete first charge trapping layers disposed at different levels are formed on the first blocking layer. A continuous first tunneling layer is formed on the plurality of first charge trapping layers. A continuous first channel layer is formed on the first tunneling layer. An inter-deck dielectric layer is formed on the first channel layer. A top surface of the inter-deck dielectric layer is nominally flat. A second gate electrode having an inverted "T" shape is formed on the inter-deck dielectric layer. A continuous second blocking layer is formed on the second gate electrode. A plurality of discrete second charge trapping layers disposed at different levels are formed on the second blocking layer. A continuous second tunneling layer is formed on the discrete second charge trapping layers. A second channel layer is formed on the second tunneling layer.

In some embodiments, to form the first or second gate electrode, a gate electrode layer is deposited, and the gate electrode layer is patterned to have the inverted "T" shape.

In some embodiments, to form the first or second gate electrode, a lower gate electrode layer is deposited, and an upper gate electrode layer is deposited on the lower gate electrode layer. A lateral dimension of the lower gate electrode layer is greater than a lateral dimension of the upper gate electrode layer.

In some embodiments, to form the plurality of discrete first or second charge trapping layers, a continuous charge trapping layer is formed, and the second part of the charge trapping layer extending vertically is removed. A first thickness of a first part of the charge trapping layer extending laterally is greater than a second thickness of a second part of the charge trapping layer extending vertically. In some embodiments, to remove the second part of the charge trapping layer, the charge trapping layer is etched using wet etching until the second part of the charge trapping layer extending vertically is removed.

In some embodiments, to form the first or second channel layer, a continuous channel layer is formed. A first thickness of a first part of the channel layer extending laterally is greater than a second thickness of a second part of the channel layer extending vertically. In some embodiments, to form the first or second channel layer, the second part of the channel layer extending vertically is removed.

In some embodiments, to remove the second part of the channel layer, the channel layer is etched using wet etching until the second part of the channel layer extending vertically is removed.

In some embodiments, to form the inter-deck dielectric layer, the inter-deck dielectric layer is deposited on the first channel layer, and the top surface of the inter-deck dielectric layer is planarized.

According to yet another aspect of the present disclosure, a method for forming a 3D memory device is disclosed. A first gate electrode having an inverted "T" shape is formed above a substrate. A continuous first blocking layer is formed on the first gate electrode. A plurality of discrete first charge trapping layers disposed at different levels are formed on the first blocking layer. A continuous first tunneling layer is formed on the plurality of first charge trapping layers. A continuous first channel layer is formed on the first tunneling layer. An inter-deck dielectric layer is formed on the first channel layer. A top surface of the inter-deck dielectric layer fits a top surface of the first gate electrode. A second gate electrode is formed on the inter-deck dielectric layer. A top surface of the second gate electrode fits the top surface of the inter-deck dielectric layer. A continuous second blocking layer is formed on the second gate electrode. A plurality of discrete second charge trapping layers disposed at different levels are formed on the second blocking layer. A continuous second tunneling layer is formed on the discrete second charge trapping layers. A second channel layer is formed on the second tunneling layer.

In some embodiments, to form the first gate electrode, a gate electrode layer is deposited above the substrate, and the gate electrode layer is patterned to have the inverted "T" shape.

In some embodiments, to form the second gate electrode, a gate electrode layer is deposited on the inter-deck dielectric layer, and the gate electrode layer is patterned to have a top surface of the gate electrode layer fits the top surface of the first gate electrode.

In some embodiments, to form the first or second gate electrode, a lower gate electrode layer is deposited, and an upper gate electrode layer is deposited on the lower gate electrode layer. A lateral dimension of the lower gate electrode layer is greater than a lateral dimension of the upper gate electrode layer.

In some embodiments, to form the plurality of discrete first or second charge trapping layers, a continuous charge trapping layer is formed, and the second part of the charge trapping layer extending vertically is removed. A first thickness of a first part of the charge trapping layer extending laterally is greater than a second thickness of a second part of the charge trapping layer extending vertically. In some embodiments, to remove the second part of the charge trapping layer, the charge trapping layer is etched using wet etching until the second part of the charge trapping layer extending vertically is removed.

In some embodiments, to form the first or second channel layer, a continuous channel layer is formed. A first thickness of a first part of the channel layer extending laterally is greater than a second thickness of a second part of the channel layer extending vertically. In some embodiments, to form the first or second channel layer, the second part of the channel layer extending vertically is removed.

In some embodiments, to remove the second part of the channel layer, the channel layer is etched using wet etching until the second part of the channel layer extending vertically is removed.

In some embodiments, to form the inter-deck dielectric layer, the inter-deck dielectric layer is deposited using ALD.

The foregoing description of the specific embodiments will so reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A three-dimensional (3D) memory device, comprising:
a substrate; and
a plurality of memory decks stacked above the substrate, each of the memory decks comprising:
a gate electrode;
a blocking layer on the gate electrode;
a plurality of charge trapping layers on the blocking layer, wherein the plurality of charge trapping layers are discrete and disposed at different levels;
a tunneling layer on the plurality of charge trapping layers;
a channel layer on the tunneling layer; and
an inter-deck dielectric layer on the channel layer, wherein a top surface of the inter-deck dielectric layer is nominally flat, and the gate electrode of another one of the memory decks immediately above the memory deck is disposed on the top surface of the inter-deck dielectric layer.

2. The 3D memory device of claim 1, wherein the gate electrode has an inverted "T" shape.

3. The 3D memory device of claim 1, wherein a bottom surface of the gate electrode is nominally flat.

4. The 3D memory device of claim 2, wherein the blocking layer is continuous and disposed along at least a top surface of the gate electrode; and
the tunneling layer is continuous and disposed along at least top surfaces of each of the charge trapping layers.

5. The 3D memory device of claim 2, wherein the channel layer is continuous and disposed along a top surface of the tunneling layer.

6. The 3D memory device of claim 2, wherein
the plurality of charge trapping layers comprise a first charge trapping layer, a second charge trapping layer, and a third charge trapping layer; and
the first charge trapping layer is disposed laterally between the second and third charge trapping layers.

7. The 3D memory device of claim 6, wherein the second and third charge trapping layers are disposed at a same level that is below a level at which the first charge trapping layer is disposed.

8. The 3D memory device of claim 6, wherein
the second and third charge trapping layers are disposed corresponding to two shoulders of the inverted "T" shape of the gate electrode, respectively; and
the first charge trapping layer is disposed corresponding to a head of the inverted "T" shape of the gate electrode.

9. The 3D memory device of claim 6, wherein the channel layer comprises a plurality of discrete channel layers disposed at different levels, each of the channel layers corresponding to a respective one of the charge trapping layers.

10. The 3D memory device of claim 8, wherein
the second and third channel layers are disposed corresponding to the two shoulders of the inverted "T" shape of the gate electrode, respectively; and
the first channel layer is disposed corresponding to the head of the inverted "T" shape of the gate electrode.

11. The 3D memory device of claim 9, wherein
the plurality of channel layers comprise a first channel layer, a second channel layer, and a third channel layer;
the first channel layer is disposed laterally between the second and third channel layers; and
the second and third channel layers are disposed at a same level that is below a level at which the first channel layer is disposed.

12. The 3D memory device of claim 11, wherein
the memory decks each comprises a first memory cell, a second memory cell, and a third memory cell;

the first, second, and third memory cells comprise the first, second, and third charge trapping layers, respectively;

the first, second, and third memory cells comprise the first, second, and third channel layers, respectively; and each the first, second, and third memory cells comprises a respective part of the blocking layer and a respective part of the tunneling layer.

13. A three-dimensional (3D) memory device, comprising:
- a substrate; and
- a plurality of memory decks stacked above the substrate, each of the memory decks comprising:
  - a gate electrode;
  - a blocking layer on the gate electrode;
  - a plurality of charge trapping layers on the blocking layer, wherein the plurality of charge trapping layers are discrete and disposed at different levels;
  - a tunneling layer on the plurality of charge trapping layers;
  - a channel layer on the tunneling layer; and
  - an inter-deck dielectric layer on the channel layer, wherein a top surface of the inter-deck dielectric layer fits a top surface of the gate electrode, and the gate electrode of another one of the memory decks immediately above the memory deck is disposed on the top surface of the inter-deck dielectric layer.

14. A method for forming a three-dimensional (3D) memory device, comprising:
- forming a first gate electrode having an inverted "T" shape above a substrate;
- forming a continuous first blocking layer on the first gate electrode;
- forming a plurality of discrete first charge trapping layers disposed at different levels on the first blocking layer;
- forming a continuous first tunneling layer on the discrete first charge trapping layers;
- forming a first channel layer on the first tunneling layer;
- forming an inter-deck dielectric layer on the first channel layer, wherein a top surface of the inter-deck dielectric layer is nominally flat;
- forming a second gate electrode having an inverted "T" shape on the inter-deck dielectric layer;
- forming a continuous second blocking layer on the second gate electrode;
- forming a plurality of discrete second charge trapping layers disposed at different levels on the second blocking layer;
- forming a continuous second tunneling layer on the discrete second charge trapping layers; and
- forming a second channel layer on the second tunneling layer.

15. The method of claim 14, wherein forming the first or second gate electrode comprises:
- depositing a gate electrode layer; and
- patterning the gate electrode layer to have the inverted "T" shape.

16. The method of claim 14, wherein forming the first or second gate electrode comprises:
- depositing a lower gate electrode layer; and
- depositing an upper gate electrode layer on the lower gate electrode layer, wherein a lateral dimension of the lower gate electrode layer is greater than a lateral dimension of the upper gate electrode layer.

17. The method of claim 14, wherein forming the plurality of discrete first or second charge trapping layers comprises:
- forming a continuous charge trapping layer, wherein a first thickness of a first part of the charge trapping layer extending laterally is greater than a second thickness of a second part of the charge trapping layer extending vertically; and
- removing the second part of the charge trapping layer extending vertically.

18. The method of claim 14, wherein forming the first or second channel layer comprises forming a continuous channel layer, wherein a first thickness of a first part of the channel layer extending laterally is greater than a second thickness of a second part of the channel layer extending vertically.

19. The method of claim 14, wherein forming the inter-deck dielectric layer comprises:
- depositing the inter-deck dielectric layer on the first channel layer; and
- planarizing the top surface of the inter-deck dielectric layer.

20. The method of claim 17, wherein removing the second part of the charge trapping layer comprises etching the charge trapping layer using wet etching until the second part of the charge trapping layer extending vertically is removed.

* * * * *